US011773123B2

(12) United States Patent
Cho et al.

(10) Patent No.: US 11,773,123 B2
(45) **Date of Patent: *Oct. 3, 2023**

(54) ORGANOMETALLIC COMPOUND, ORGANIC LIGHT-EMITTING DEVICE INCLUDING ORGANOMETALLIC COMPOUND, AND DIAGNOSTIC COMPOSITION INCLUDING ORGANOMETALLIC COMPOUND

(71) Applicant: Samsung Electronics Co., Ltd., Suwon-si (KR)

(72) Inventors: Yongsuk Cho, Hwaseong-si (KR); Soyeon Kim, Seoul (KR); Jiyoun Lee, Anyang-si (KR); Jongwon Choi, Yongin-si (KR); Dmitry Kravchuk, Hwaseong-si (KR); Banglin Lee, Suwon-si (KR); Ohyun Kwon, Seoul (KR); Kyuhyun Im, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/669,772

(22) Filed: Oct. 31, 2019

(65) Prior Publication Data

US 2020/0308202 A1 Oct. 1, 2020

(30) Foreign Application Priority Data

Mar. 29, 2019 (KR) ........................ 10-2019-0037212
Oct. 30, 2019 (KR) ........................ 10-2019-0136671

(51) Int. Cl.

| | |
|---|---|
| ***C07F 15/00*** | (2006.01) |
| ***H10K 85/30*** | (2023.01) |
| ***H10K 85/60*** | (2023.01) |

(52) U.S. Cl.
CPC ....... *C07F 15/0033* (2013.01); *H10K 85/342* (2023.02); *H10K 85/615* (2023.02);
(Continued)

(58) Field of Classification Search
CPC ...... C09K 2211/185; C09K 2211/1029; C09K 2211/1007; C07F 15/0033; H01L 51/0085;
(Continued)

(56) References Cited

U.S. PATENT DOCUMENTS 6,465,115 B2 10/2002 Shi et al.
6,596,415 B2 7/2003 Shi et al.
(Continued)

FOREIGN PATENT DOCUMENTS

EP 3637489 A1 4/2020
EP 3674308 A 7/2020
(Continued)

OTHER PUBLICATIONS

M. A. Baldo, et al., Highly efficient phosphorescent emission fromorganic electroluminescent devices, Nature v395, pp. 151-154 (1998).

(Continued)

*Primary Examiner* — Dylan C Kershner
*Assistant Examiner* — Elizabeth M. Dahlburg
(74) *Attorney, Agent, or Firm* — Cantor Colburn LLP

(57) ABSTRACT

An organometallic compound represented by Formula 1, an organic light-emitting device including the organometallic compound, and a diagnostic composition including the organometallic compound:
(Continued)

Formula 1

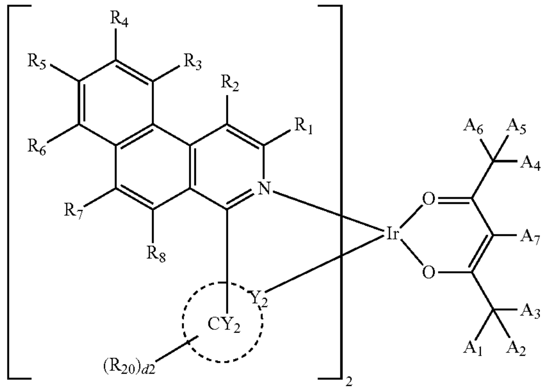

wherein, in Formula 1, $Y_2$, a ring $CY_2$, $R_1$ to $R_8$, $R_{20}$, $A_1$ to $A_7$ and d2 may be each independently the same as described in the specification.

16 Claims, 1 Drawing Sheet

(52) U.S. Cl.
CPC ..... *H10K 85/6572* (2023.02); *H10K 85/6574* (2023.02); *H10K 85/6576* (2023.02)

(58) Field of Classification Search
CPC ............. H01L 51/0052; H01L 51/0072; H01L 51/0073; H01L 51/0074; H01L 51/5016; G01N 21/64; G01N 21/6408; G01N 21/66; G01N 21/58
See application file for complete search history.

(56) References Cited

U.S. PATENT DOCUMENTS

| | | | | |
|---|---|---|---|---|
| 9,554,442 | B2 | 1/2017 | Kamatani et al. | |
| 9,960,370 | B2 | 5/2018 | Kishino et al. | |
| 10,069,089 | B2 | 9/2018 | Kamatani et al. | |
| 2001/0019782 | A1 | 9/2001 | Igarashi et al. | |
| 2010/0219407 | A1 | 9/2010 | Kamatani et al. | |
| 2015/0295188 | A1* | 10/2015 | Kosuge | C07F 15/0033 345/173 |
| 2016/0285007 | A1* | 9/2016 | Swager | C09K 11/025 |
| 2018/0130956 | A1* | 5/2018 | Boudreault | H01L 51/0085 |
| 2018/0342685 | A1 | 11/2018 | Kamatani et al. | |
| 2020/0099000 | A1* | 3/2020 | Zhang | C09K 11/06 |
| 2020/0111977 | A1* | 4/2020 | Choi | C07F 15/0033 |
| 2020/0212319 | A1 | 7/2020 | Choi et al. | |
| 2020/0308201 | A1 | 10/2020 | Lee et al. | |
| 2020/0308203 | A1* | 10/2020 | Kim | H01L 51/0085 |
| 2020/0313095 | A1 | 10/2020 | Lee et al. | |

FOREIGN PATENT DOCUMENTS

| | | | |
|---|---|---|---|
| EP | 3715436 | A1 | 9/2020 |
| EP | 3715437 | A1 | 9/2020 |
| JP | 2000003782 | A | 1/2000 |
| KR | 1020110077350 | A | 7/2011 |
| KR | 101468065 | B1 | 12/2014 |
| WO | 2009060995 | A1 | 5/2009 |
| WO | 2014104386 | A1 | 7/2014 |
| WO | 2014104387 | A1 | 7/2014 |
| WO | 2014104395 | | 7/2014 |
| WO | 2014115528 | A1 | 7/2014 |
| WO | 2014123238 | A1 | 8/2014 |
| WO | 2014123239 | A1 | 8/2014 |

OTHER PUBLICATIONS

M. A. Baldo, et al., Very high-efficiency green organic light-emitting devices based on electrophosphorescence, Appl. Phys. Lett. 75, 4 (1999).
Qin Wang, et al., Effects of charged self-assembled quantum dots on two-dimensional quantum transport, Appl. Phys. Lett. 76, No. 13, 1704-1706 (Mar. 27, 2000).
Raymond C. Kwong, et al., High operational stability of electrophosphorescent devices, Appl. Phys. Lett. vol. 81, No. 1, 162-164 (2002).
Sergey Lamansky, et al., Highly Phosphorescent Bis-Cyclometalated Iridium Complexes: Synthesis, Photophysical Characterization, and Use in Organic Light Emitting Diodes, J. Am. Chem. Soc. 2001, 123, 4304-4312.
Sergey Lamansky, et al., Synthesis and Characterization of Phosphorescent Cyclometalated Iridium Complexes, Inorganic Chemistry, 2001, 40, 1704-1711.
Extended European search report issued by the European Patent Office dated May 26, 2020 in the examination of the European Patent Application No. 20165249.2.
Office Action dated Oct. 10, 2022, issued in corresponding EP Patent Application No. 20165249.2, 4 pp.
Office Action dated Jul. 17, 2023, issued in corresponding EP Patent Application No. 20165249.2, 4 pp.

* cited by examiner

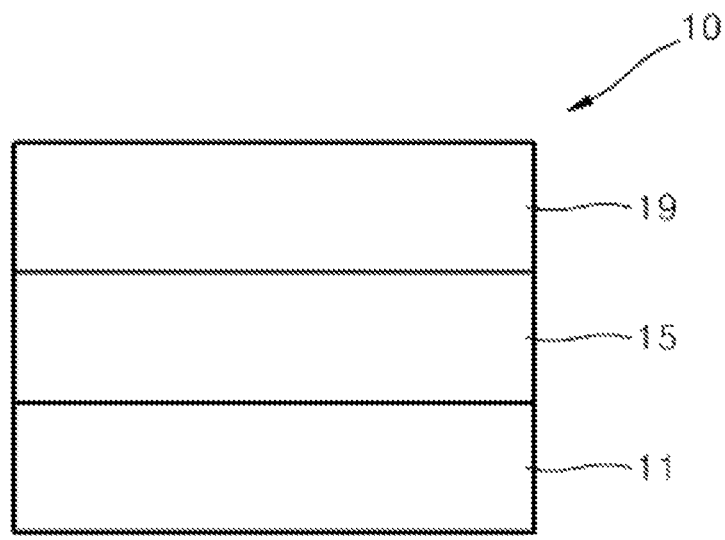
10
19
15
11

ORGANOMETALLIC COMPOUND, ORGANIC LIGHT-EMITTING DEVICE INCLUDING ORGANOMETALLIC COMPOUND, AND DIAGNOSTIC COMPOSITION INCLUDING ORGANOMETALLIC COMPOUND

CROSS-REFERENCE TO RELATED APPLICATION

This application claims priority to and the benefit of Korean Patent Applications Nos. 10-2019-0037212, filed on Mar. 29, 2019, and 10-2019-0136671, filed on Oct. 30, 2019, in the Korean Intellectual Property Office, and all the benefits accruing therefrom under 35 U.S.C. § 119, the content of which is incorporated herein in its entirety by reference.

JOINT RESEARCH AGREEMENT

The inventions described and claimed herein were made pursuant to a Joint Research Agreement, in effect on or before the date the inventions were made, between Samsung Electronics Co., Ltd. and Samsung SDI Co., Ltd.

BACKGROUND

1. Field

The present disclosure relates to an organometallic compound, an organic light-emitting device including the organometallic compound, and a diagnostic composition that includes the organometallic compound.

2. Description of the Related Art

Organic light-emitting devices (OLEDs) are self-emission devices which produce full-color images. In addition, OLEDs have wide viewing angles and exhibit excellent driving voltage and response speed characteristics.

OLEDs include an anode, a cathode, and an organic layer between the anode and the cathode and including an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state to thereby generate light.

Further, light-emitting compounds, e.g., phosphorescence-emitting compounds, can also be used to monitor, sense, or detect biological materials, including a variety of cells and proteins.

SUMMARY

Provided are an organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments.

According an aspect of an embodiment, an organometallic compound may be represented by Formula 1:

Formula 1

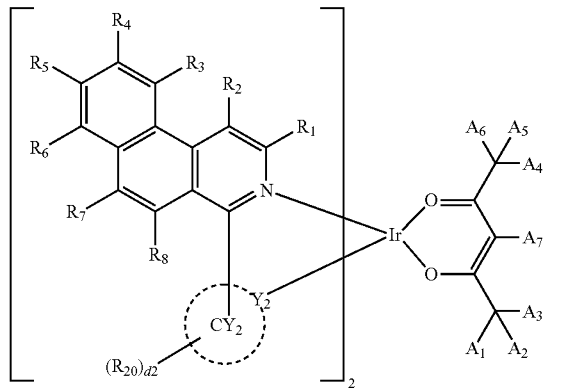

wherein, in Formula 1, $Y_2$ may be C, ring $CY_2$ may be a $C_5$-$C_{30}$ carbocyclic group or a $C_1$-$C_{30}$ heterocyclic group, $R_1$ to $R_8$, $R_{20}$ and $A_7$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, d2 may be an integer from 0 to 10, and when d2 is 2 or more, two or more $R_{20}$(s) may be identical to or different from each other, at least one of $R_1$ to $R_8$, $R_{20}$, or any combination thereof comprises at least one fluoro group (—F), $A_1$ to $A_6$ may each independently be a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, two or more of $R_1$ to $R_8$ are optionally linked to form a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$, two or more of $R_{20}$(s) in the number of d2 are optionally linked to form a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$, two or more of $A_1$ to $A_7$ are optionally linked to form a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$, $R_{1a}$ is the same as explained in connection with $A_7$, and a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or any combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or any combination thereof, wherein $Q_1$ to $Q_9$, $Q_{11}$ to $Q_{19}$, $Q_{21}$ to $Q_{29}$, and $Q_{31}$ to $Q_{39}$ are each independently hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group, unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_2$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group, unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

Another aspect provides an organic light-emitting device including a first electrode; a second electrode; and an organic layer disposed between the first electrode and the second electrode and including an emission layer, wherein the organic layer includes at least one organometallic compounds represented by Formula 1.

In the organic layer, the organometallic compound included in the emission layer may serve as a dopant.

According to another aspect, a diagnostic composition may include at least one organometallic compound represented by Formula 1.

BRIEF DESCRIPTION OF THE DRAWINGS

These and/or other aspects will become apparent and more readily appreciated from the following description of the embodiments, taken in conjunction with the accompanying drawings in which:

The FIGURE is a schematic cross-sectional view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the FIGURES It will be understood that relative terms are intended to encompass different orientations of the device in addition to the orientation depicted in the FIGURES For example, if the device in one of the FIGURES is turned over, elements described as being on the "lower" side of other elements would then be oriented on "upper" sides of the other elements The exemplary term "lower," can therefore, encompasses both an orientation of "lower" and "upper," depending on the particular orientation of the FIGURE Similarly, if the device in one of the FIGURES is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

According to an aspect, an organometallic compound may be represented by Formula 1:

Formula 1

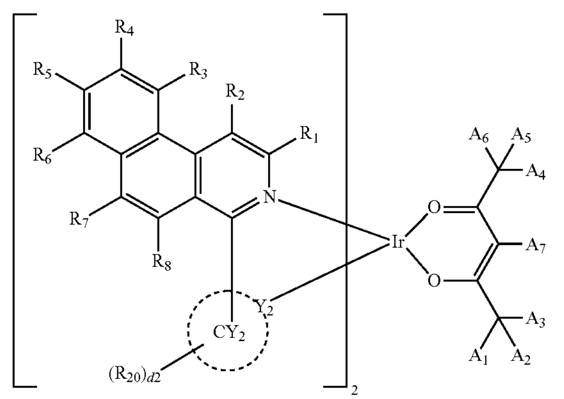

$Y_2$ in Formula 1 may be C.

A ring $CY_2$ in Formula 1 may be a $C_5$-$C_{30}$ carbocyclic group or a $C_1$-$C_{30}$ heterocyclic group.

For example, the ring $CY_2$ in Formula 1 may be i) a first ring, ii) a second ring, iii) a condensed cyclic group in which two or more first rings are condensed with each other, iv) a condensed cyclic group in which two or more second rings are condensed with each other, or v) a condensed cyclic group in which at least one first ring is condensed with at least one second ring, the first ring is a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group, and the second ring may be an adamantane group, a norbornene group, a bicyclo[1.1.1]pentane group, a bicyclo[2.1.1]hexane group, a bicyclo[2.2.1]heptane group (a norbornane group), a bicyclo[2.2.2]octane group, a cyclohexane group, a cyclohexene group, a benzene group, a pyridine group, a pyrimidine group, a pyrazine group, a pyridazine group, or a triazine group.

In one or more embodiments, the ring $CY_2$ in Formula 1 may be a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a thiophene group, a furan group, a pyrrole group, a cyclopentadiene group, a silole group, a borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a fluorene group, a dibenzosilole group, a dibenzoborole group, a dibenzophosphole group, a dibenzoselenophene group, a dibenzogermole group, a dibenzothiophene 5-oxide group, 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group.

In one or more embodiments, the ring $CY_2$ may be a benzene group, a naphthalene group, a 1, 2, 3, 4-tetrahydronaphthalene group, a thiophene group, a furan group, a pyrrole group, a cyclopentadiene group, a silole group, a benzothiophene group, a benzofuran group, an indole group, an indene group, a benzosilole group, a dibenzothiophene group, a dibenzofuran group, a carbazole group, a fluorene group, or a dibenzosilole group.

In Formula 1, $R_1$ to $R_8$, $R_{20}$ and $A_7$ may each independently be hydrogen, deuterium, —F, —Cl, —Br, —I, $—SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—N(Q_1)(Q_2)$, $—Si(Q_3)(Q_4)(Q_5)$, $—Ge(Q_3)(Q_4)(Q_5)$, $—B(Q_6)(Q_7)$, $—P(=O)(Q_8)(Q_9)$, or $—P(Q_8)(Q_9)$. $Q_1$ to $Q_9$ may respectively be understood by referring to the descriptions of $Q_1$ to $Q_9$ provided herein.

In some embodiments, $R_{20}$ in Formula 1 may include neither a fluoro group (—F) nor a cyano group. For example, $R_{20}$ may be a group that includes neither a fluoro group (—F) nor a cyano group.

In some embodiments, in Formula 1, $R_1$ to $R_8$, $R_{20}$ and $A_7$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, $—SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterium-containing $C_1$-$C_{20}$ alkyl group, a fluorinated $C_1$-$C_{20}$ alkyl group, a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group (a norbornyl group), a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a silolanyl group, a phenyl group, a ($C_1$-$C_{20}$ alkyl)phenyl group, a biphenyl group, a terphenyl group, a naphthyl group, a 1,2,3,4-tetrahydronaphthyl group, a pyridinyl group, a pyrimidinyl group, or any combination thereof;

a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a silolanyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterium-containing $C_1$-$C_{20}$ alkyl group, a fluorinated $C_1$-$C_{20}$ alkyl group, a $C_1$-$C_{20}$ alkoxy group, a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a silolanyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or $—N(Q_1)(Q_2)$, $—Si(Q_3)(Q_4)(Q_5)$, $—Ge(Q_3)(Q_4)(Q_5)$, $—B(Q_6)(Q_7)$, $—P(=O)(Q_8)(Q_9)$, or $—P(Q_8)(Q_9)$, $Q_1$ to $Q_9$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$ or $—CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{20}$ alkyl group, a phenyl group, or any combination thereof. Herein, $R_{20}$ in Formula 1 may include neither a fluoro group (—F) nor a cyano group.

In one or more embodiments, $R_1$ to $R_8$, $R_{20}$ and $A_7$ in Formula 1 may each independently be hydrogen, deuterium, —F, a substituted or unsubstituted $C_1$-$C_{20}$ alkyl group, a substituted or unsubstituted $C_3$-$C_{10}$ cycloalkyl group, a substituted or unsubstituted $C_2$-$C_{10}$ heterocycloalkyl group, $—Si(Q_3)(Q_4)(Q_5)$, or $—Ge(Q_3)(Q_4)(Q_5)$. Herein, $R_{20}$ may include neither a fluoro group nor a cyano group.

In one or more embodiments, $R_1$ to $R_8$ and $A_7$ in Formula 1 may each independently be:

hydrogen, deuterium, or —F;

a $C_1$-$C_{20}$ alkyl group, a $C_3$-$C_{10}$ cycloalkyl group, or a $C_2$-$C_{10}$ heterocycloalkyl group, each unsubstituted or substituted with deuterium, —F, $C_1$-$C_{20}$ alkyl group, a $C_3$-$C_{10}$ cycloalkyl group, a $C_2$-$C_{10}$ heterocycloalkyl group, or any combination thereof; or $—Si(Q_3)(Q_4)(Q_5)$, or $—Ge(Q_3)(Q_4)(Q_5)$.

In one or more embodiments, $R_{20}$ in Formula 1 may be:

hydrogen or deuterium;

a $C_1$-$C_{20}$ alkyl group, a $C_3$-$C_{10}$ cycloalkyl group, or a $C_2$-$C_{10}$ heterocycloalkyl group, each unsubstituted or substituted with deuterium, a $C_1$-$C_{20}$ alkyl group, a $C_3$-$C_{10}$ cycloalkyl group, a $C_2$-$C_{10}$ heterocycloalkyl group, or any combination thereof; or $—Si(Q_3)(Q_4)(Q_5)$, or $—Ge(Q_3)(Q_4)(Q_5)$.

The designation d2 in Formula 1 indicates the number of $R_{20}$(s), and may be an integer from 0 to 10. When d2 is 2 or more, two or more $R_{20}$(s) may be identical to or different from each other. For example, d2 may be an integer from 0 to 6.

In an exemplary embodiment, at least one of $R_1$ to $R_8$, $R_{20}$ or any combination thereof in Formula 1 may include at least one fluoro group (—F).

In an exemplary embodiment, at least one of $R_1$ to $R_8$ (for example, at least one of $R_2$ to $R_8$, or at least one of $R_3$ to $R_6$) of Formula 1 may include at least one fluoro group (—F).

In an exemplary embodiment, at least one of $R_1$ to $R_8$ (for example, at least one of $R_2$ to $R_8$, or at least one of $R_3$ to $R_6$) of Formula 1 may be a group including at least one fluoro group (—F).

In one or more embodiments, at least one of $R_1$ to $R_8$ in Formula 1 may each independently be:

a fluoro group (—F); or a fluorinated $C_1$-$C_{20}$ alkyl group, a fluorinated $C_3$-$C_{10}$ cycloalkyl group, or a fluorinated $C_2$-$C_{10}$ heterocycloalkyl group, each unsubstituted or substituted with deuterium, a $C_1$-$C_{20}$ alkyl group, a $C_3$-$C_{10}$ cycloalkyl group, a $C_2$-$C_{10}$ heterocycloalkyl group, or any combination thereof.

$A_1$ to $A_6$ in Formula 1 may each independently be a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

For example, $A_1$ to $A_6$ in Formula 1 may each independently be:

a $C_1$-$C_{20}$ alkyl group or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterium-containing $C_1$-$C_{20}$ alkyl group, a fluorinated $C_1$-$C_{20}$ alkyl group, a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a silolanyl group, a phenyl group, a ($C_1$-$C_{20}$ alkyl)phenyl group, a biphenyl group, a terphenyl group, a naphthyl group, a 1,2,3,4-tetrahydronaphthyl group, a pyridinyl group, a pyrimidinyl group, or any combination thereof; or a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterium-containing $C_1$-$C_{20}$ alkyl group, a fluorinated $C_1$-$C_{20}$ alkyl group, a $C_1$-$C_{20}$ alkoxy group, a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a silolanyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof.

In one or more embodiments, $A_1$ to $A_6$ in Formula 1 may each independently be a substituted or unsubstituted $C_1$-$C_{60}$ alkyl group, a substituted or unsubstituted $C_3$-$C_{10}$ cycloalkyl group, or a substituted or unsubstituted $C_2$-$C_{10}$ heterocycloalkyl group.

In one or more embodiments, $A_1$ to $A_6$ in Formula 1 may each independently be a $C_1$-$C_{20}$ alkyl group, a $C_3$-$C_{10}$ cycloalkyl group, or a $C_2$-$C_{10}$ heterocycloalkyl group, each unsubstituted or substituted with deuterium, —F, $C_1$-$C_{20}$ alkyl group, a $C_3$-$C_{10}$ cycloalkyl group, a $C_2$-$C_{10}$ heterocycloalkyl group, or any combination thereof.

In an exemplary embodiment, $R_1$ to $R_8$, $R_{20}$ and $A_7$ in Formula 1 may each independently be hydrogen, deuterium, —F, —$CH_3$, —$CD_3$, —$CD_2H$, —$CDH_2$, —$CF_3$, —$CF_2H$, —$CFH_2$, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-233, a group represented by one of Formulae 9-201 to 9-233 in which at least one hydrogen is substituted with deuterium, a group represented by one of Formulae 9-201 to 9-233 in which at least one hydrogen is substituted with —F, a group represented by one of Formulae 10-1 to 10-126, a group represented by one of Formulae 10-1 to 10-126 in which at least one hydrogen is substituted with deuterium, a group represented by one of Formulae 10-1 to 10-126 in which at least one hydrogen is substituted with —F, a group represented by one of Formulae 10-201 to 10-343, a group represented by one of Formulae 10-201 to 10-343 in which at least one hydrogen is substituted with deuterium, a group represented by one of Formulae 10-201 to 10-343 in which at least one hydrogen is substituted with —F, —$Si(Q_3)(Q_4)(Q_5)$, or —$Ge(Q_3)(Q_4)(Q_5)$ (herein $Q_3$ to $Q_5$ are the same as described in the present specification), and at least one of $R_1$ to $R_8$ (for example, at least one of $R_2$ to $R_8$, or at least one of $R_3$ to $R_6$) may be —F, —$CF_3$, —$CF_2H$, —$CFH_2$, a group represented by one of Formulae 9-1 to 9-39 in which at least one hydrogen is substituted with —F, a group represented by one of Formulae 9-201 to 9-233 in which at least one hydrogen is substituted with —F, a group represented by one of Formulae 10-1 to 10-126 in which at least one hydrogen is substituted with —F, or a group represented by one of Formulae 10-201 to 10-343 in which at least one hydrogen is substituted with —F.

In one or more embodiments, $R_{20}$ in Formula 1 may be hydrogen, deuterium, —$CH_3$, —$CD_3$, —$CD_2H$, —$CDH_2$, a group represented by one of Formulae 9-1 to 9-39, a group represented by one of Formulae 9-1 to 9-39 in which at least one hydrogen is substituted with deuterium, a group represented by one of Formulae 9-201 to 9-233, a group represented by one of Formulae 9-201 to 9-233 in which at least one hydrogen is substituted with deuterium, a group represented by one of Formulae 10-1 to 10-126, a group represented by one of Formulae 10-1 to 10-126 in which at least one hydrogen is substituted with deuterium, a group represented by one of Formulae 10-201 to 10-343, a group represented by one of Formulae 10-201 to 10-343 in which at least one hydrogen is substituted with deuterium, —$Si(Q_3)(Q_4)(Q_5)$, or —$Ge(Q_3)(Q_4)(Q_5)$ (herein $Q_3$ to $Q_5$ are the same as described in the present specification).

In one or more embodiments, $A_1$ to $A_6$ in Formula 1 may each independently be —$CH_3$, —$CD_3$, —$CD_2H$, —$CDH_2$, —$CF_3$, —$CF_2H$, —$CFH_2$, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-233, a group represented by one of Formulae 9-201 to 9-233 in which at least one hydrogen is substituted with deuterium, a group represented by one of Formulae 9-201 to 9-233 in which at least one hydrogen is substituted with —F, a group represented by one of Formulae 10-1 to 10-126, a group represented by one of Formulae 10-1 to 10-126 in which at least one hydrogen is substituted with deuterium, a group represented by one of Formulae 10-1 to 10-126 in which at least one hydrogen is substituted with —F, a group represented by one of Formulae 10-201 to 10-343, a group represented by one of Formulae 10-201 to 10-343 in which at least one hydrogen is substituted with deuterium, or a group represented by one of Formulae 10-201 to 10-343 in which at least one hydrogen is substituted with —F:

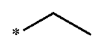
9-1

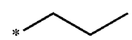
9-2

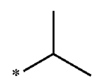
9-3

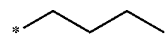
9-4

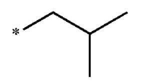
9-5

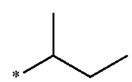
9-6

9-7

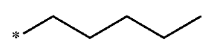
9-8

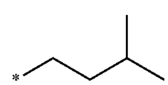
9-9

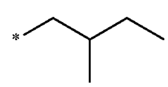
9-10

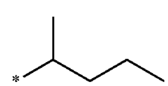
9-11

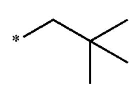
9-12

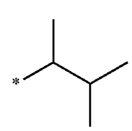
9-13

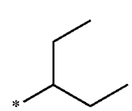
9-14

-continued
9-15
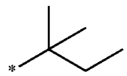
9-16
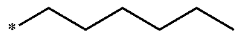
9-17
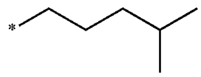
9-18
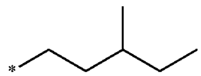
9-19
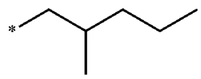
9-20
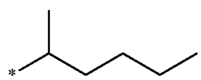
9-21
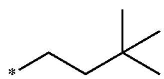
9-22
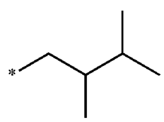
9-23
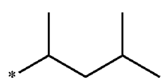
9-24
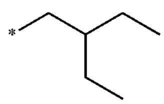
9-25
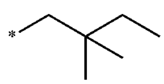
9-26
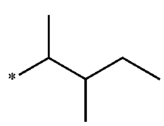
9-27
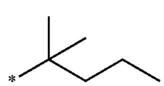
9-28
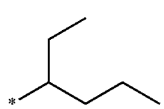
9-29
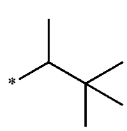
9-30
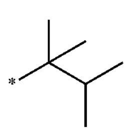
-continued
9-31
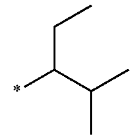
9-32
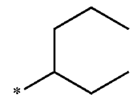
9-33
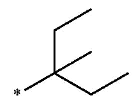
9-34
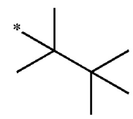
9-35
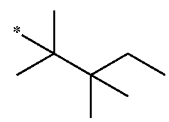
9-36
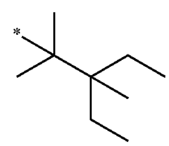
9-37
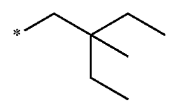
9-38
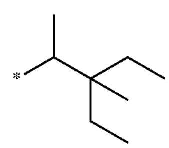
9-39
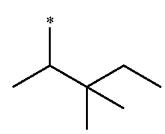
9-201
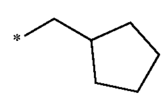
9-202
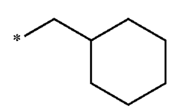
9-203
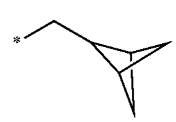

-continued
9-204
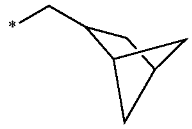
9-205
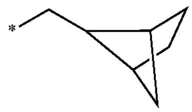
9-206
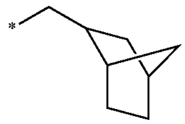
9-207
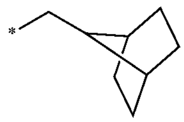
9-208
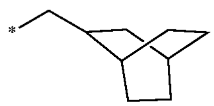
9-209
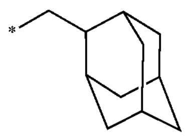
9-210
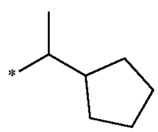
9-211
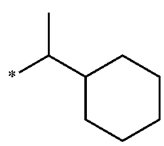
9-212
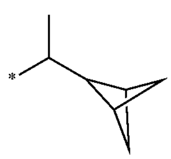
9-213
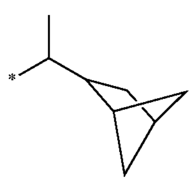
9-214
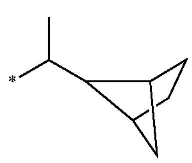
-continued
9-215
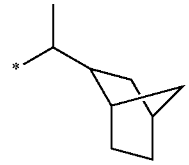
9-216
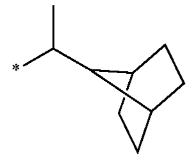
9-217
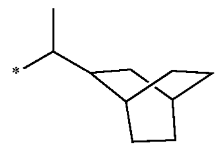
9-218
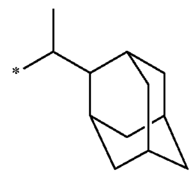
9-219
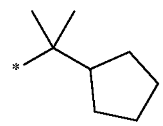
9-220
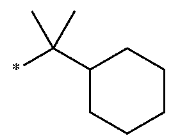
9-221
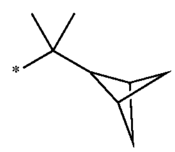
9-222
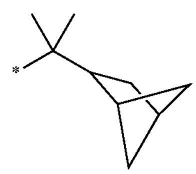
9-223
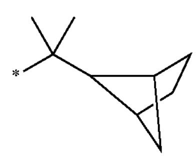
9-224
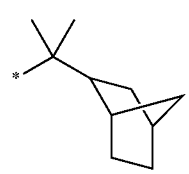

-continued
9-225
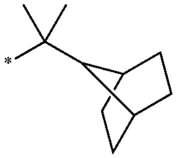
9-226
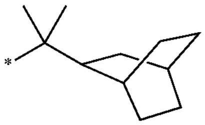
9-227
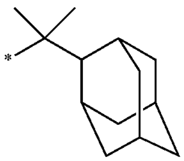
9-228
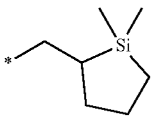
9-229
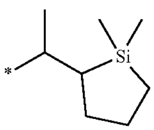
9-230
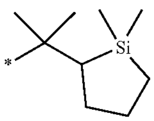
9-231
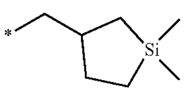
9-232
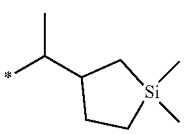
9-233
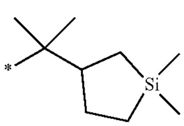
10-1
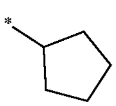
10-2
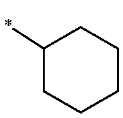
10-3
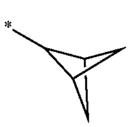
-continued
10-4
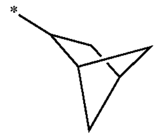
10-5
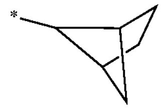
10-6
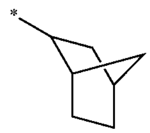
10-7
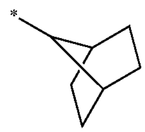
10-8
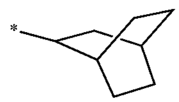
10-9
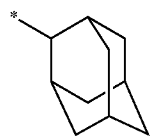
10-10
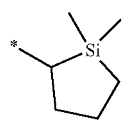
10-11
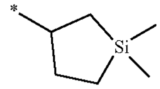
10-12
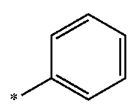
10-13
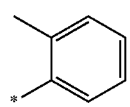
10-14
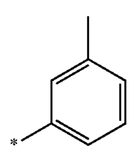
10-15
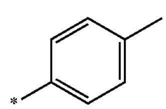

-continued
10-16
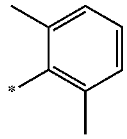
10-17
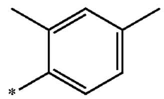
10-18
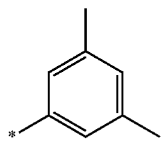
10-19
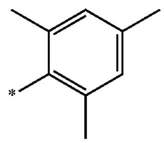
10-20
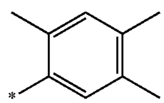
10-21
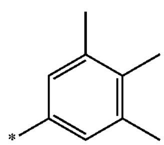
10-22
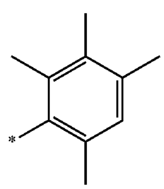
10-23
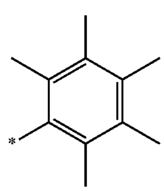
10-24
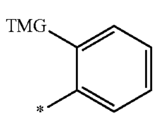
10-25
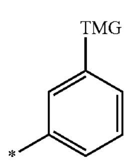
10-26
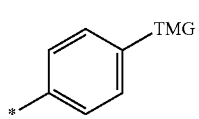
-continued
10-27
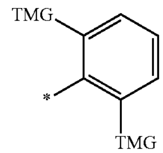
10-28
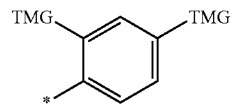
10-29
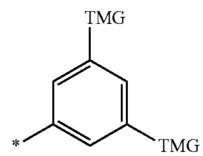
10-30
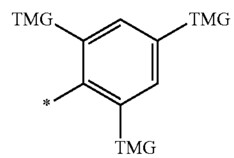
10-31
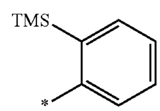
10-32
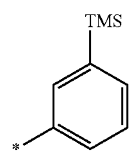
10-33
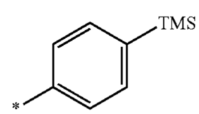
10-34
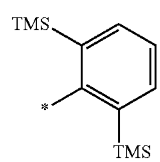
10-35
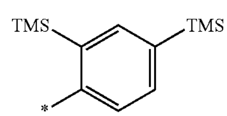
10-36
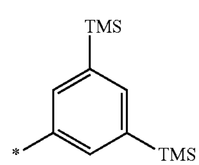
10-37
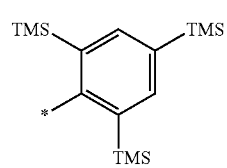

-continued
10-38
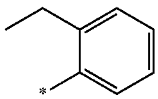
10-39
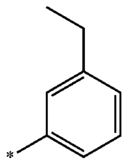
10-40
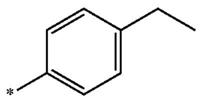
10-41
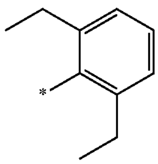
10-42
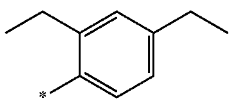
10-43
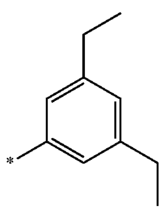
10-44
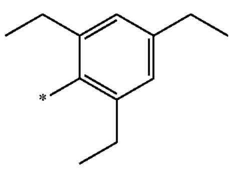
10-45
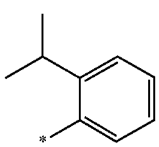
10-46
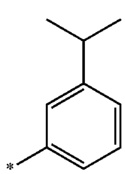
10-47
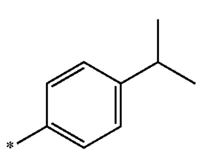
-continued
10-48
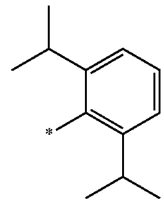
10-49
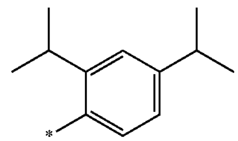
10-50
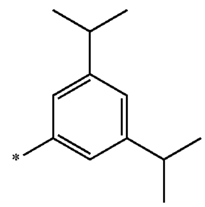
10-51
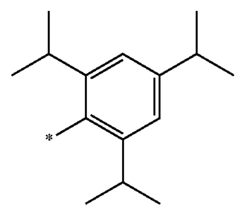
10-52
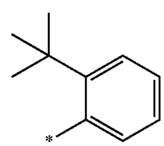
10-53
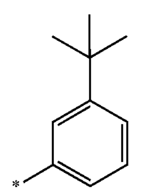
10-54
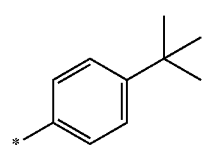
10-55
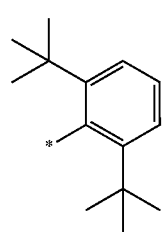

10-56
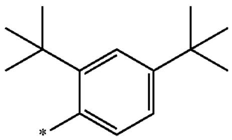
10-57
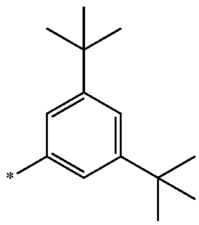
10-58
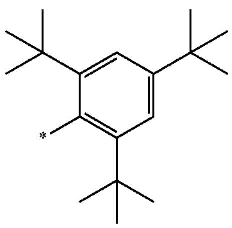
10-59
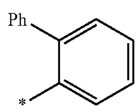
10-60
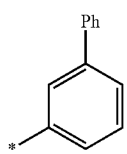
10-61
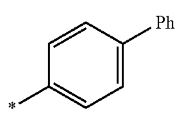
10-62
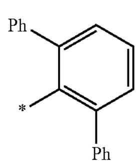
10-63
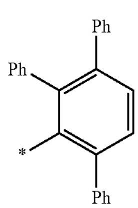
10-64
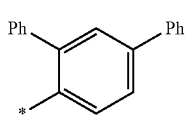
10-65
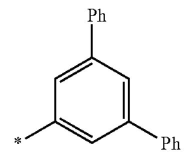
10-66
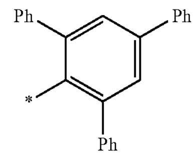
10-67
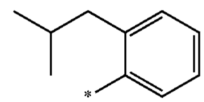
10-68
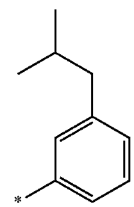
10-69
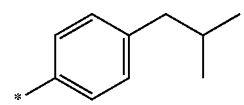
10-70
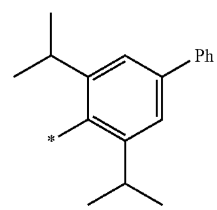
10-71
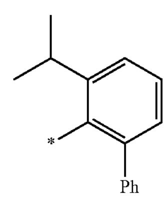
10-72
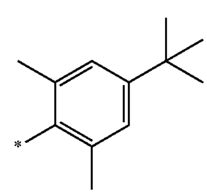
10-73
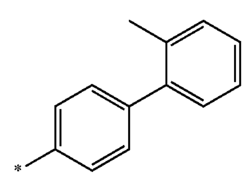

-continued
10-74
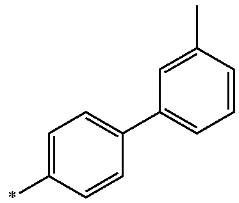
10-75
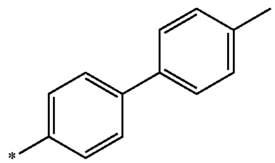
10-76
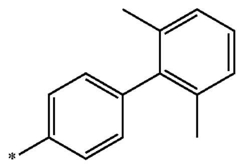
10-77
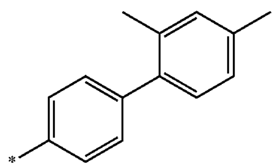
10-78
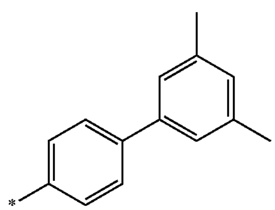
10-79
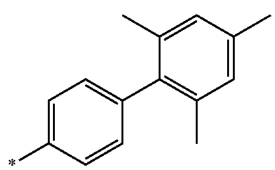
10-80
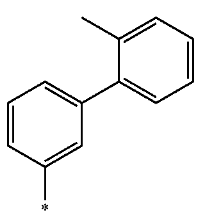
10-81
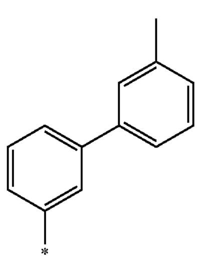
-continued
10-82
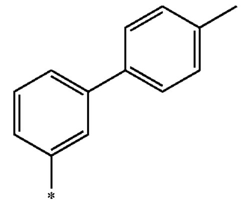
10-83
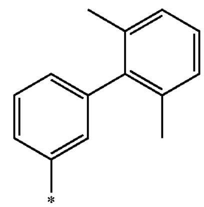
10-84
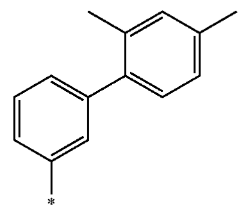
10-85
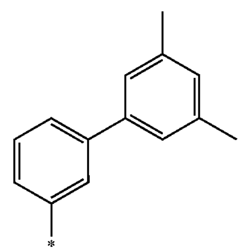
10-86
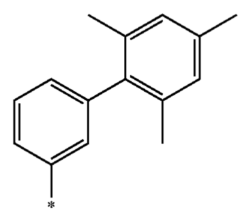
10-87
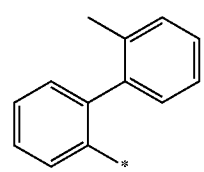
10-88
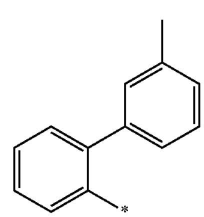

-continued
10-89
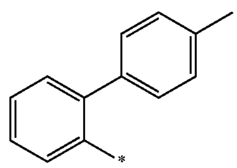
10-90
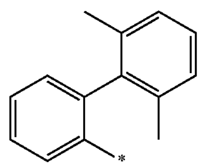
10-91
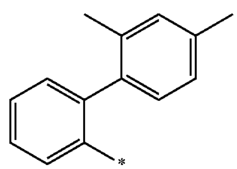
10-92
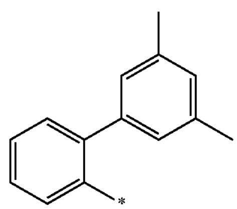
10-93
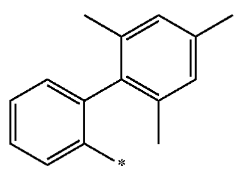
10-94
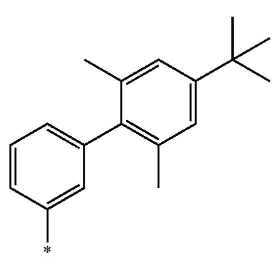
10-95
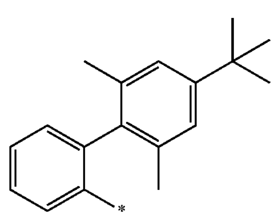
10-96
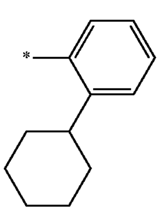
-continued
10-97
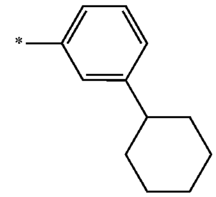
10-98
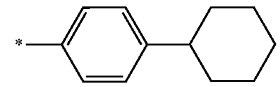
10-99
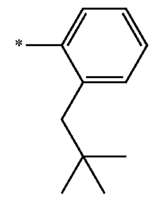
10-100
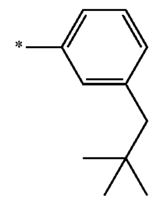
10-101
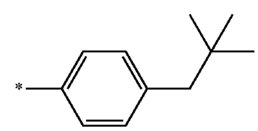
10-102
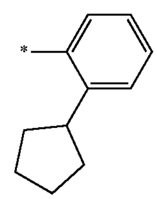
10-103
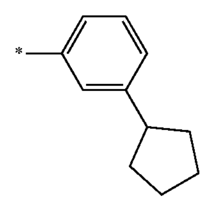
10-104
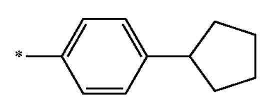
10-105
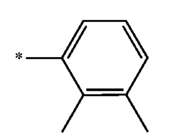
10-106
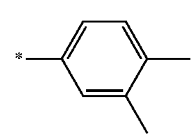

-continued
10-107
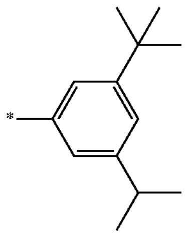
10-108
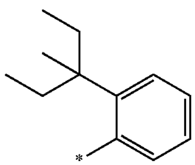
10-109
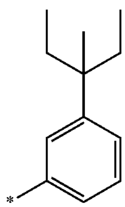
10-110
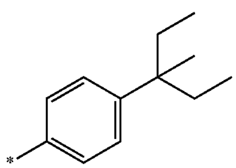
10-111
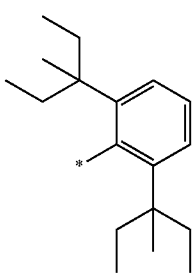
10-112
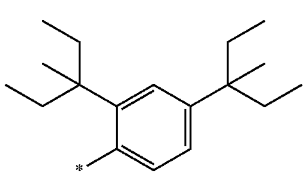
10-113
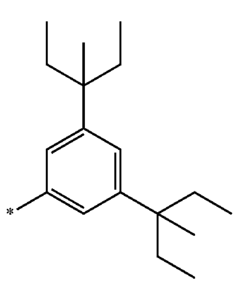
-continued
10-114
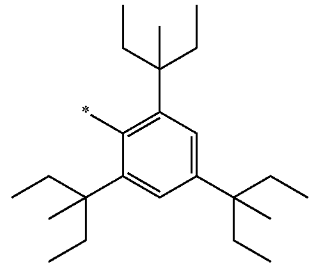
10-115
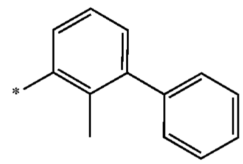
10-116
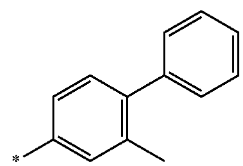
10-117
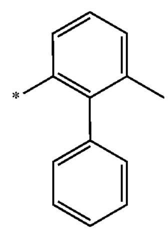
10-118
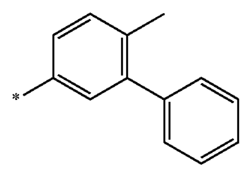
10-119
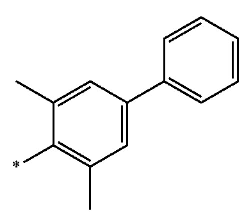
10-120
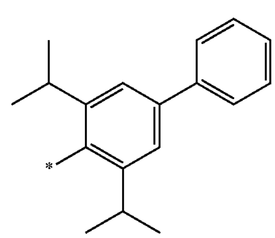
10-121
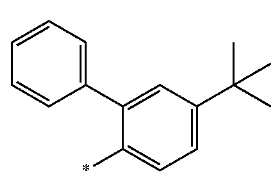

-continued
10-122
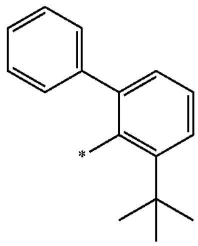
10-123
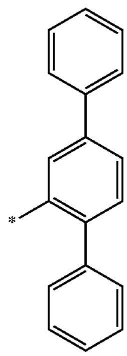
10-124
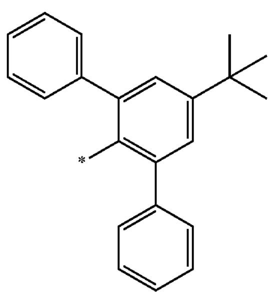
10-125
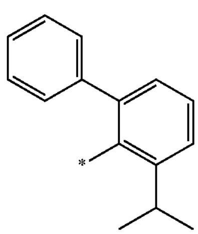
10-126
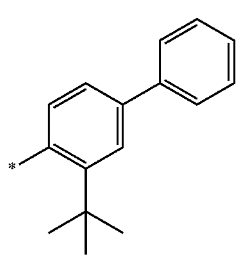
10-201
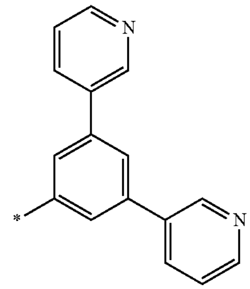
10-202
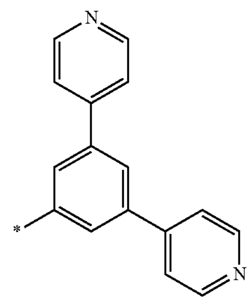
10-203
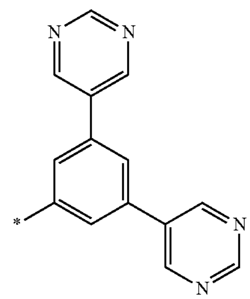
10-204
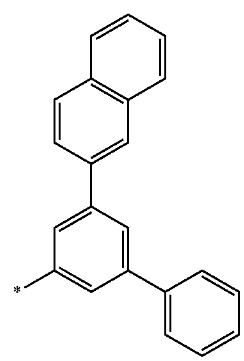
10-205
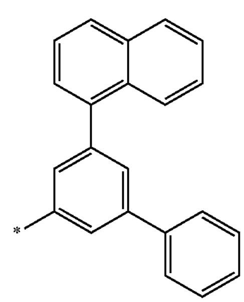

-continued
10-206
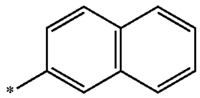
10-207
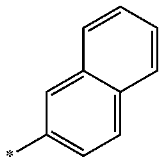
10-208
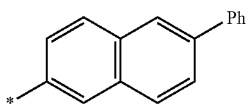
10-209
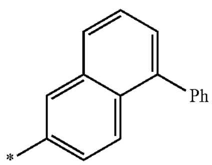
10-210
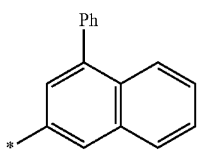
10-211
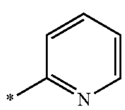
10-212
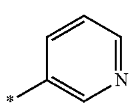
10-213
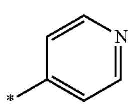
10-214
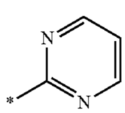
10-215
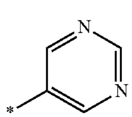
10-216
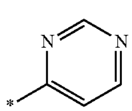
10-217
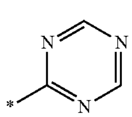
-continued
10-218
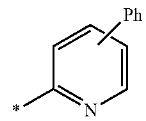
10-219
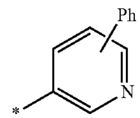
10-220
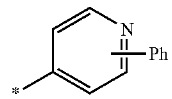
10-221
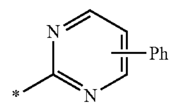
10-222
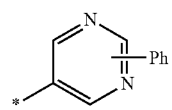
10-223
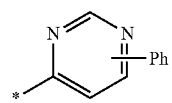
10-224
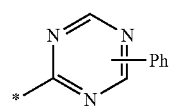
10-225
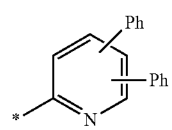
10-226
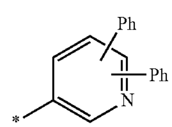
10-227
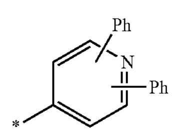
10-228
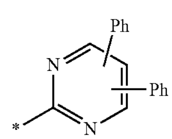
10-229
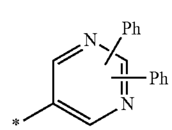
10-230
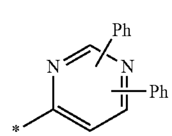

-continued
10-231
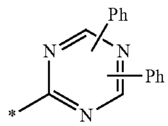
10-232
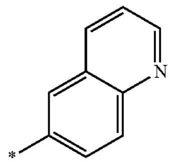
10-233
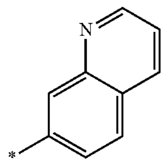
10-234
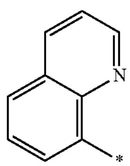
10-235
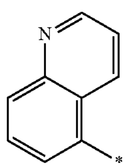
10-236
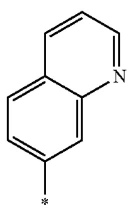
10-237
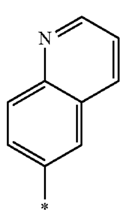
10-238
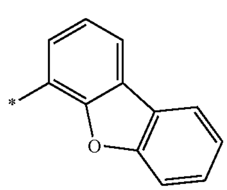
10-239
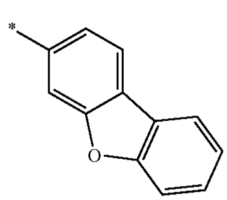
-continued
10-240
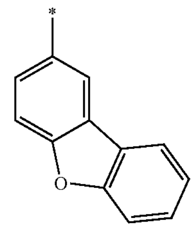
10-241
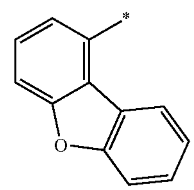
10-242
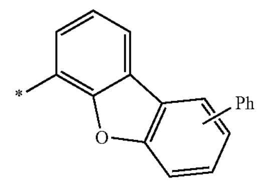
10-243
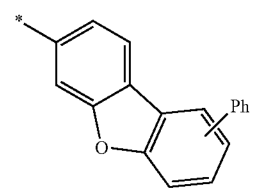
10-244
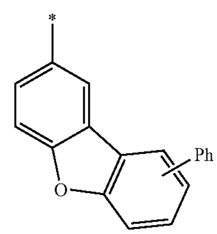
10-245
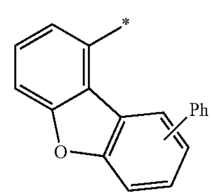
10-246
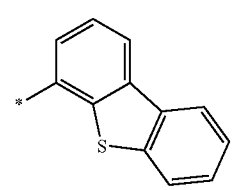
10-247
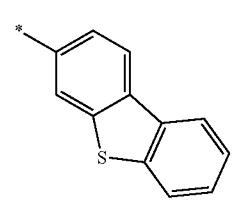

-continued
10-248
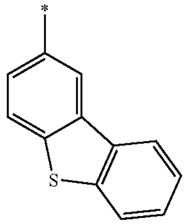
10-249
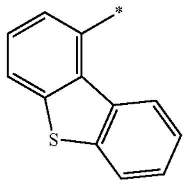
10-250
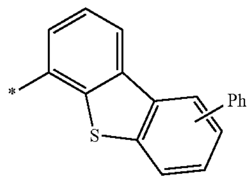
10-251
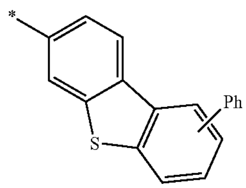
10-252
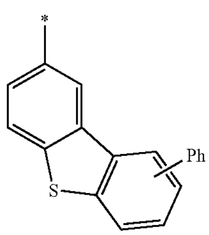
10-253
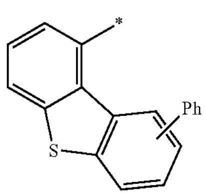
10-254
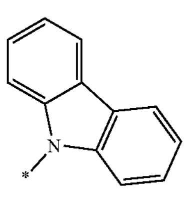
10-255
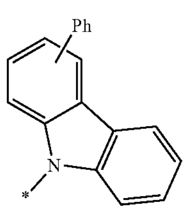
-continued
10-256
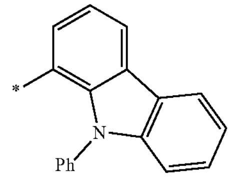
10-257
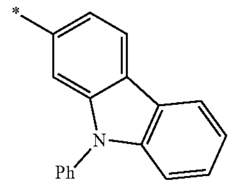
10-258
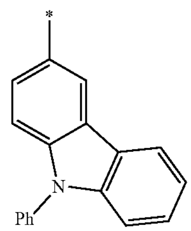
10-259
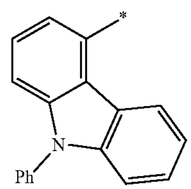
10-260
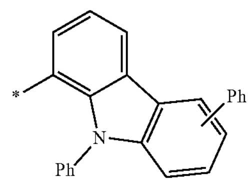
10-261
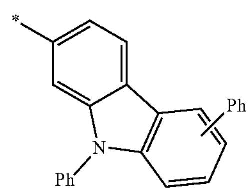
10-262
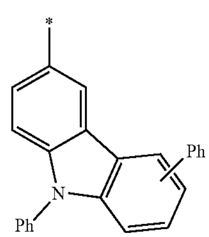
10-263
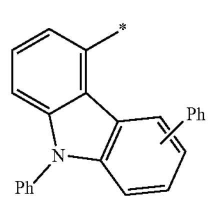

-continued
10-264
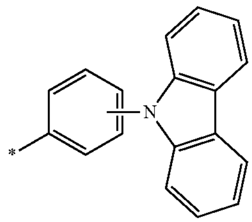
10-265
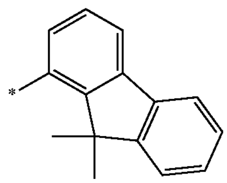
10-266
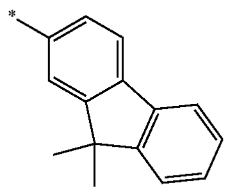
10-267
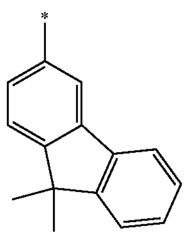
10-268
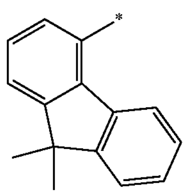
10-269
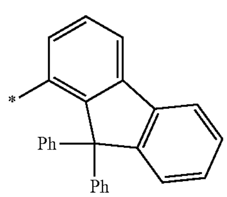
10-270
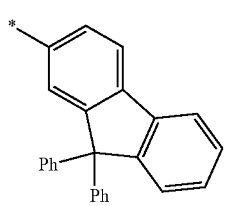
-continued
10-271
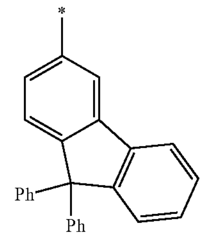
10-272
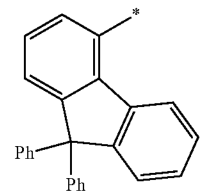
10-273
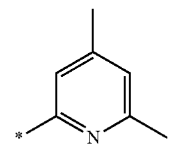
10-274
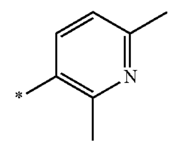
10-275
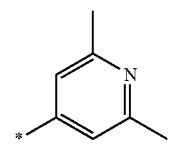
10-276
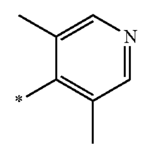
10-277
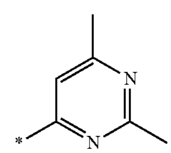
10-278
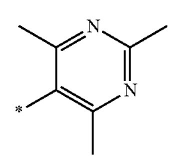
10-279
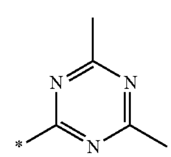

-continued
10-280
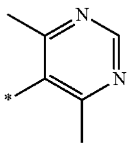
10-281
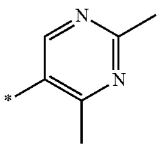
10-282
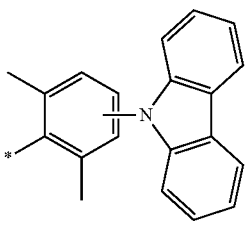
10-283
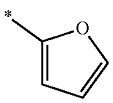
10-284
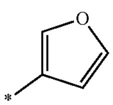
10-285
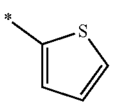
10-286
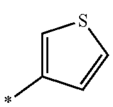
10-287
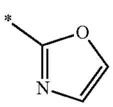
10-288
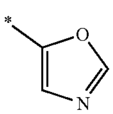
10-289
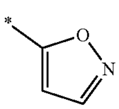
10-290
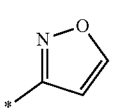
10-291
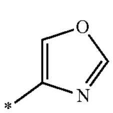
-continued
10-292
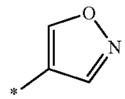
10-293
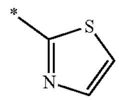
10-294
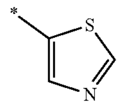
10-295
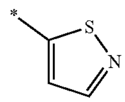
10-296
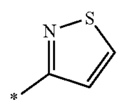
10-297
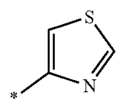
10-298
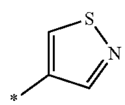
10-299
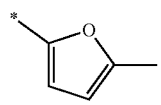
10-300
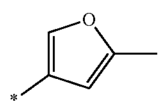
10-301
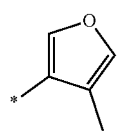
10-302
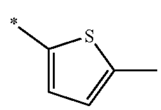
10-303
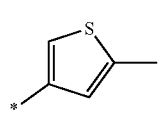
10-304
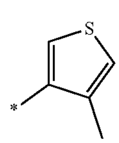

-continued
10-305
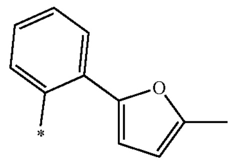
10-306
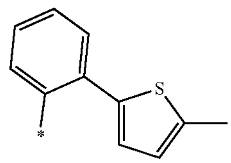
10-307
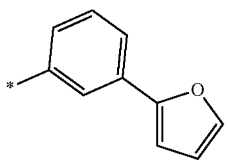
10-308
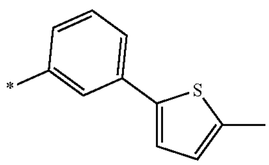
10-309
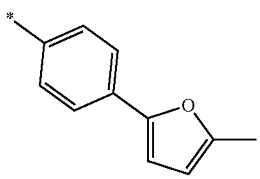
10-310
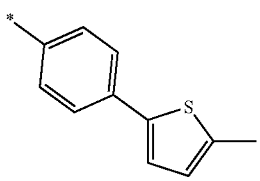
10-311
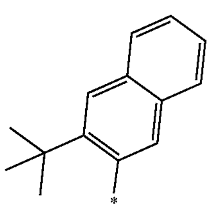
10-312
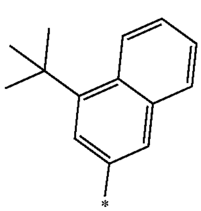
-continued
10-313
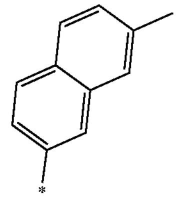
10-314
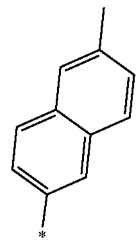
10-315
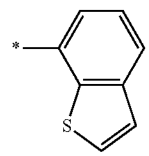
10-316
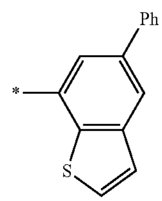
10-317
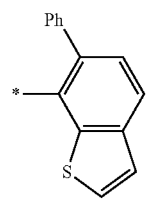
10-318
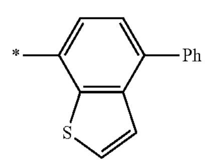
10-319
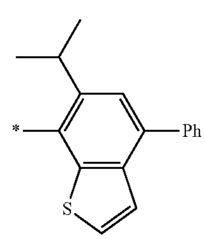

-continued
10-320
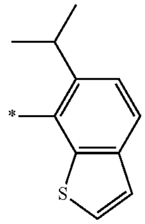
10-321
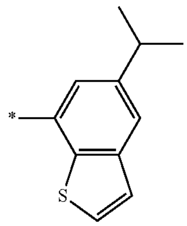
10-322
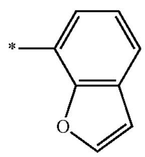
10-323
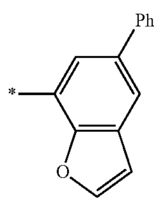
10-324
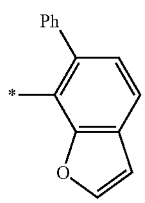
10-325
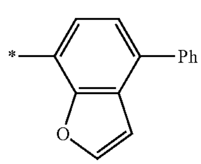
10-326
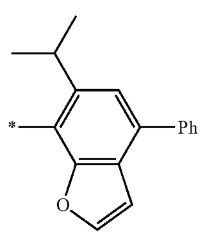
-continued
10-327
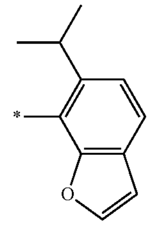
10-328
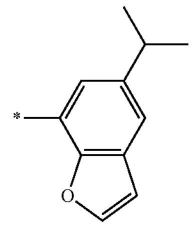
10-329
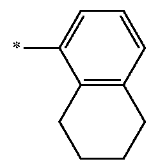
10-330
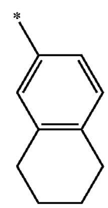
10-331
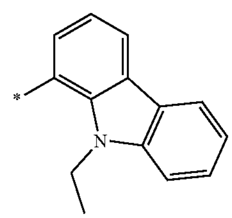
10-332
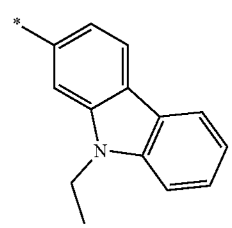
10-333
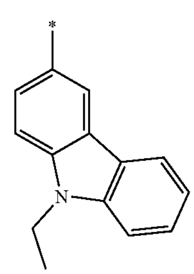

-continued 10-334

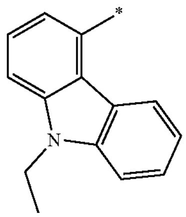

10-335

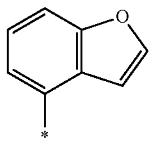

10-336

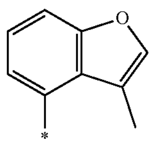

10-337

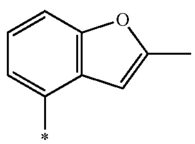

10-338

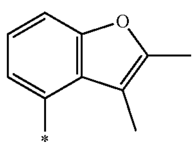

10-339

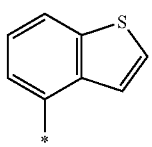

10-340

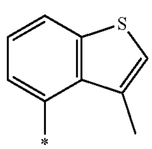

10-341

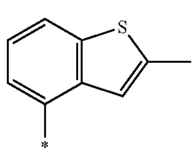

10-342

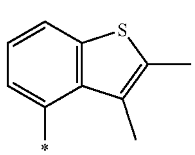

-continued 10-343

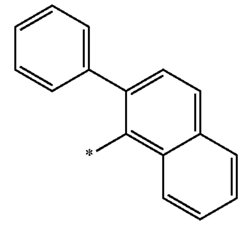

* in Formulae 9-1 to 9-39, 9-201 to 9-233, 10-1 to 10-126, and 10-201 to 10-343 indicates a binding site to a neighboring atom, Ph is a phenyl group, TMS is a trimethylsilyl group, and TMG is a trimethylgermyl group.

The "group represented by one of Formulae 9-1 to 9-39 in which at least one hydrogen is substituted with deuterium" and the "group represented by one of Formulae 9-201 to 9-233 in which at least one hydrogen is substituted with deuterium" may each be, for example, a group represented by one of Formulae 9-501 to 9-514 and 9-601 to 9-635:

9-501

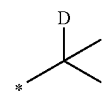

9-502

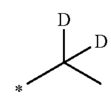

9-503

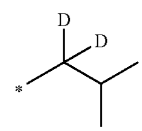

9-504

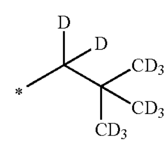

9-505

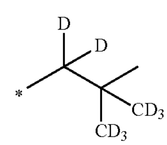

9-506

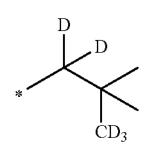

9-507

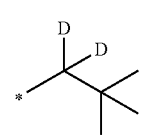

9-508

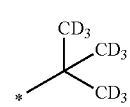

-continued
9-509
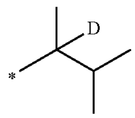
9-510
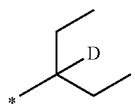
9-511
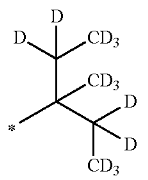
9-512
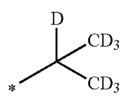
9-513
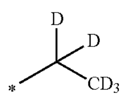
9-514
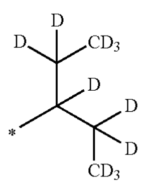
9-601
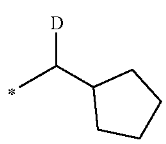
9-602
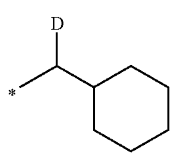
9-603
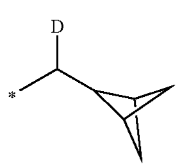
9-604
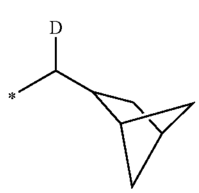
-continued
9-605
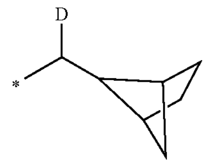
9-606
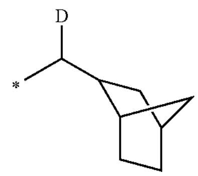
9-607
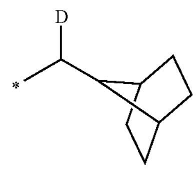
9-608
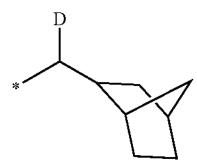
9-609
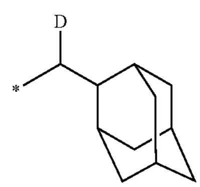
9-610
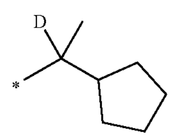
9-611
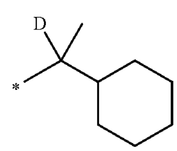
9-612
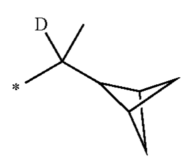
9-613
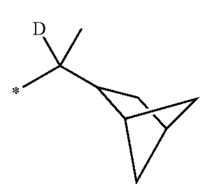

-continued
9-614
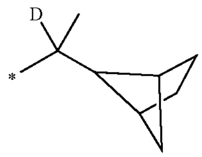
9-615
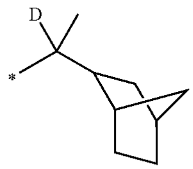
9-616
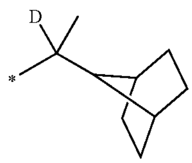
9-617
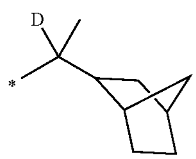
9-618
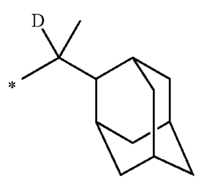
9-619
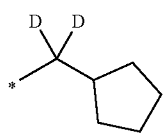
9-620
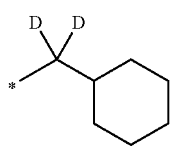
9-621
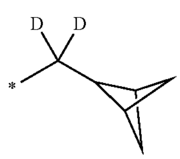
9-622
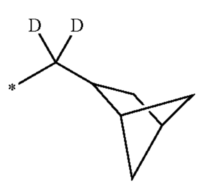
-continued
9-623
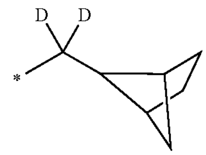
9-624
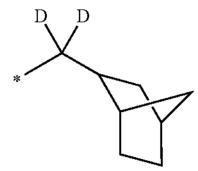
9-625
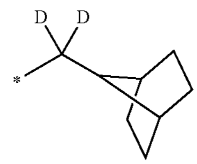
9-626
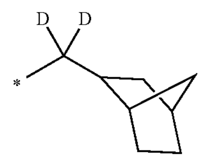
9-627
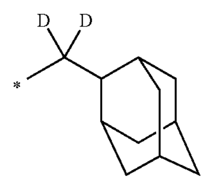
9-628
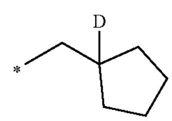
9-629
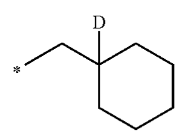
9-630
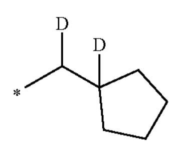
9-631
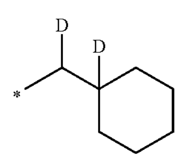
9-632
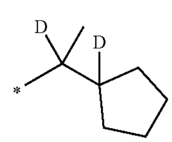

-continued 9-633

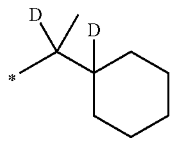

9-634

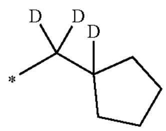

9-635

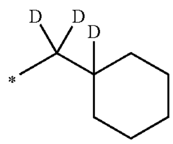

The "group represented by one of Formulae 9-1 to 9-39 in which at least one hydrogen is substituted with —F" and the "group represented by one of Formulae 9-201 to 9-233 in which at least one hydrogen is substituted with —F" may each be, for example, a group represented by one of Formulae 9-701 to 9-710:

9-701

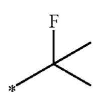

9-702

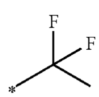

9-703

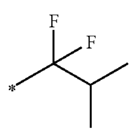

9-704

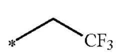

9-705

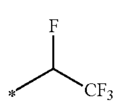

9-706

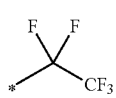

9-707

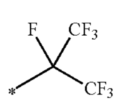

9-708

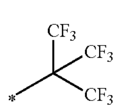

-continued 9-709

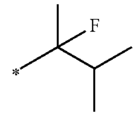

9-710

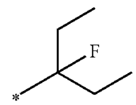

The "group represented by one of Formulae 10-1 to 10-126 in which at least one hydrogen is substituted with deuterium" and the "group represented by one of Formulae 10-201 to 10-343 in which at least one hydrogen is substituted with deuterium" may each be, for example, a group represented by one of Formulae 10-501 to 10-553:

10-501

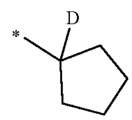

10-502

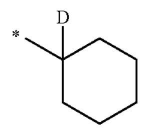

10-503

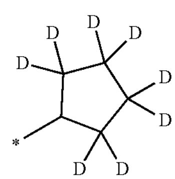

10-504

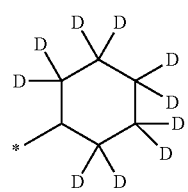

10-505

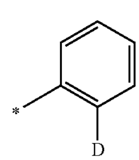

10-506

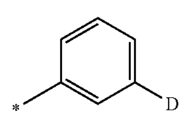

10-507

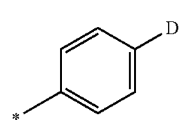

-continued
10-508
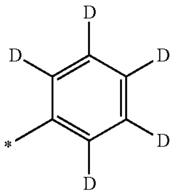
10-509
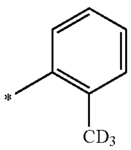
10-510
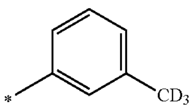
10-511
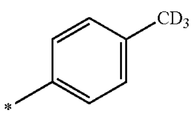
10-512
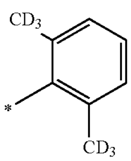
10-513
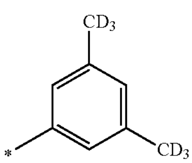
10-514
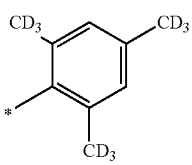
10-515
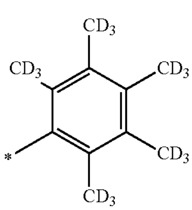
10-516
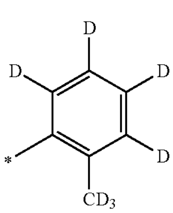
-continued
10-517
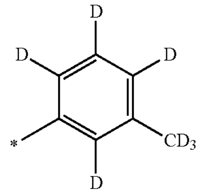
10-518
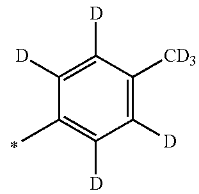
10-519
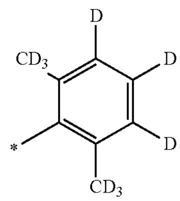
10-520
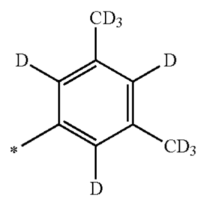
10-521
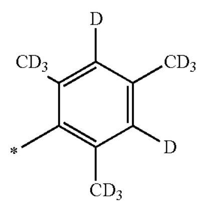
10-522
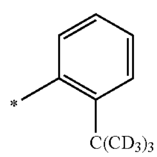
10-523
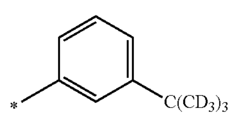
10-524
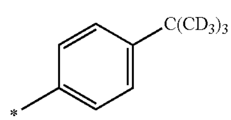
10-525
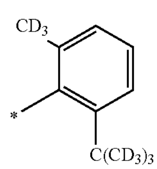

-continued
10-526
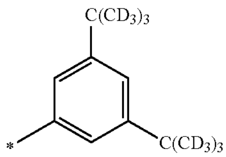
10-527
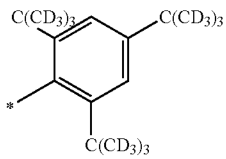
10-528
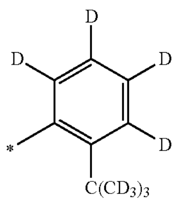
10-529
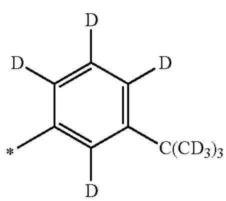
10-530
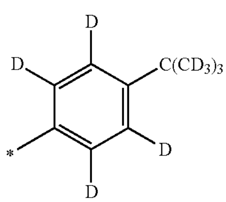
10-531
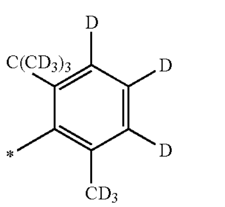
10-532
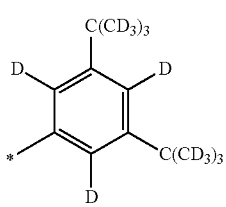
10-533
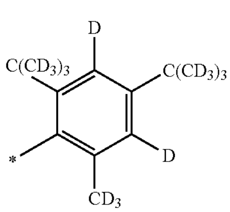
-continued
10-534
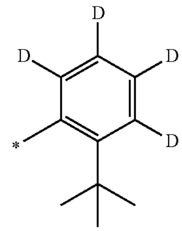
10-535
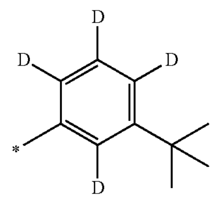
10-536
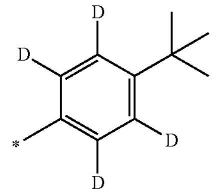
10-537
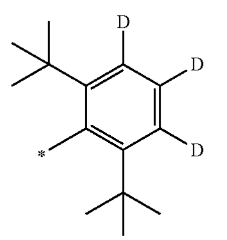
10-538
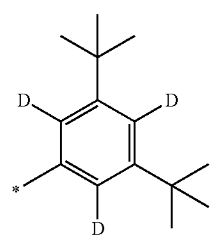
10-540
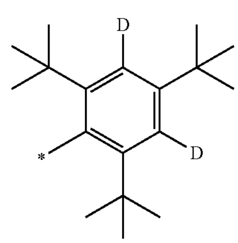
10-541
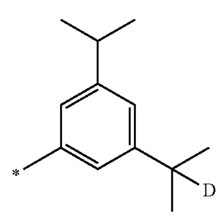

-continued
10-542
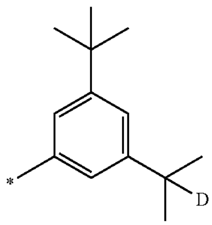
10-543
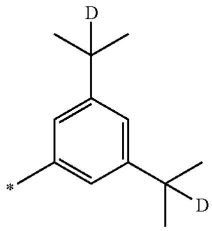
10-544
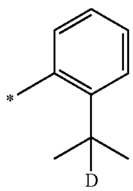
10-545
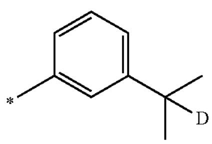
10-546
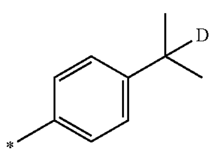
10-547
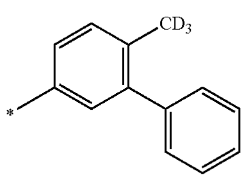
10-548
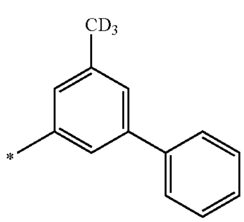
10-549
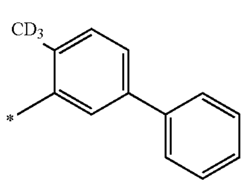
-continued
10-550
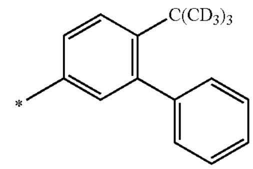
10-551
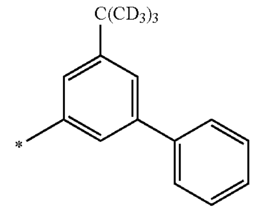
10-552
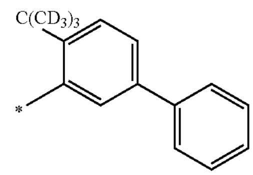
10-553
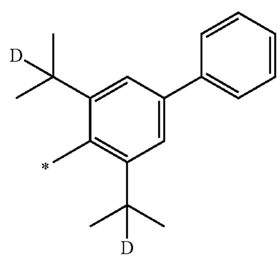
The "group represented by one of Formulae 10-1 to 10-126 in which at least one hydrogen is substituted with —F" and the "group represented by one of Formulae 10-201 to 10-343 in which at least one hydrogen is substituted with —F" may each be, for example, a group represented by one of Formulae 10-601 to 10-615:
10-601
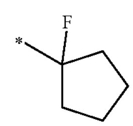
10-602
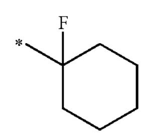
10-603
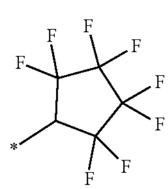

-continued 10-604

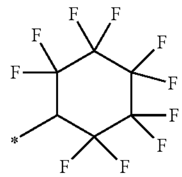

10-605

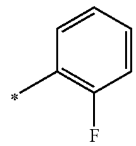

10-606

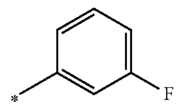

10-607

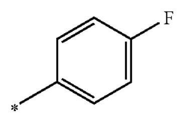

10-608

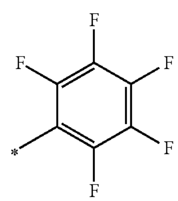

10-609

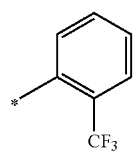

10-610

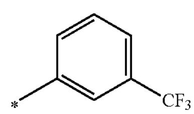

10-611

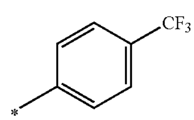

10-612

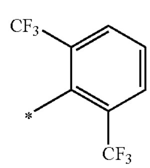

10-613

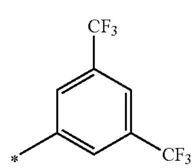

-continued 10-614

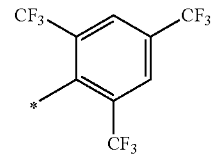

10-615

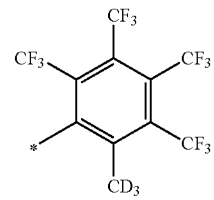

In one or more embodiments, at least one of $R_2$ to $R_8$ of Formula 1 (for example, one or two of $R_2$ to $R_8$) may include at least one fluoro group (—F).

In one or more embodiments, in Formula 1,

1) $R_2$ may include at least one fluoro group (—F);
2) $R_3$ may include at least one fluoro group (—F);
3) $R_4$ may include at least one fluoro group (—F);
4) $R_5$ may include at least one fluoro group (—F);
5) $R_6$ may include at least one fluoro group (—F);
6) $R_7$ may include at least one fluoro group (—F);
7) $R_8$ may include at least one fluoro group (—F);
8) $R_4$ and $R_5$ may each include at least one fluoro group (—F);
9) $R_4$ and $R_6$ may each include at least one fluoro group (—F);
10) $R_5$ and $R_6$ may each include at least one fluoro group (—F)
11) $R_3$ and $R_4$ may each include at least one fluoro group (—F); or
12) $R_3$ and $R_6$ may each include at least one fluoro group (—F).

In one or more embodiments, regarding Formula 1, one or two of $R_1$ to $R_8$ may each independently include at least one fluoro group (—F), and at least one of $R_1$ to $R_8$ i) may not include a fluoro group (—F), and ii) may not be hydrogen.

In one or more embodiments, $R_5$ in Formula 1 may not be hydrogen.

In one or more embodiments, $R_{20}$ in Formula 1 may be a $C_1$-$C_{20}$ alkyl group, a $C_3$-$C_{10}$ cycloalkyl group, or a $C_2$-$C_{10}$ heterocycloalkyl group, each unsubstituted or substituted with deuterium, a $C_1$-$C_{20}$ alkyl group, a $C_3$-$C_{10}$ cycloalkyl group, a $C_2$-$C_{10}$ heterocycloalkyl group, or any combination thereof.

In one or more embodiments, $R_{20}$ in Formula 1 may be a $C_1$-$C_{20}$ alkyl group, unsubstituted or substituted with deuterium, a $C_1$-$C_{20}$ alkyl group, or any combination thereof.

In one or more embodiments, d2 in Formula 1 may be 2.

In one or more embodiments, $R_{20}$ in Formula 1 may be a $C_1$-$C_{20}$ alkyl group, unsubstituted or substituted with deuterium, a $C_1$-$C_{20}$ alkyl group, or any combination thereof, and d2 may be 2.

In one or more embodiments, the organometallic compound represented by Formula 1 may have at least one deuterium.

In one or more embodiments, at least one of $R_1$ to $R_8$ of Formula 1 may have at least one deuterium.

In one or more embodiments, at least one of $R_{20}$ in number of d2 may have at least one deuterium.

In one or more embodiments, at least one of $R_{20}$ in number of d2 may be a deuterium-containing $C_1$-$C_{20}$ alkyl group, a deuterium-containing $C_3$-$C_{10}$ cycloalkyl group, or a deuterium-containing $C_2$-$C_{10}$ heterocycloalkyl group, each unsubstituted or substituted with a $C_1$-$C_{20}$ alkyl group, a $C_3$-$C_{10}$ cycloalkyl group, a $C_2$-$C_{10}$ heterocycloalkyl group, or any combination thereof.

In Formula 1, 1) two or more of $R_1$ to $R_8$ may be optionally linked to each other to form a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$, 2) two or more of $R_{20}$(s) in the number of d2 may be optionally linked to each other to form a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$, and 3) two or more of $A_1$ to $A_7$ may be optionally linked to each other to form a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$. Herein, $R_{1a}$ may be understood by referring to the description of $A_7$.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The phrase "a $C_5$-$C_{30}$ carbocyclic group (which is unsubstituted or substituted with at least one $R_{1a}$)" may include, for example, an adamantane group, a norbornene group, a bicyclo[1.1.1]pentane group, a bicyclo[2.1.1]hexane group, a bicyclo[2.2.1]heptane group (a norbornane group), a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, cyclopentadiene group, a 1,2,3,4-tetrahydronaphthalene group, a fluorene group, each being unsubstituted or substituted with at least one $R_{1a}$.

The term "$C_1$-$C_{30}$ heterocyclic group" as used herein refers to a saturated or unsaturated cyclic group having, as a ring-forming atom, at least one heteroatom selected from N, O, Si, P, Se, B, Ge, or S other than 1 to 30 carbon atoms. The $C_1$-$C_{30}$ heterocyclic group may be a monocyclic group or a polycyclic group.

The phrase "a $C_1$-$C_{30}$ heterocyclic group (which is unsubstituted or substituted with at least one $R_{1a}$)" may include, for example, a thiophene group, a furan group, a pyrrole group, a silole group, a borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group, each being unsubstituted or substituted with at least one $R_{1a}$.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" used herein refers to a divalent group having the same structure as that of the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an iso-nonyl group, a sec-nonyl group, a tert-nonyl group, an n-decyl group, an iso-decyl group, a sec-decyl group, and a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, or any combination thereof. For example, Formula 9-33 may be a branched $C_6$ alkyl group, and may be a tert-butyl group that is substituted with two methyl groups.

The term "$C_1$-$C_{60}$ alkoxy group" used herein refers to a monovalent group represented by $—OA_{101}$ (wherein $A_{101}$ is the $C_1$-$C_{60}$ alkyl group).

Examples of the $C_1$-$C_{60}$ alkoxy group, the $C_1$-$C_{20}$ alkoxy group, or the $C_1$-$C_{10}$ alkoxy group are a methoxy group, an ethoxy group, a propoxy group, isopropyloxy group, a butoxy group, or a pentoxy group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as that of the $C_3$-$C_{10}$ cycloalkyl group.

Examples of the $C_3$-$C_{10}$ cycloalkyl group are a cyclopropyl group, a cyclobutyl group, a cyclopentyl group, a cyclohexyl group, a cycloheptyl group, a cyclooctyl group, an adamantyl group, a bicyclo[1.1.1]pentyl group (bicyclo[1.1.1]pentyl), a bicyclo[2.1.1]hexyl group (bicyclo[2.1.1]hexyl), a bicyclo[2.2.1]heptyl group (bicyclo[2.2.1]heptyl)(a norbornyl group), and a bicyclo[2.2.2]octyl group.

The term "$C_2$-$C_{10}$ heterocycloalkyl group" as used herein refers to a monovalent saturated monocyclic group having at least one heteroatom selected from N, O, P, Si Se, B, Ge, or S as a ring-forming atom and 2 to 10 carbon atoms, and non-limiting examples thereof include a tetrahydrofuranyl group, and a tetrahydrothiophenyl group.

The term "$C_2$-$C_{10}$ heterocycloalkylene group" as used herein refers to a divalent group having the same structure as the $C_2$-$C_{10}$ heterocycloalkyl group.

Examples of the $C_2$-$C_{10}$ heterocycloalkyl group are a silolanyl group, a silinanyl group, a tetrahydrofuranyl group, a tetrahydro-2H-pyranyl group, and a tetrahydrothiophenyl group.

The term "deuterium-containing $C_1$-$C_{60}$ alkyl group (or, deuterium-containing $C_1$-$C_{20}$ alkyl group, a deuterium-containing $C_2$-$C_{20}$ alkyl group, or the like)" as used herein refers to a $C_1$-$C_{60}$ alkyl group substituted with at least one deuterium (or a $C_1$-$C_{20}$ alkyl group substituted with at least one deuterium, a $C_2$-$C_{20}$ alkyl substituted with at least one deuterium, or the like). For example, the term "the deuterium-containing $C_1$ alkyl group (that is, a deuterium-containing methyl group)" as used herein includes —$CD_3$, —$CD_2H$, and —$CDH_2$.

The term "deuterium-containing $C_3$-$C_{10}$ cycloalkyl group" as used herein refers to a $C_3$-$C_{10}$ cycloalkyl group substituted with at least one deuterium. Examples of the "deuterium-containing $C_3$-$C_{10}$ cycloalkyl group" are provided in connection with, for example, Formula 10-501.

The terms "fluorinated $C_1$-$C_{60}$ alkyl group (or a fluorinated $C_1$-$C_{20}$ alkyl group, or the like)", "fluorinated $C_3$-$C_{10}$ cycloalkyl group", or "fluorinated $C_2$-$C_{10}$ heterocycloalkyl group" as used herein refer to a $C_1$-$C_{60}$ alkyl group (or, $C_1$-$C_{20}$ alkyl group, or the like) substituted with at least one a fluoro group (—F), a $C_3$-$C_{10}$ cycloalkyl group substituted with at least one a fluoro group (—F), and a $C_2$-$C_{10}$ heterocycloalkyl group substituted with at least one a fluoro group (—F), respectively. For example, the term "the fluorinated $C_1$ alkyl group (that is, the fluorinated methyl group)" includes —$CF_3$, —$CF_2H$, and —$CFH_2$. The "fluorinated $C_1$-$C_{60}$ alkyl group (or the fluorinated $C_1$-$C_{20}$ alkyl group, or the like)", "the fluorinated $C_3$-$C_{10}$ cycloalkyl group", or "the fluorinated $C_2$-$C_{10}$ heterocycloalkyl group" may be i) a fully fluorinated $C_1$-$C_{60}$ alkyl group (or, fully fluorinated $C_1$-$C_{20}$ alkyl group, or the like), a fully fluorinated $C_3$-$C_{10}$ cycloalkyl group, or a fully fluorinated $C_2$-$C_{10}$ heterocycloalkyl group, each group in which all hydrogen are substituted with a fluoro group, or ii) a partially fluorinated $C_1$-$C_{60}$ alkyl group (or, a partially fluorinated $C_1$-$C_{20}$ alkyl group, or the like), a partially fluorinated $C_3$-$C_{10}$ cycloalkyl group, or a partially fluorinated $C_2$-$C_{10}$ heterocycloalkyl group, each group in which some hydrogen are substituted with a fluoro group.

The term "($C_1$-$C_{20}$ alkyl)'X' group" as used herein refers to a 'X' group substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group and the term "($C_1$-$C_{20}$ alkyl)phenyl group" as used herein refers to a phenyl group substituted with at least one $C_1$-$C_{20}$ alkyl group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as that of the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as that of the $C_2$-$C_{60}$ alkynyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group that has at least one heteroatom selected from N, O, P, Si, Se, B, Ge, or S as a ring-forming atom, 2 to 10 carbon atoms, and at least one double bond in its ring. Examples of the $C_2$-$C_{10}$ heterocycloalkenyl group are a 2,3-dihydrofuranyl group, and a 2,3-dihydrothiophenyl group. The term "$C_2$-$C_{10}$ heterocycloalkenylene group" as used herein refers to a divalent group having the same structure as the $C_2$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_7$-$C_{60}$ alkylaryl group" used herein refers to a $C_6$-$C_{60}$ aryl group substituted with at least one $C_1$-$C_{60}$ alkyl group.

The term "$C_1$-$C_{60}$ heteroaryl group" as used herein refers to a monovalent group having a cyclic aromatic system that has at least one heteroatom selected from N, O, P, Si, Se, B, Ge, or S as a ring-forming atom, and 1 to 60 carbon atoms. The term "$C_1$-$C_{60}$ heteroarylene group" as used herein refers to a divalent group having a cyclic aromatic system that has at least one heteroatom selected from N, O, P, Si, Se, B, Ge, or S as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the rings may be fused to each other.

The term "$C_2$-$C_{60}$ alkylheteroaryl group" used herein refers to a $C_1$-$C_{60}$ heteroaryl group substituted with at least one $C_1$-$C_{60}$ alkyl group.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, Se, B, Ge, or S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

A substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may be:

- deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;
- a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;
- a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or any combination thereof;
- —$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or any combination thereof.

In the present specification, $Q_1$ to $Q_9$, $Q_{11}$ to $Q_{19}$, $Q_{21}$ to $Q_{29}$, and $Q_{31}$ to $Q_{39}$ may each independently be hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group, unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_2$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group, unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

For example, in the present specification, $Q_1$ to $Q_9$, $Q_{11}$ to $Q_{19}$, $Q_{21}$ to $Q_{29}$, and $Q_{31}$ to $Q_{39}$ may each independently be —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

The terms “an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene 5,5-dioxide group” respectively refer to a heterocyclic group having the same backbone as “an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, 9H-fluorene-9-one group, and a dibenzothiophene 5,5-dioxide group” in which at least one carbon atoms constituting the cyclic groups is substituted with a nitrogen.

In one or more embodiments, a group represented by

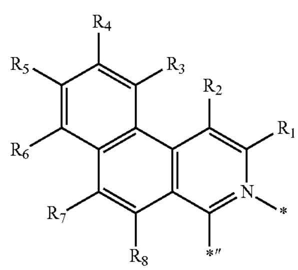

in Formula 1 may be a group represented by one of Formulae CY1 to CY108:

CY1

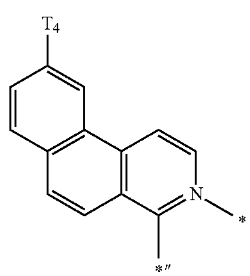

CY2

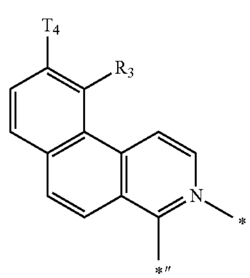

-continued

CY3

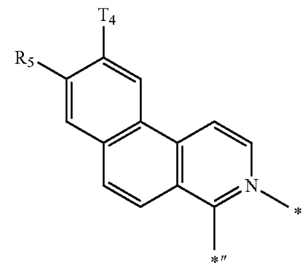

CY4

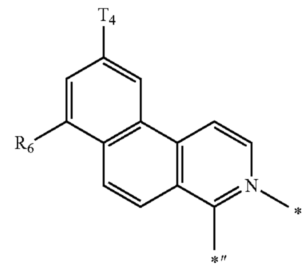

CY5

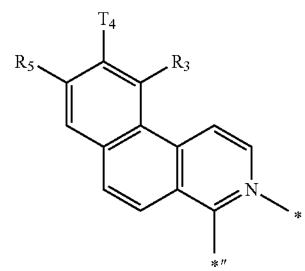

CY6

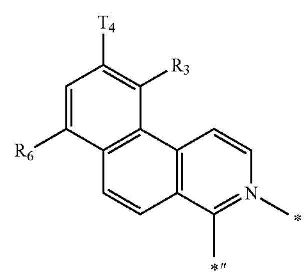

CY7

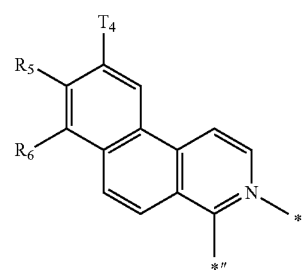

-continued
CY8
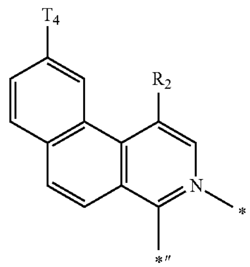
CY9
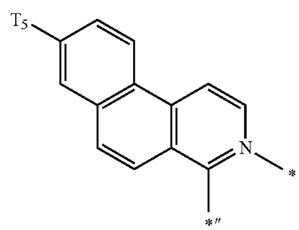
CY10
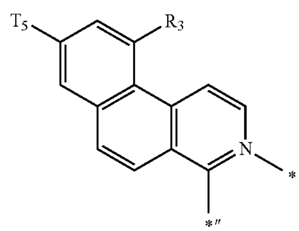
CY11
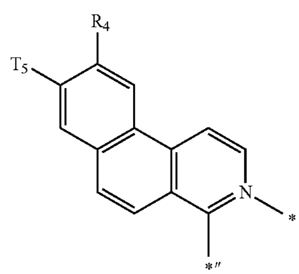
CY12
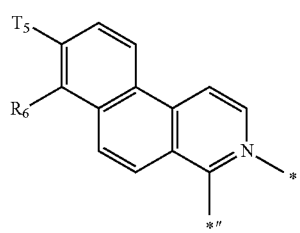
CY13
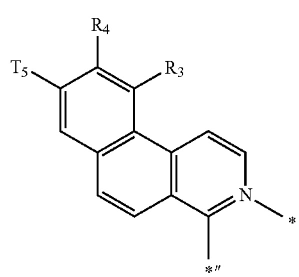
-continued
CY14
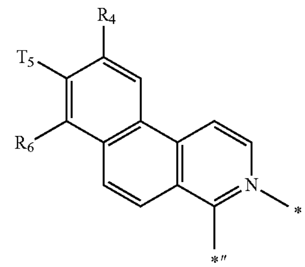
CY15
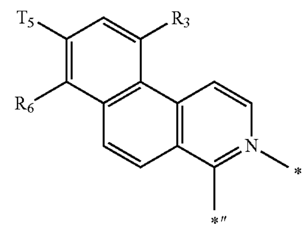
CY16
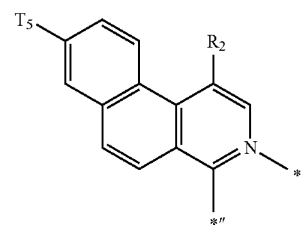
CY17
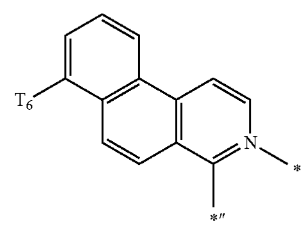
CY18
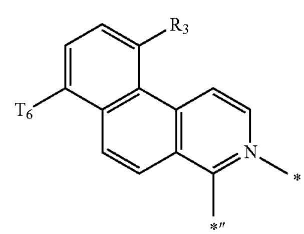
CY19
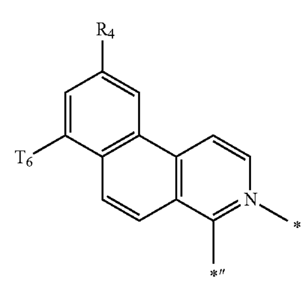

CY20
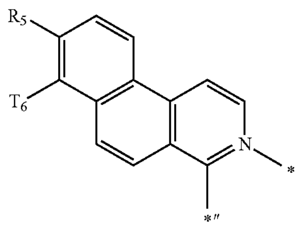
CY21
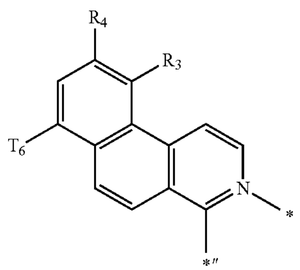
CY22
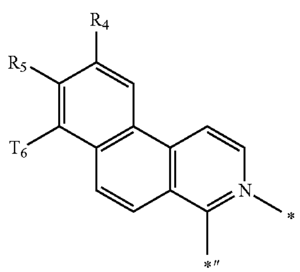
CY23
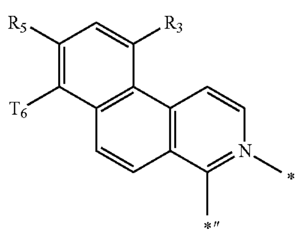
CY24
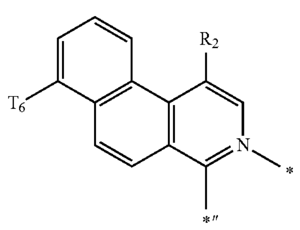
CY25
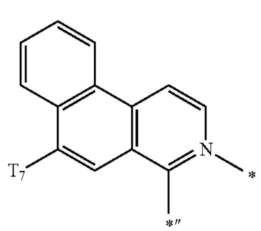
CY26
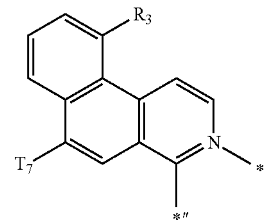
CY27
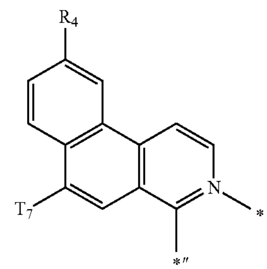
CY28
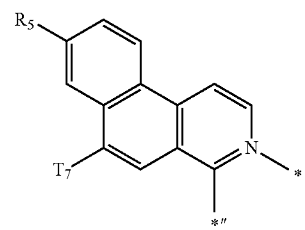
CY29
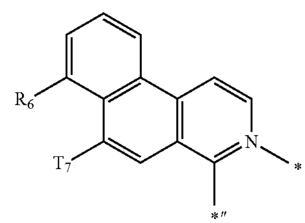
CY30
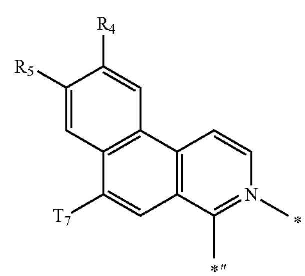
CY31
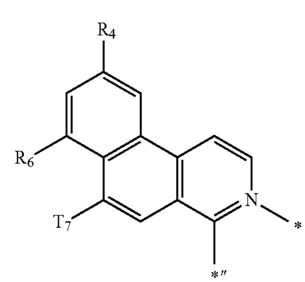

-continued
CY32
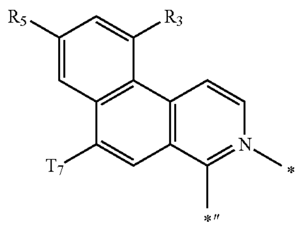
CY33
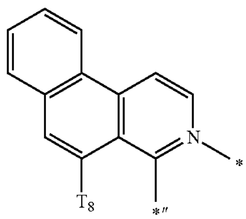
CY34
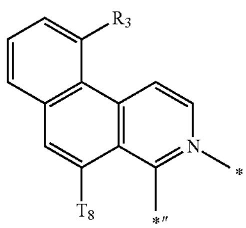
CY35
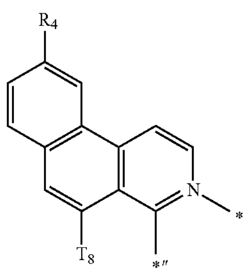
CY36
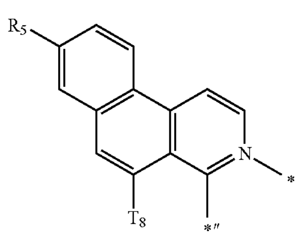
CY37
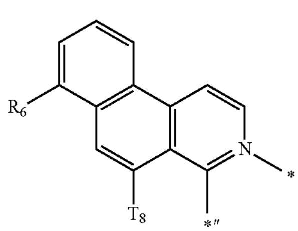
-continued
CY38
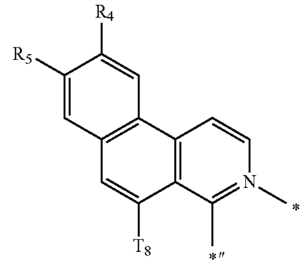
CY39
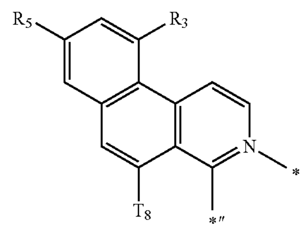
CY40
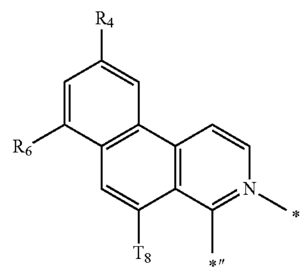
CY41
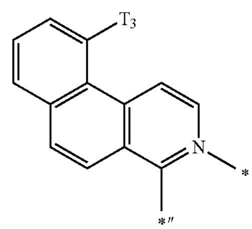
CY42
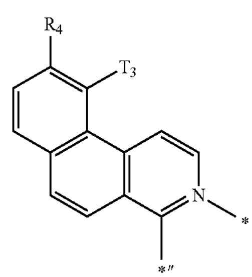
CY43
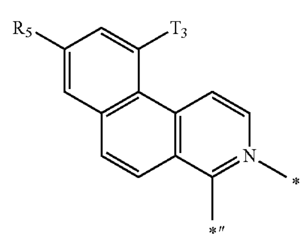

-continued
CY44
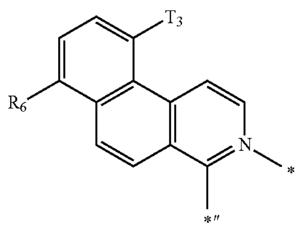
CY45
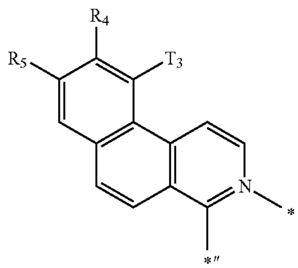
CY46
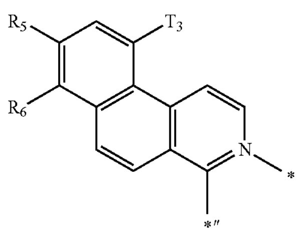
CY47
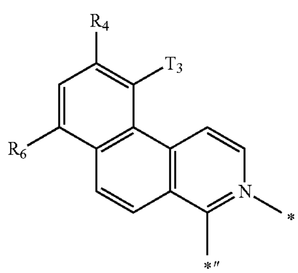
CY48
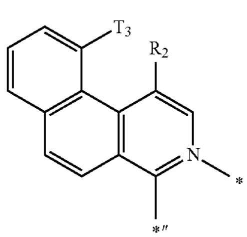
CY49
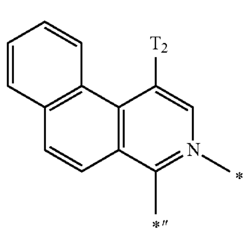
-continued
CY50
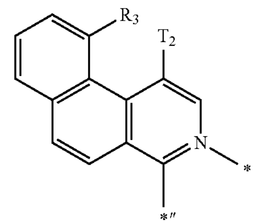
CY51
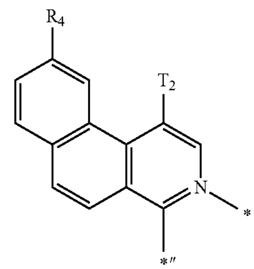
CY52
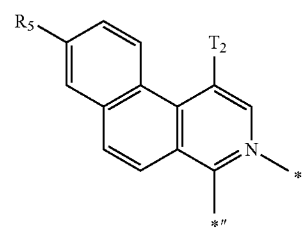
CY53
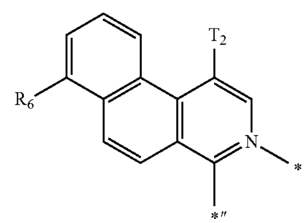
CY54
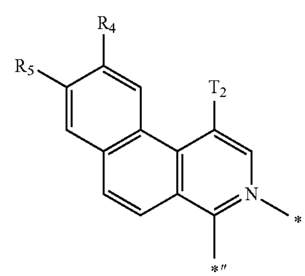
CY55
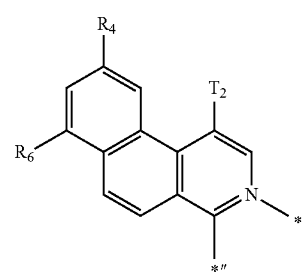

CY56
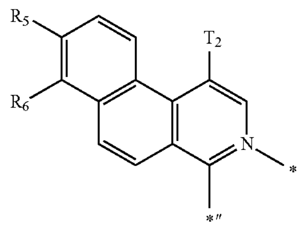
CY57
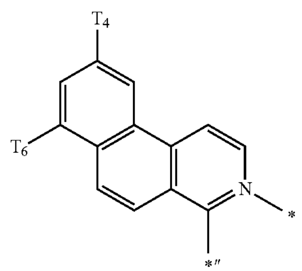
CY58
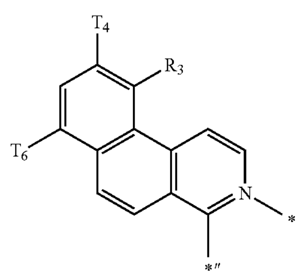
CY59
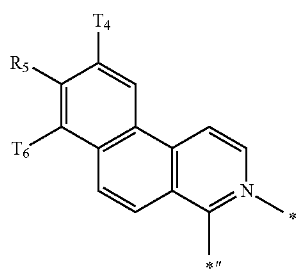
CY60
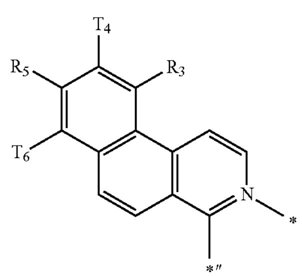
CY61
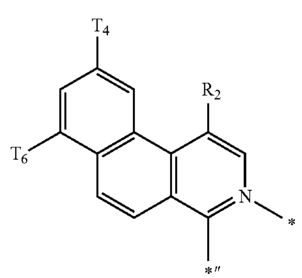
CY62
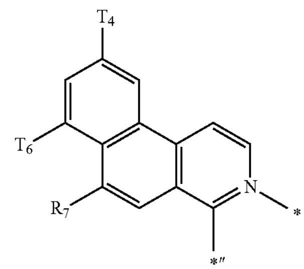
CY63
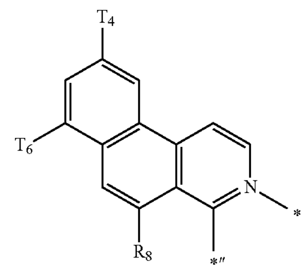
CY64
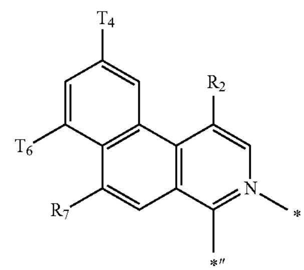
CY65
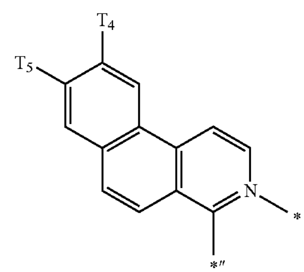
CY66
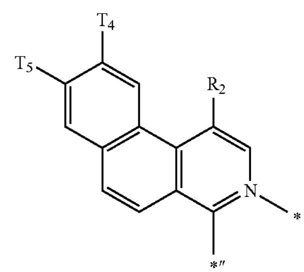

-continued
CY67
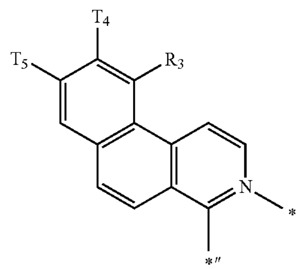
CY68
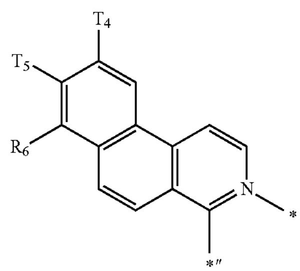
CY69
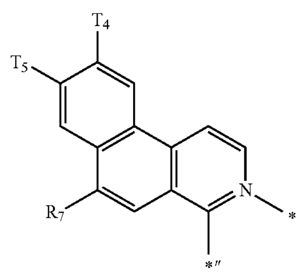
CY70
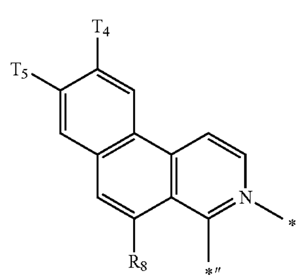
CY71
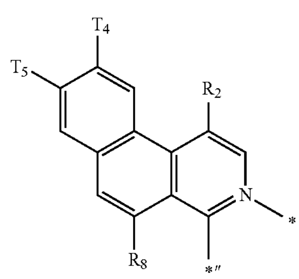
-continued
CY72
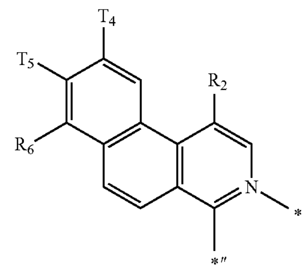
CY73
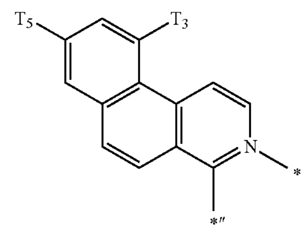
CY74
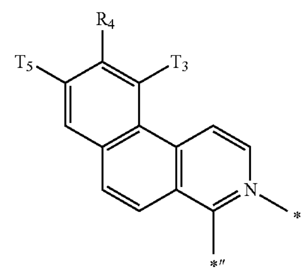
CY75
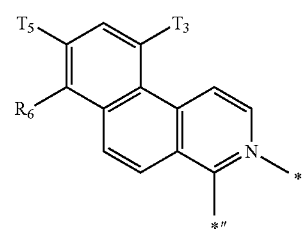
CY76
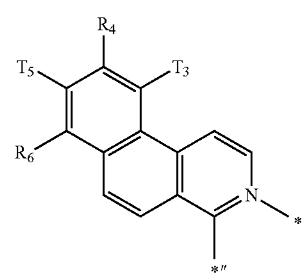
CY77
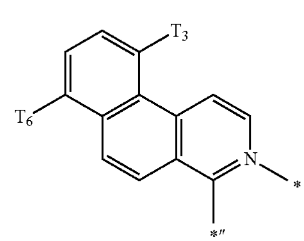

CY78
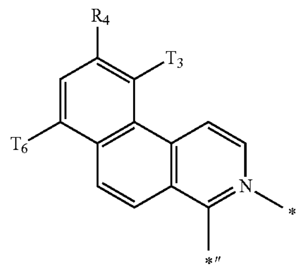
CY79
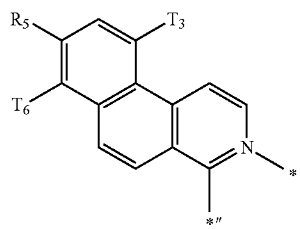
CY80
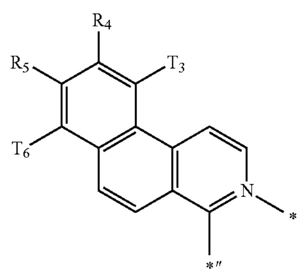
CY81
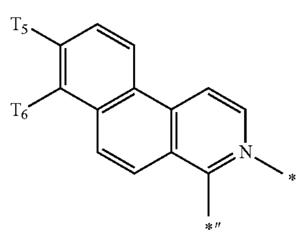
CY82
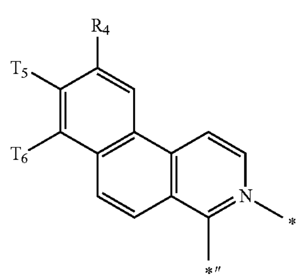
CY83
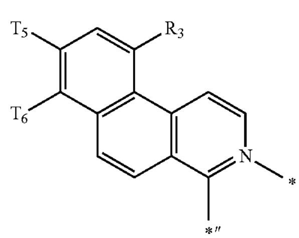
CY84
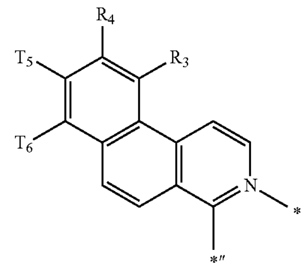
CY85
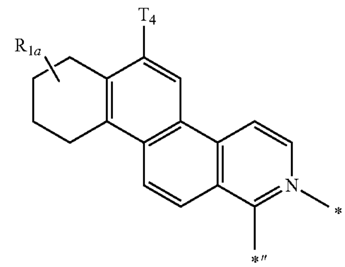
CY86
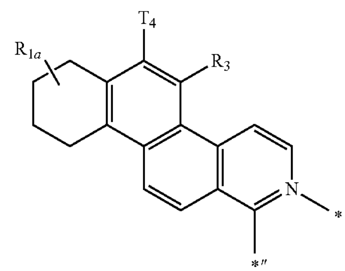
CY87
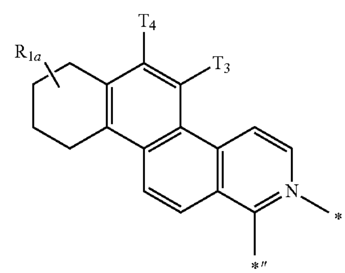
CY88
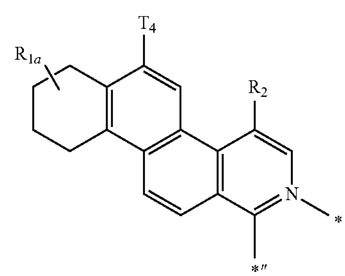
CY89
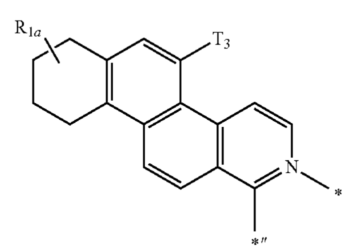

-continued
CY90
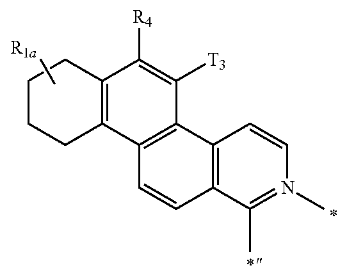
CY91
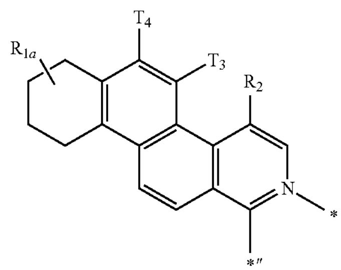
CY92
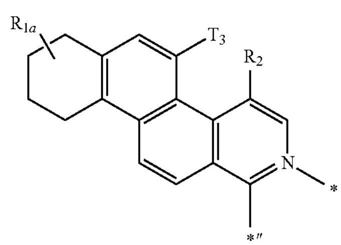
CY93
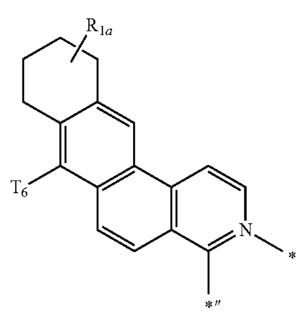
CY94
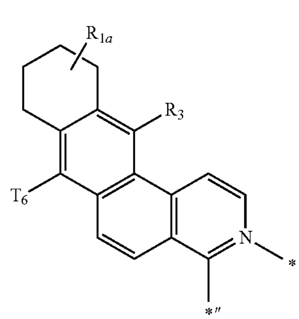
-continued
CY95
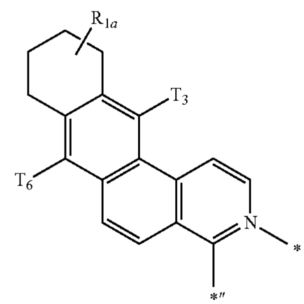
CY96
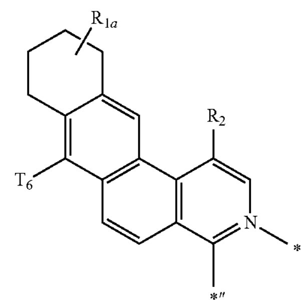
CY97
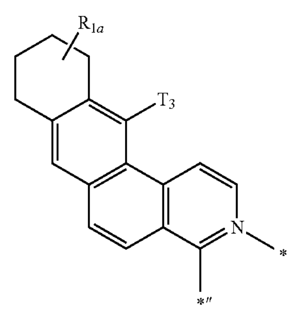
CY98
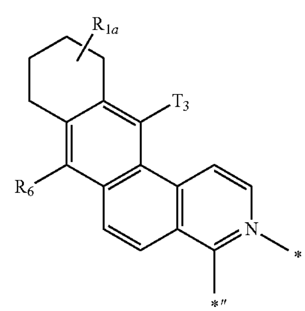
CY99
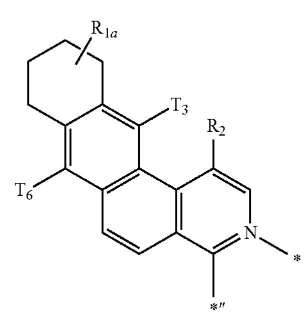

-continued

CY100

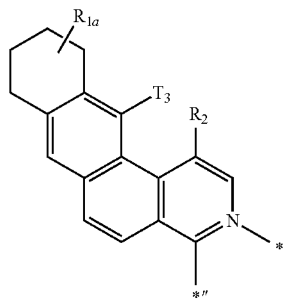

CY101

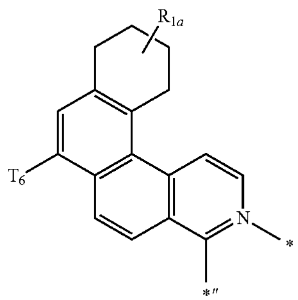

CY102

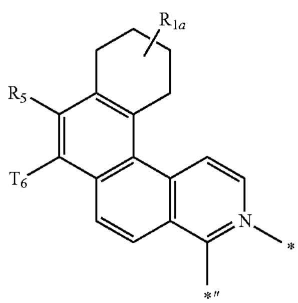

CY103

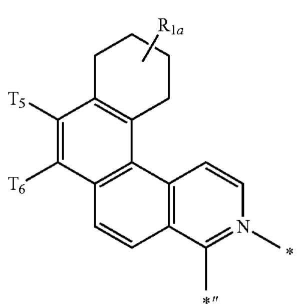

CY104

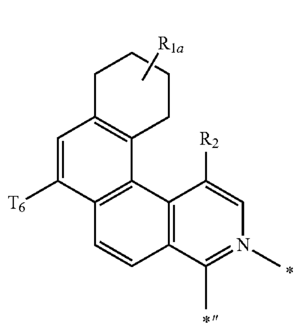

-continued

CY105

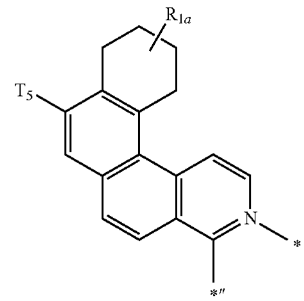

CY106

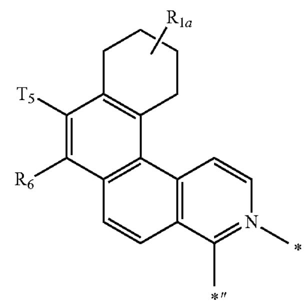

CY107

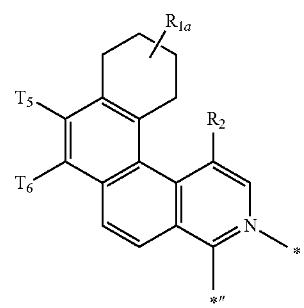

CY108

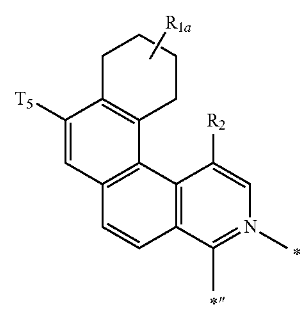

In Formulae CY1 to CY108, $T_2$ to $T_8$ may each independently be:

a fluoro group (—F); or a fluorinated $C_1$-$C_{20}$ alkyl group, a fluorinated $C_3$-$C_{10}$ cycloalkyl group, or a fluorinated $C_2$-$C_{10}$ heterocycloalkyl group, each unsubstituted or substituted with deuterium, a $C_1$-$C_{20}$ alkyl group, a $C_3$-$C_{10}$ cycloalkyl group, a $C_2$-$C_{10}$ heterocycloalkyl group, or any combination thereof;

each of $R_2$ to $R_8$ and $R_{1a}$ are the same as described above, and $R_2$ to $R_8$ may not be hydrogen,

* indicates a binding site to Ir in Formula 1,

*" indicates a binding site to a neighboring atom in Formula 1.

For example, $R_2$ to $R_8$ in Formulae CY1 to CY108 may each independently be:

deuterium; or a $C_1$-$C_{20}$ alkyl group, a $C_3$-$C_{10}$ cycloalkyl group, or a $C_2$-$C_{10}$ heterocycloalkyl group, each unsubstituted or substituted with deuterium, a $C_1$-$C_{20}$ alkyl group, a $C_3$-$C_{10}$ cycloalkyl group, a $C_2$-$C_{10}$ heterocycloalkyl group, or any combination thereof.

In one or more embodiments, the group represented by

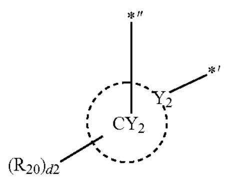

in Formula 1 may be a group represented by one of Formulae A(1) to A(7):

A(1)

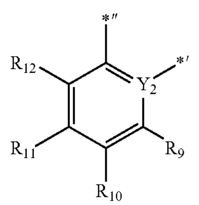

A(2)

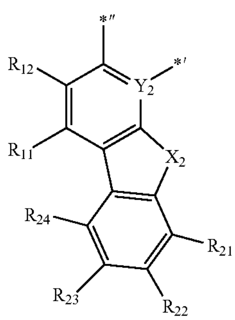

A(3)

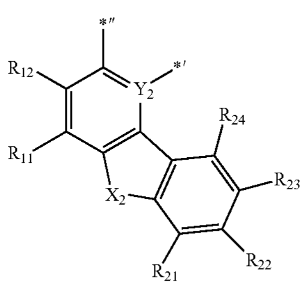

A(4)

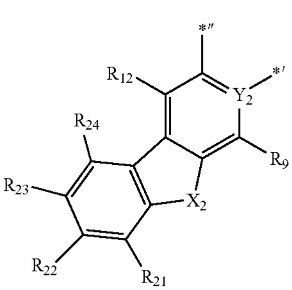

-continued

A(5)

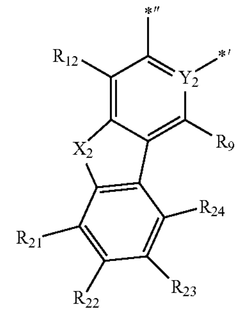

A(6)

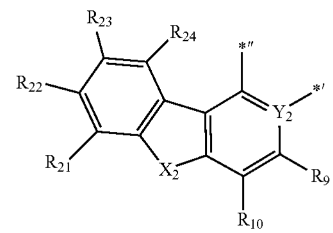

A(7)

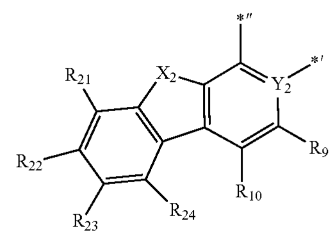

In Formulae A(1) to A(7), $Y_2$ is C, $X_2$ is O, S, $N(R_{25})$, $C(R_{25})(R_{26})$, or $Si(R_{25})(R_{26})$, each of $R_9$ to $R_{12}$ and $R_{21}$ to $R_{26}$ are the same as described in connection with $R_{20}$,

*' indicates a binding site to Ir in Formula 1, and

*" indicates a binding site to a neighboring atom in Formula 1.

For example, $R_9$ and $R_{11}$ in Formula A(1) may each independently be a $C_1$-$C_{20}$ alkyl group, a $C_3$-$C_{10}$ cycloalkyl group, or a $C_2$-$C_{10}$ heterocycloalkyl group, each unsubstituted or substituted with deuterium, a $C_1$-$C_{20}$ alkyl group, a $C_3$-$C_{10}$ cycloalkyl group, a $C_2$-$C_{10}$ heterocycloalkyl group, or any combination thereof.

In one or more embodiments, $R_9$ and $R_{11}$ in Formula A(1) may each independently be a $C_1$-$C_{20}$ alkyl group, unsubstituted or substituted with deuterium, a $C_1$-$C_{20}$ alkyl group, or any combination thereof.

In one or more embodiments, $R_{10}$ and $R_{12}$ in Formula A(1) may each independently be hydrogen or deuterium.

In one or more embodiments, $R_9$ and $R_{11}$ in Formula A(1) may be identical to each other.

In one or more embodiments, $R_9$ and $R_{11}$ in Formula A(1) may be different from each other.

In one or more embodiments, $R_9$ and $R_{11}$ in Formula A(1) may be different from each other, and the number of carbon included in $R_{11}$ may be greater than the number of carbon included in $R_9$.

In one or more embodiments, i) at least one of $R_9$ to $R_{12}$ in Formula A(1), ii) $R_{11}$, $R_{12}$, one of $R_{21}$ to $R_{26}$, or any combination thereof in Formulae A(2) and A(3), iii) $R_9$, $R_{12}$, one of $R_{21}$ to $R_{26}$, or any combination thereof in Formulae A(4) and A(5), and iv) $R_9$, $R_{10}$, one of $R_{21}$ to $R_{26}$, or any combination thereof in Formulae A(6) and A(7), may each independently be a deuterium-containing $C_1$-$C_{20}$ alkyl group, a deuterium-containing $C_3$-$C_{10}$ cycloalkyl group, or a deuterium-containing $C_2$-$C_{10}$ heterocycloalkyl group, each unsubstituted or substituted with a $C_1$-$C_{20}$ alkyl group, a $C_3$-$C_{10}$ cycloalkyl group, a $C_2$-$C_{10}$ heterocycloalkyl group, or any combination thereof.

In one or more embodiments, at least one of $R_9$ and $R_{11}$ in Formula A(1) (for example, $R_9$ and $R_{11}$ in Formula A(1)) may each independently be a deuterium-containing $C_1$-$C_{20}$ alkyl group, a deuterium-containing $C_3$-$C_{10}$ cycloalkyl group, or a deuterium-containing $C_2$-$C_{10}$ heterocycloalkyl group, each unsubstituted or substituted with a $C_1$-$C_{20}$ alkyl group, a $C_3$-$C_{10}$ cycloalkyl group, a $C_2$-$C_{10}$ heterocycloalkyl group, or any combination thereof.

In one or more embodiments, the group represented by

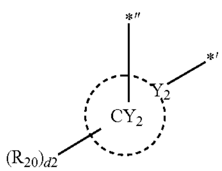

in Formula 1 may be a group represented by Formula A(1) or A(5).

In one or more embodiments, at least one of $A_1$ to $A_6$ in Formula 1 may each independently be a substituted or unsubstituted $C_2$-$C_{60}$ alkyl group, a substituted or unsubstituted $C_3$-$C_{10}$ cycloalkyl group, or a substituted or unsubstituted $C_2$-$C_{10}$ heterocycloalkyl group.

In one or more embodiments, at least one of $A_1$ to $A_3$ and at least one of $A_4$ to $A_6$ in Formula 1 may each independently be a substituted or unsubstituted $C_2$-$C_{60}$ alkyl group, a substituted or unsubstituted $C_3$-$C_{10}$ cycloalkyl group, or a substituted or unsubstituted $C_2$-$C_{10}$ heterocycloalkyl group.

In one or more embodiments, the number of carbons included in the group represented by *—$C(A_1)(A_2)(A_3)$ in Formula 1 may be 5 or more, and/or the number of carbons included in the group represented by *—$C(A_4)(A_5)(A_6)$ in Formula 1 may be 5 or more.

In one or more embodiments, $A_1$, $A_2$, and $A_3$ of the group represented by *—$C(A_1)(A_2)(A_3)$ in Formula 1 may be linked to each other to form a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$. That is, the group represented by *—$C(A_1)(A_2)(A_3)$ in Formula 1 may be a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$ (for example, an adamantane group, a norbornene group, a bicyclo[1.1.1]pentane group, a bicyclo[2.1.1]hexane group, a bicyclo[2.2.1]heptane group (a norbornane group), a bicyclo[2.2.2]octane group, a cyclopentane group, a cyclohexane group, or a cyclohexene group, each unsubstituted or substituted with at least one $R_{1a}$).

In one or more embodiments, $A_4$, $A_5$, and $A_6$ of the group represented by *—$C(A_4)(A_5)(A_6)$ in Formula 1 may be linked to each other to form a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$. That is, the group represented by *—$C(A_4)(A_5)(A_6)$ in Formula 1 may be a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$ (for example, an adamantane group, a norbornene group, a bicyclo[1.1.1]pentane group, a bicyclo[2.1.1]hexane group, a bicyclo[2.2.1]heptane group (a norbornane group), a bicyclo[2.2.2]octane group, a cyclopentane group, a cyclohexane group, or a cyclohexene group, each unsubstituted or substituted with at least one $R_{1a}$).

In one or more embodiments, $A_1$, $A_2$, and $A_3$ in Formula 1 may each independently be a substituted or unsubstituted $C_1$ alkyl group (a substituted or unsubstituted methyl group).

In one or more embodiments, $A_1$, $A_2$, and $A_3$ in Formula 1 may each independently be a $C_1$ alkyl group unsubstituted or substituted with deuterium, —F, a $C_3$-$C_{10}$ cycloalkyl group, a $C_2$-$C_{10}$ heterocycloalkyl group, or any combination thereof.

For example, the organometallic compound may be at least one of Compounds 1 to 16 below, but embodiments of the present disclosure are not limited thereto.

1

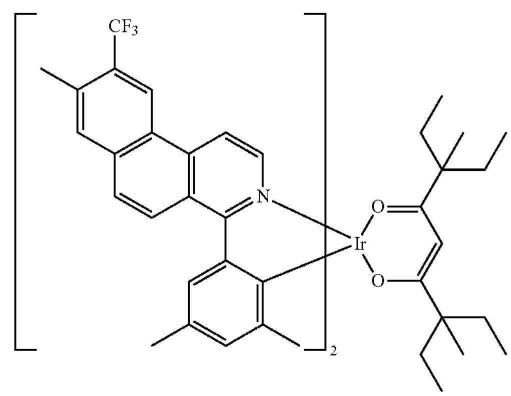

2

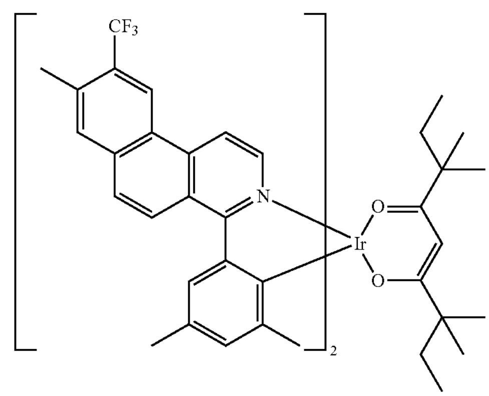

3

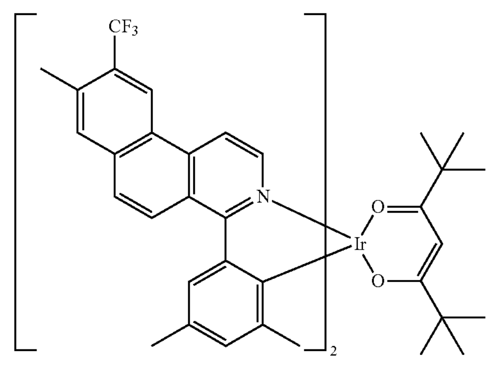

-continued
4
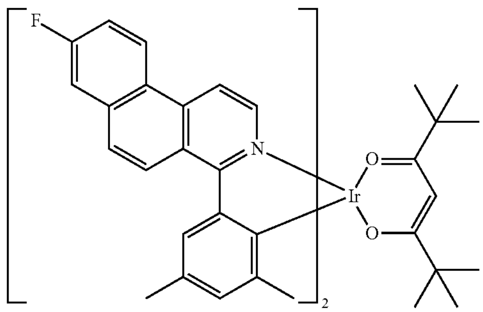
5
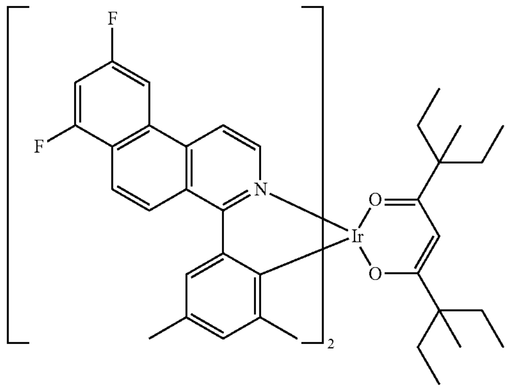
6
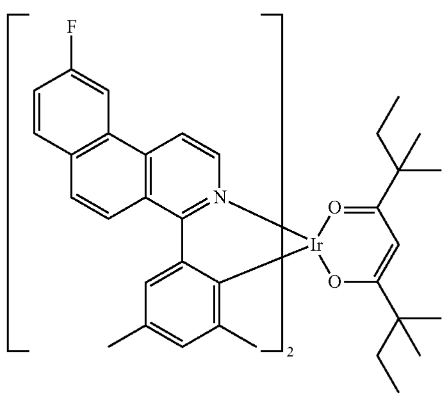
7
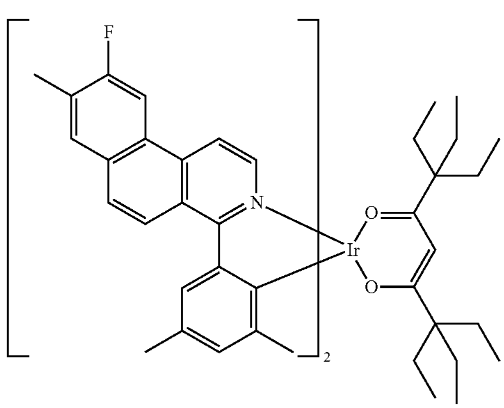
-continued
8
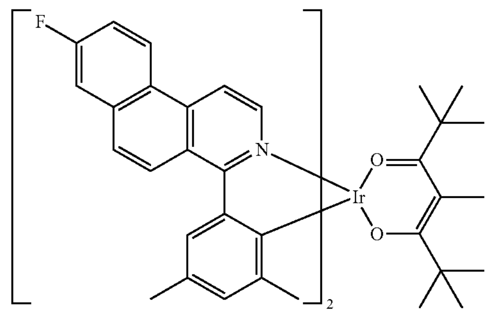
9
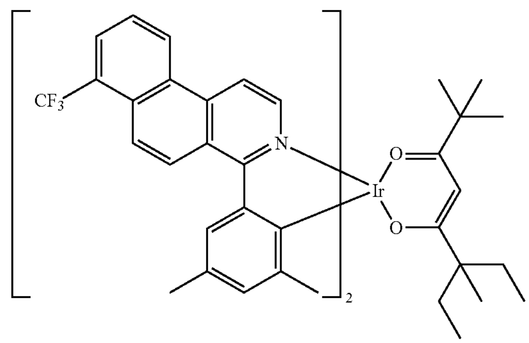
10
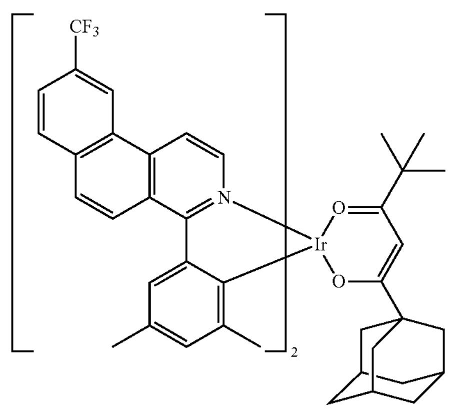
11
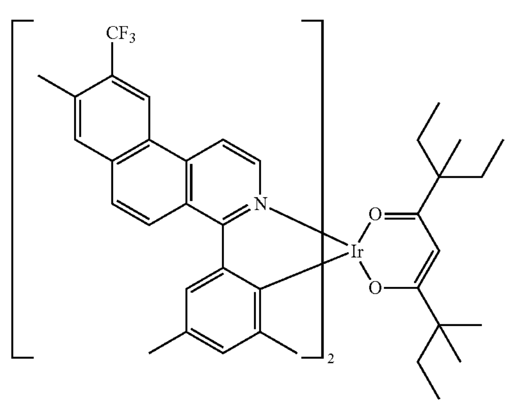

-continued

12

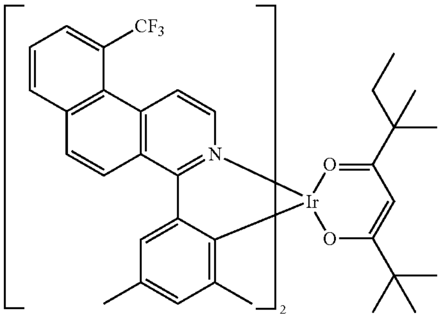

13

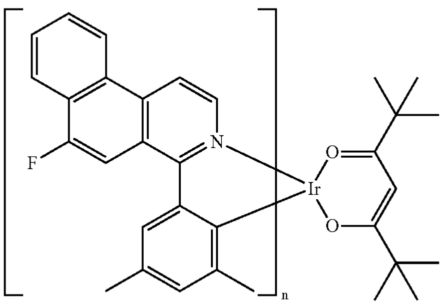

14

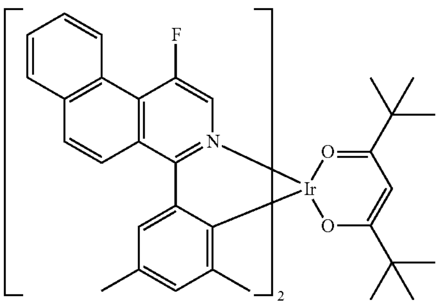

15

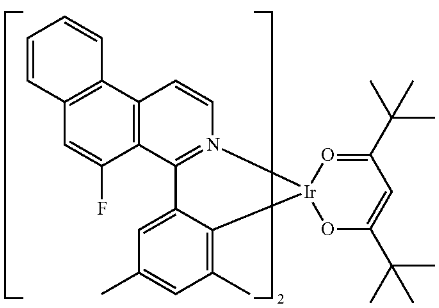

16

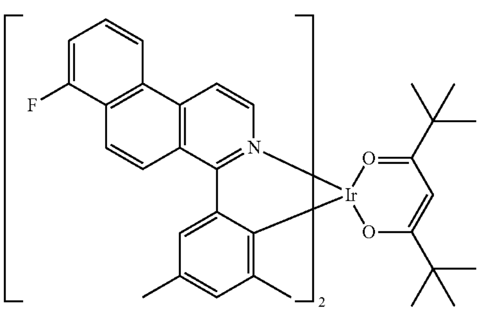

In an organometallic compound represented by Formula 1, 1) ring $CY_1$ (see Formula 1') is, as illustrated in Formula 1, a condensed cyclic group in which two benzene groups are condensed with one pyridine group, and 2) at least one of $R_1$ to $R_8$, $R_{20}$, or any combination thereof includes at least one a fluoro group (—F). Accordingly, the transition dipole moment of the organometallic compounds may be increased, and the conjugation length of the organometallic compounds is relatively increased and structural rigidity thereof is increased, leading to a decrease in non-radiative transition. Thus, an electronic device, for example, an organic light-emitting device, including the organometallic compound represented by Formula 1 may have high quantum efficiency (EQE), and thus, may have high luminescence efficiency.

Formula 1'

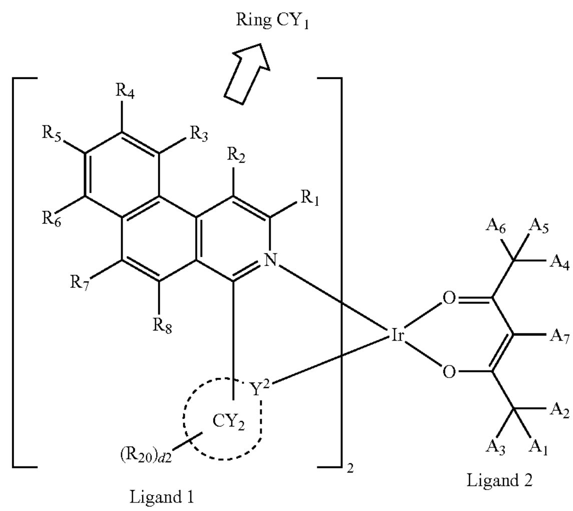

In one or more embodiments, $A_1$ to $A_6$ in Formula 1 may each independently be a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group. That is, $A_1$ to $A_6$ in Formula 1 may each have one or more carbons.

Although not wishing to be bound to a particular theory, an α-proton has chemical reactivity that is about $10^5$ greater than that of a β-proton. That is, the α-proton may cause a side reaction due to production of intermediates in various forms during synthesis and/or storage of a compound. However, carbons bound to each $A_1$ to $A_6$ in Formula 1 as described above may not include the α-proton, and in this regard, the organometallic compound represented by Formula 1 may have a stable chemical structure with minimal occurrence of a side reaction before/after synthesis, and at the same time, an intermolecular interaction of the organometallic compound may be minimized during the operation of an electronic device (for example, an organic light-emitting device) including the organometallic compound.

Furthermore, Formula 1 has Ligand 2 being bulky and having a strong electron donating capability and thus, an interaction between Ligand 1 and Ligand 2 in Formula 1 may be enhanced. Thus, the organometallic compound represented by Formula 1 may have improved structural rigidity, a full width at half maximum (FWHM) in the photoluminescent spectrum or electroluminescent spectrum of the organometallic compound represented by Formula 1 may be reduced, and a vibronic state of the organometallic compound represented by Formula 1 may be reduced. Accordingly a non-radiative decay of the organometallic compound represented by Formula 1 can be reduced and thus an electronic device, for example, an organic light-emitting device, including the organometallic compound represented by Formula 1 may have high luminescence efficiency and long lifespan.

The highest occupied molecular orbital (HOMO) energy level, lowest unoccupied molecular orbital (LUMO) energy level, and $T_1$ energy level of Compounds 1 to 16, which are encompassed by the organometallic compound represented by Formula 1, were evaluated by using Gaussian 09 that performs molecular structure optimizations according to density functional theory (DFT) at a degree of B3LYP. The results thereof are shown in Table 1.

TABLE 1

| Compound No. | HOMO (eV) | LUMO (eV) | $T_1$ (eV) |
|---|---|---|---|
| 1 | −4.798 | −1.951 | 1.988 |
| 2 | −4.792 | −1.948 | 1.987 |
| 3 | −4.791 | −1.946 | 1.985 |
| 4 | −4.678 | −1.732 | 2.049 |
| 5 | −4.682 | −1.785 | 2.019 |
| 6 | −4.677 | −1.781 | 2.021 |
| 7 | −4.610 | −1.688 | 2.038 |
| 8 | −4.804 | −1.987 | 1.975 |
| 9 | −4.764 | −1.895 | 1.995 |
| 10 | −4.798 | −1.951 | 1.988 |
| 11 | −4.736 | −1.875 | 2.001 |
| 12 | −4.673 | −1.856 | 2.002 |
| 13 | −4.647 | −1.771 | 2.007 |
| 14 | −4.678 | −1.712 | 2.069 |
| 15 | −4.594 | −1.732 | 1.951 |
| 16 | −4.674 | −1.775 | 2.019 |

In one or more embodiments, when $R_{20}$ in the organometallic compound represented by Formula 1 includes neither a fluoro group (—F) nor a cyano group, the organometallic compound represented by Formula 1 may emit light having high color purity (for example, light having a relatively narrow full width at half maximum (FWHM) in the photoluminescent spectrum or electroluminescent spectrum).

In one or more embodiments, the FWHM of the emission peak of the photoluminescent spectrum or electroluminescent spectrum of the organometallic compound may be 64 nm or less. For example, the FWHM of the emission peak of the photoluminescent spectrum or electroluminescent spectrum of the organometallic compound may be from about 45 nm to about 64 nm, about 45 nm to about 59 nm, about 49 nm to about 55 nm or about 50 nm to about 55 nm.

In one or more embodiments, the maximum emission wavelength (emission peak wavelength, $\lambda_{max}$) of the emission peak of the photoluminescent spectrum or electroluminescent spectrum of the organometallic compound may be from about 615 nm to about 640 nm. In one or more embodiments, the maximum emission wavelength (emission peak wavelength, $\lambda_{max}$) of the emission peak of the photoluminescent spectrum or electroluminescent spectrum of the organometallic compound may be from about 615 nm to about 630 nm or about 620 nm to about 630 nm.

In one or more embodiments, the highest occupied molecular orbital (HOMO) energy level of the organometallic compound represented by Formula 1 may be in the range of −5.300 eV to −5.050 eV, for example, −5.200 eV to −5.100 eV. The HOMO energy level may be evaluated by a cyclic voltammetry. For example, the HOMO energy level may be evaluated in accordance to a method described in Table 2 described hereinafter.

In one or more embodiments, the lowest unoccupied molecular orbital (LUMO) energy level of the organometallic compound represented by Formula 1 may be in the range of −2.900 eV to −2.300 eV, for example, −2.700 eV to −2.300 eV. The LUMO energy level may be evaluated by using an UV absorption spectrum. For example, the LUMO energy level may be evaluated in accordance to a method described in Table 2 described hereinafter.

In one or more embodiments, the photoluminescence quantum yield of the organometallic compound represented by Formula 1 in film may be from about 91% to about 100%. For example, the PLQY of the organometallic compound in a film may be from about 92% to about 100%, from about 93% to about 100%, from about 94% to about 100%, from about 95% to about 100%, from about 96% to about 100%, from about 97% to about 100%, from about 98% to about 100%, or from about 99% to about 100%, or about 100%. For example, the PLQY in film may be evaluated in accordance with Evaluation 2 described hereinafter.

In one or more embodiments, a decay time of the organometallic compound represented by Formula 1 may be 0.9 μs and less, for example, in the range of 0.6 μs to 0.8 μs. The decay time may be evaluated from Time-resolved photoluminescence (TRPL) of the organometallic compound represented by Formula 1. For example, the decay time may be evaluated in accordance with Evaluation 3 described hereinafter.

In one or more embodiments, the horizontal orientation ratio of the transition dipole moment of the organometallic compound represented by Formula 1 may be from about 90% to about 100%.

For example, the horizontal orientation ratio of the transition dipole moment of the organometallic compound may be, for example, from about 90% to about 100%, from about 91% to about 100%, from about 92% to about 100%, from about 93% to about 100%, from about 94% to about 100%, from about 95% to about 100%, from about 96% to about 100%, from about 97% to about 100%, from about 98% to about 100%, from about 99% to about 100%, or about 100%.

The horizontal orientation ratio of the transition dipole moment may be evaluated by using an angle-dependent photoluminescence (PL) measurement apparatus. The angle-dependent PL measurement apparatus may be understood by referring to, for example, the description of the angle-dependent PL measurement apparatus disclosed in Korean application No. 2013-0150834. Korean application No. 2013-0150834 is incorporated herein.

As described above, since the horizontal orientation ratio of the transition dipole moment of the organometallic compound is high, when an organic light-emitting device including the organometallic compound is driven, an electric field may be emitted in a substantially parallel to a film including the organometallic compound, and thus, optical loss caused by a waveguide mode and/or a surface plasmon polariton mode may be reduced. An external extraction efficiency of the electronic device emitting light (that is, an efficiency of light extracted to the outside from the electronic device (for example, an organic light-emitting device) including a film including the organometallic compound (for example, an emission layer to be described)) by such a mechanism may be present. Accordingly, an electronic device, for example, an organic light-emitting device, including the organometallic compound may have high luminescence efficiency.

Synthesis methods of the organometallic compound represented by Formula 1 may be understood by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes: a first electrode; a second electrode; and an organic layer disposed between the first electrode and the second electrode and including an emission layer, and the organic layer includes at least one organometallic compounds represented by Formula 1.

Since the organic light-emitting device includes an organic layer including the organometallic compound represented by Formula 1 described above, excellent characteristics may be obtained in terms of the driving voltage, the external quantum efficiency, a roll-off ratio, a lifespan and a relatively narrow FWHM of an electroluminescence (EL) spectrum emission peak.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 in the emission layer is smaller than an amount of the host).

In one or more embodiments, the emission layer may emit red light.

The expression "(an organic layer) includes at least one organometallic compounds" used herein may include a case in which "(an organic layer) includes identical organometallic compounds represented by Formula 1" and a case in which "(an organic layer) includes two or more different organometallic compounds represented by Formula 1."

For example, the organic layer may include, as the organometallic compound, only Compound 1. In this regard, Compound 1 may exist in an emission layer of the organic light-emitting device. In one or more embodiments, the organic layer may include, as the organometallic compound, Compound 1 and Compound 2. In this regard, Compound 1 and Compound 2 may exist in an identical layer (for example, Compound 1 and Compound 2 all may exist in an emission layer).

The first electrode may be an anode, which is a hole injection electrode, and the second electrode may be a cathode, which is an electron injection electrode, or the first electrode may be a cathode, which is an electron injection electrode, and the second electrode may be an anode, which is a hole injection electrode.

In one or more embodiments, in the organic light-emitting device, the first electrode is an anode, and the second electrode is a cathode, and the organic layer further includes a hole transport region between the first electrode and the emission layer and an electron transport region between the emission layer and the second electrode, and the hole transport region includes a hole injection layer, a hole transport layer, an electron blocking layer, or any combination thereof, and the electron transport region includes a hole blocking layer, an electron transport layer, an electron injection layer, or any combination thereof.

The term "organic layer" used herein refers to a single layer and/or a plurality of layers between the first electrode and the second electrode of the organic light-emitting device. The "organic layer" may include, in addition to an organic compound, an organometallic complex including metal.

FIGURE a schematic view of an organic light-emitting device 10 according to one embodiment. Hereinafter, the structure of an organic light-emitting device according to an embodiment and a method of manufacturing an organic light-emitting device according to an embodiment will be described in connection with FIGURE. The organic light-emitting device 10 includes a first electrode 11, an organic layer 15, and a second electrode 19, which are sequentially stacked.

A substrate may be additionally located under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may include a material with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO.

The organic layer 15 is located on the first electrode 11.

The organic layer 15 may include a hole transport region, an emission layer, and an electron transport region.

The hole transport region may be between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

When the hole transport region includes a hole injection layer (HIL), the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100 to about 500° C., a vacuum pressure of about $10^{-8}$ torr to about $10^{-3}$ torr, and a deposition rate of about 0.01 Å/sec to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or any combination thereof:

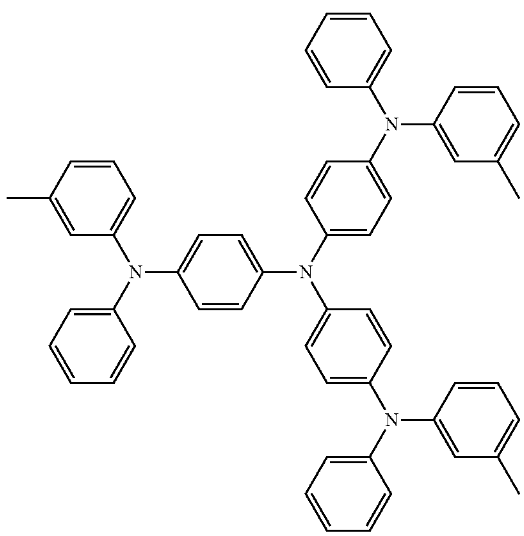

m-MTDATA

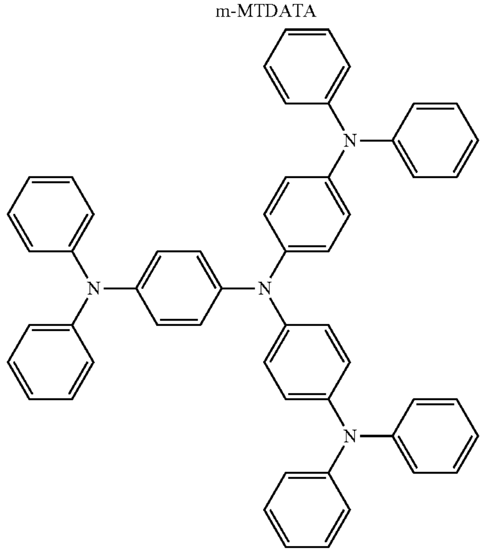

TDATA

-continued

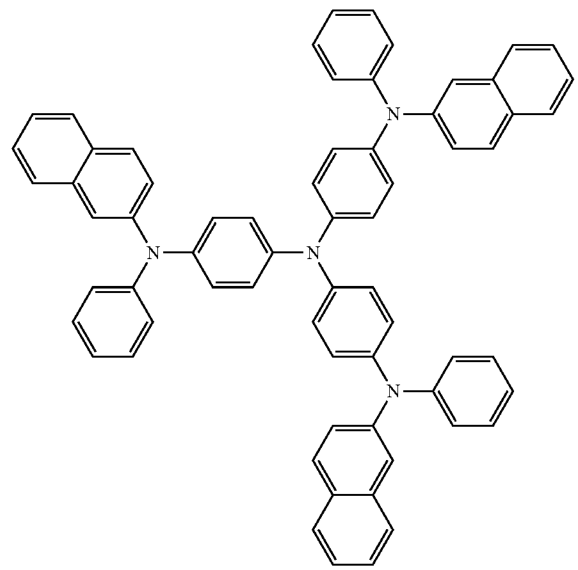

2-TNATA

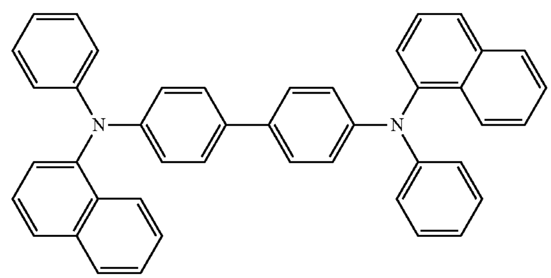

NPB

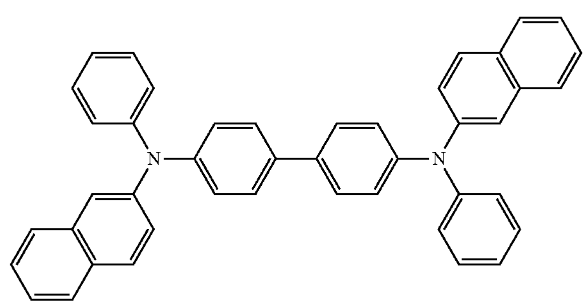

β-NPB

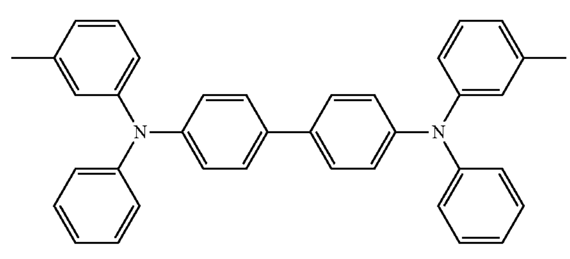

TPD

-continued

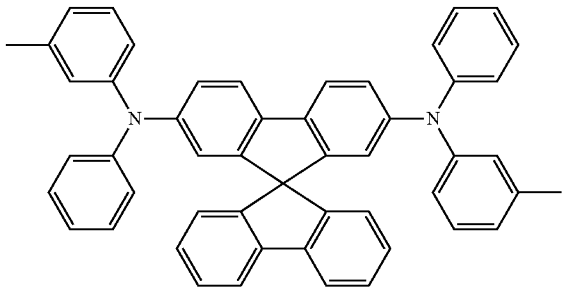

Spiro-TPD

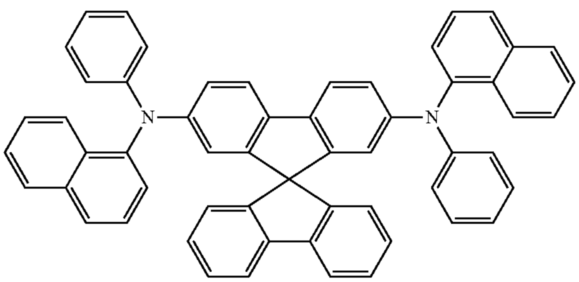

Spiro-NPB

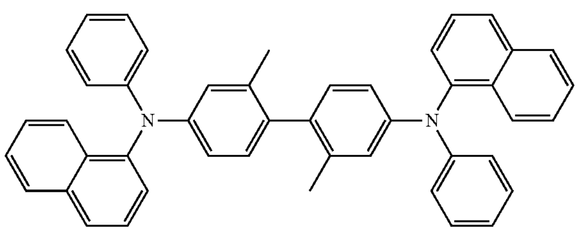

methylated NPB

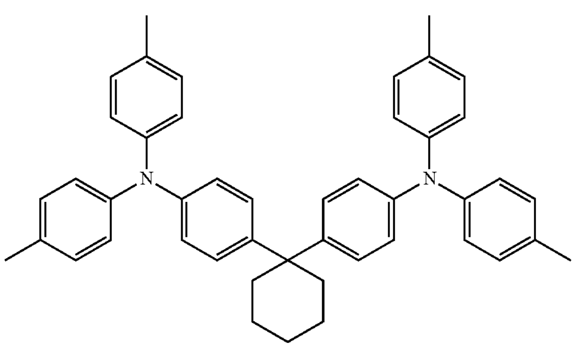

TAPC

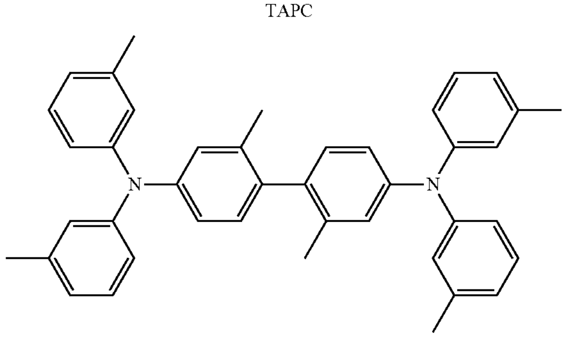

HMTPD

-continued

Formula 201

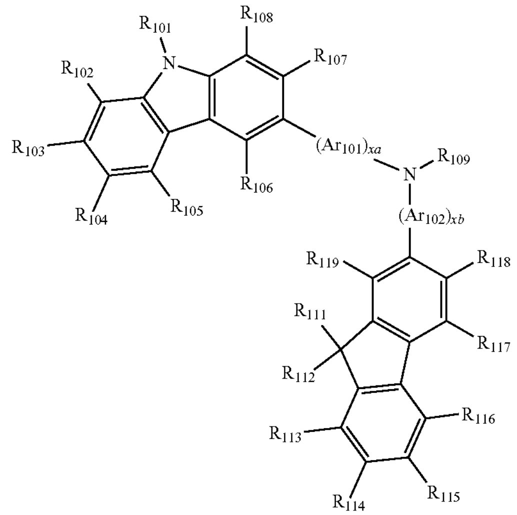

Formula 202

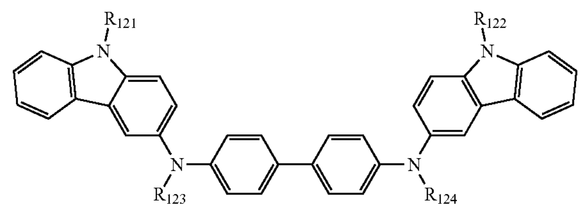

$Ar_{101}$ and $Ar_{102}$ in Formula 201 may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_2$-$C_{10}$ heterocycloalkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

The designations xa and xb in Formula 201 may each independently be an integer from 0 to 5, or 0, 1 or 2. For example, xa may be 1 and xb may be 0, but xa and xb are not limited thereto.

$R_{101}$ to $R_{108}$, $R_{111}$ to $R_{119}$ and $R_{121}$ to $R_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group (for example, a methyl group, an ethyl group, a propyl group, a butyl group, a pentyl group, or a hexyl group), or a $C_1$-$C_{10}$ alkoxy group (for example, a methoxy group, an ethoxy group, a propoxy group, a butoxy group, or a pentoxy group);

a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or any combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, or any combination thereof.

$R_{109}$ in Formula 201 may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In one or more embodiments, the compound represented by Formula 201 may be represented by Formula 201A:

Formula 201A

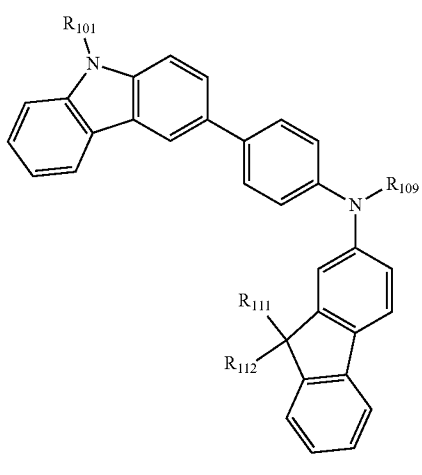

$R_{101}$, $R_{111}$, $R_{112}$, and $R_{109}$ in Formula 201A may be understood by referring to the description provided herein.

For example, the hole transport region may include one of Compounds HT1 to HT21 or any combination thereof:

HT1

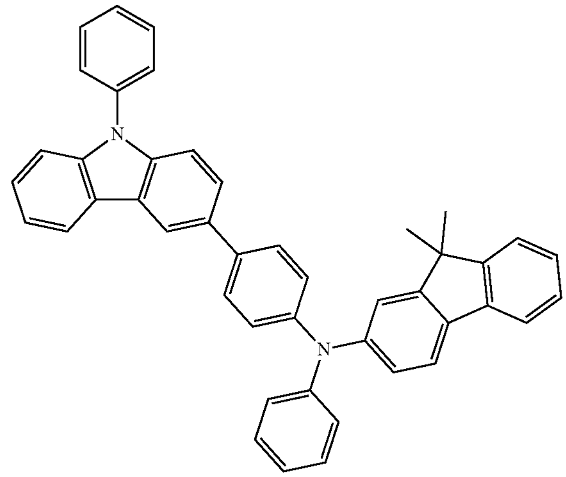

HT2

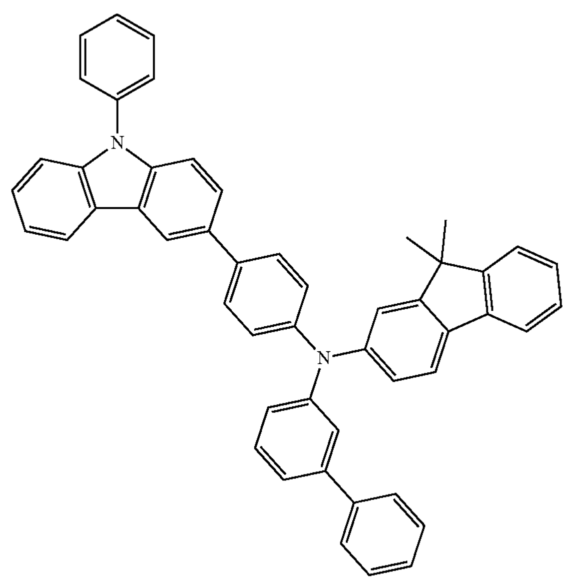

-continued
HT3
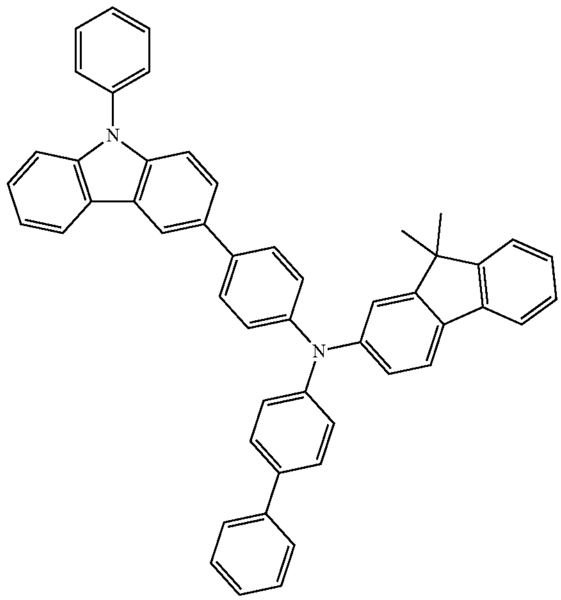
HT4
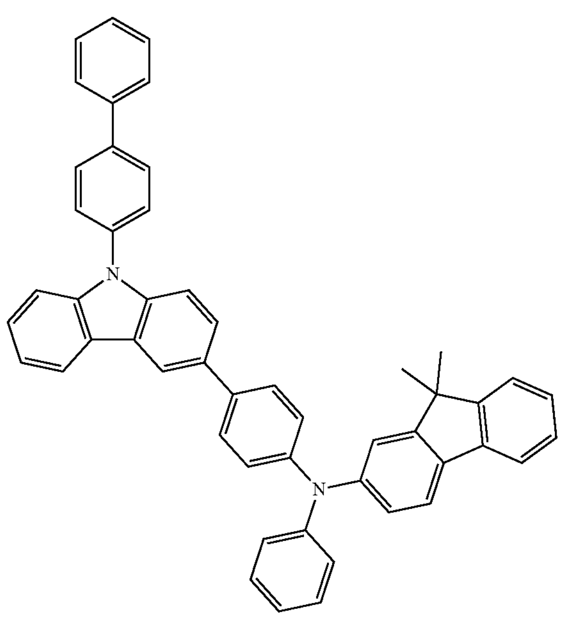
-continued
HT5
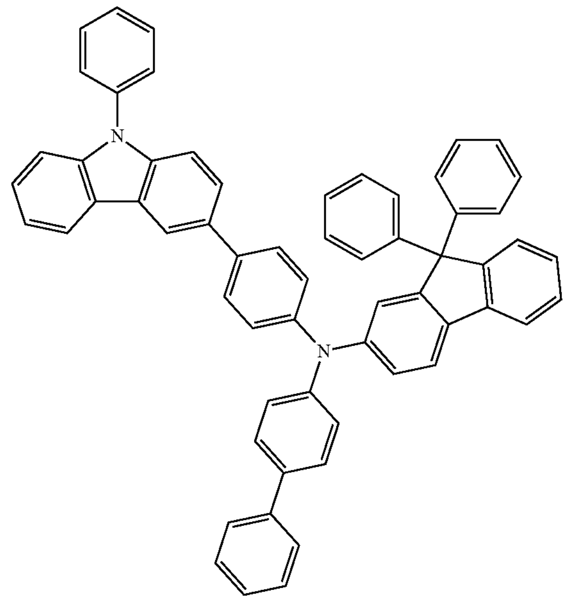
HT6
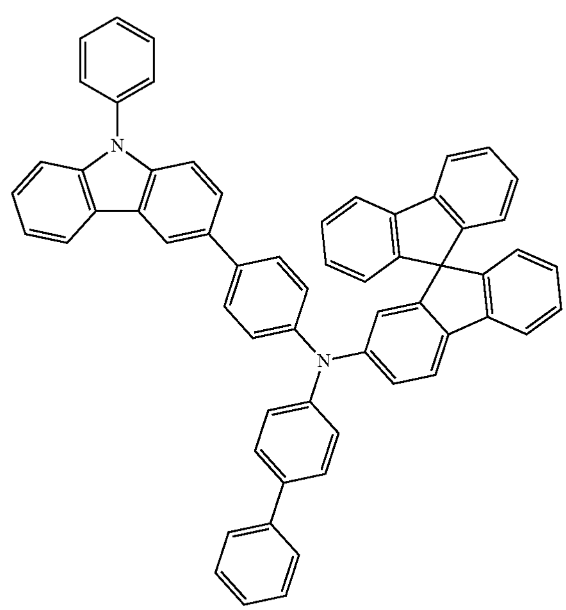

HT7
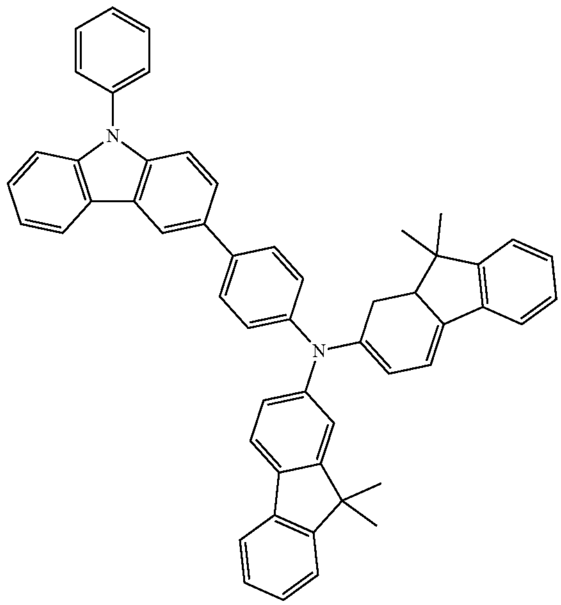
HT8
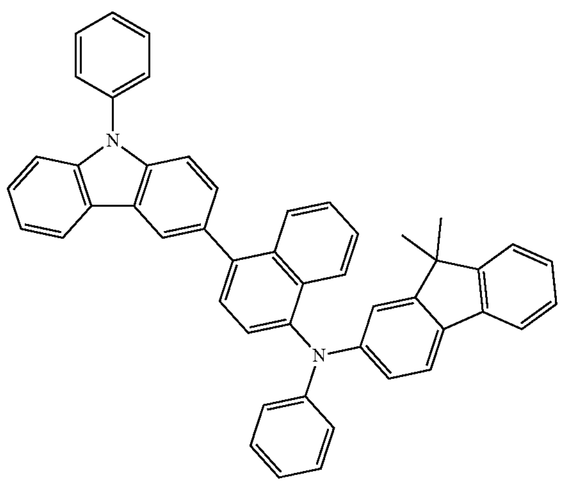
HT9
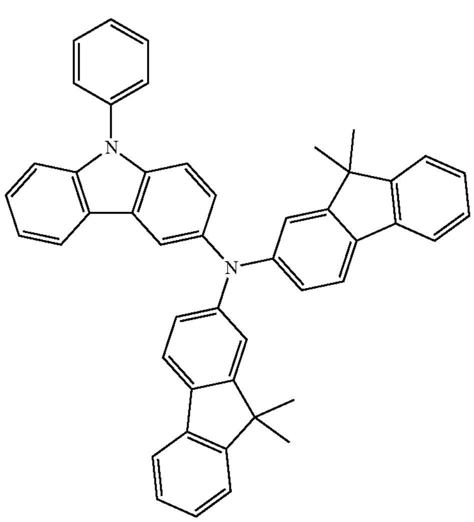
HT10
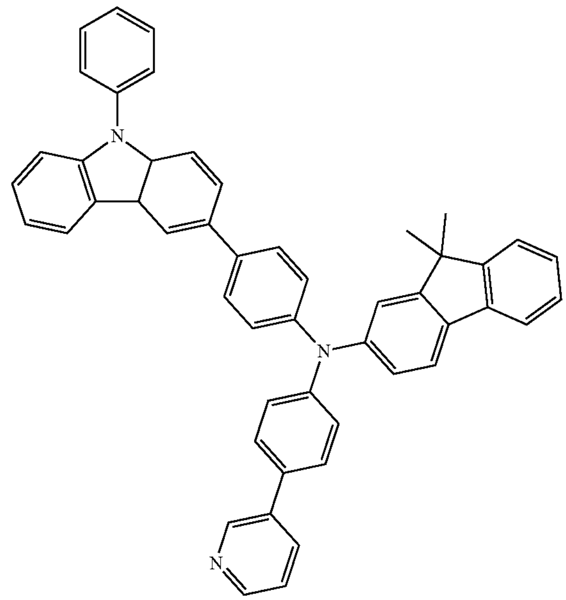
HT11
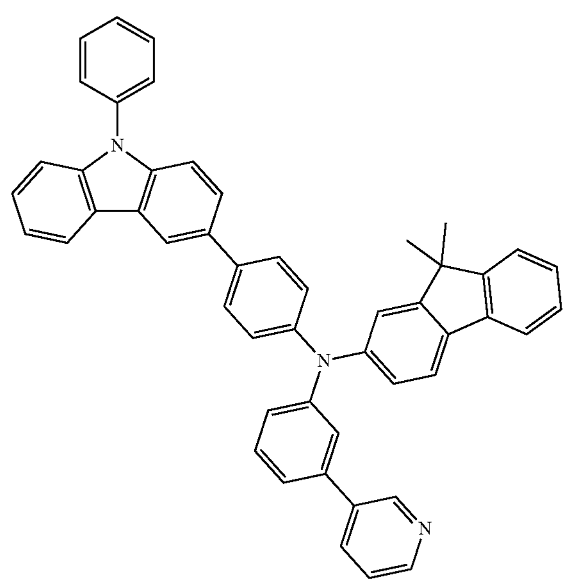

HT12
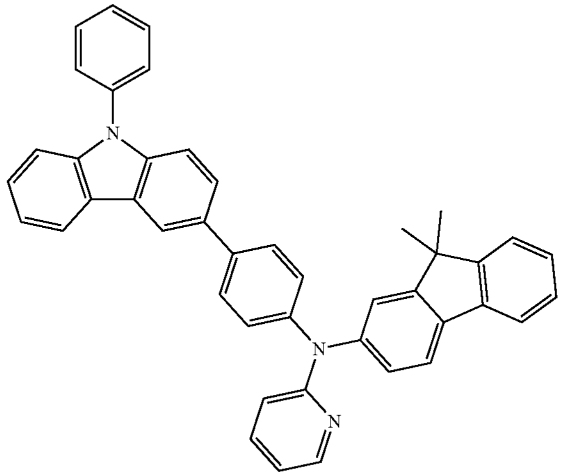
HT13
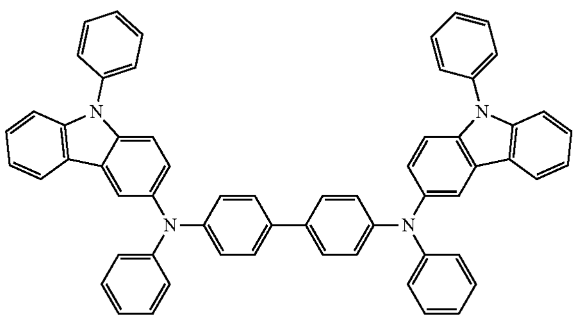
HT14
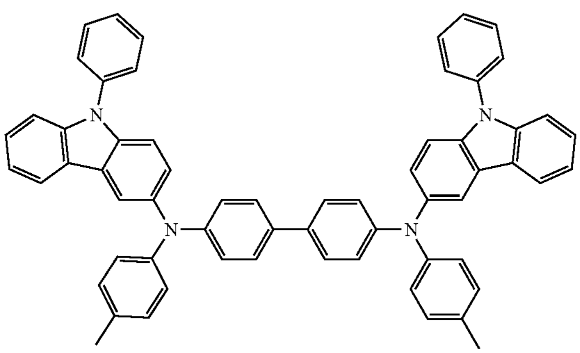
HT15
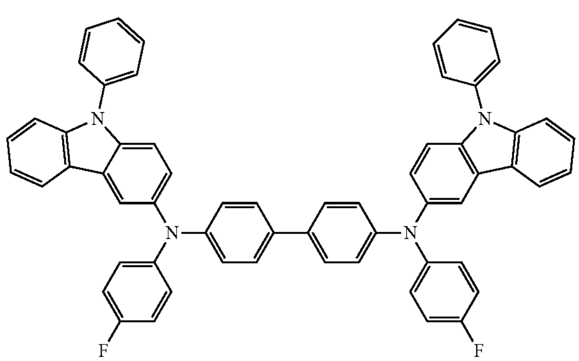
HT16
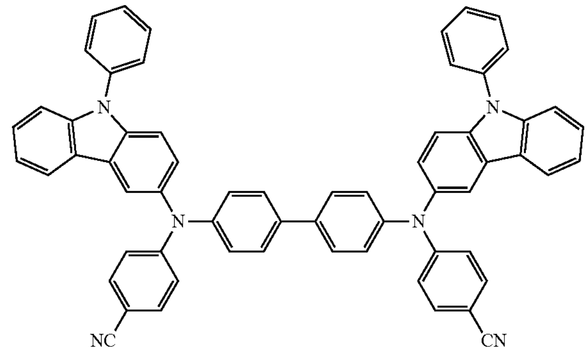
HT17
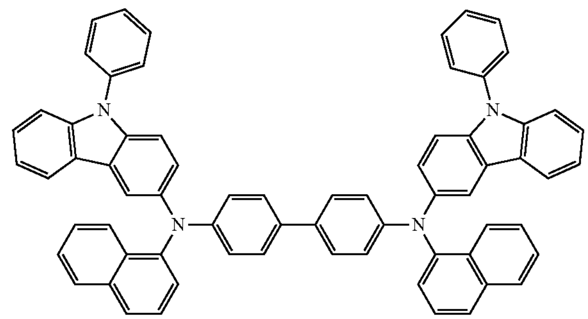
HT18
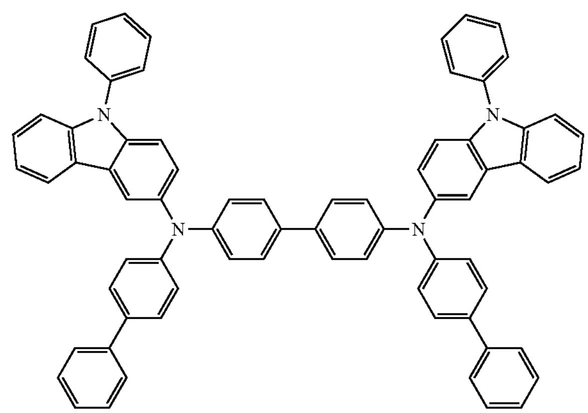
HT19
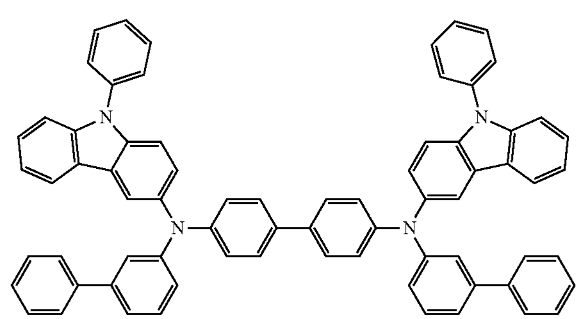

-continued

HT20

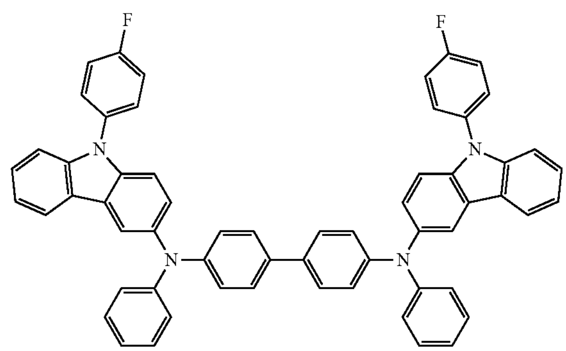

HT21

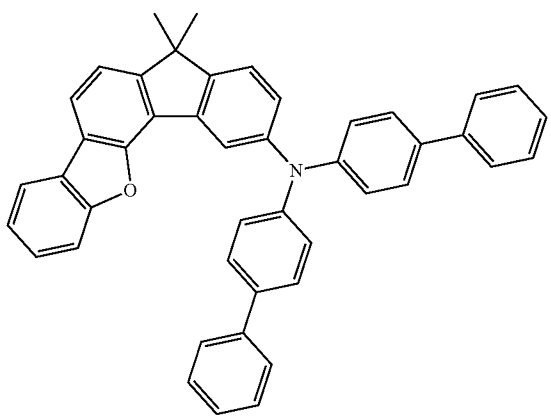

HT-D1

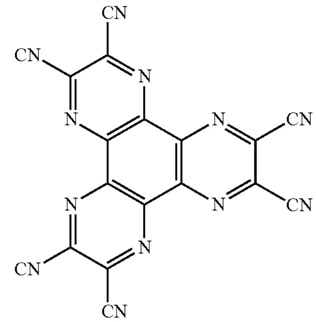

F4-TCNQ

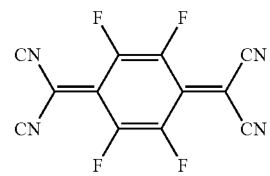

F6-TCNNQ

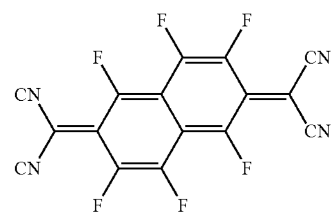

The thickness of the hole transport region may be in a range of about 100 Å to about 10,000 Å, for example, about 100 Å to about 1,000 Å. When the hole transport region includes a hole injection layer, a hole transport layer, an electron blocking layer, or any combination thereof, the thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be a quinone derivative, a metal oxide, a cyano group-containing compound, or any combination thereof, but embodiments of the present disclosure are not limited thereto. Examples of the p-dopant are a quinone derivative, such as tetracyanoquinodimethane (TCNQ), 2,3,5,6-tetrafluoro-tetracyano-1,4-benzoquinone dimethane (F4-TCNQ), or F6-TCNNQ; a metal oxide, such as a tungsten oxide or a molybdenum oxide; a cyano group-containing compound, such as Compound HT-D1 below; or any combination thereof.

The hole transport region may include a buffer layer.

Also, the buffer layer may compensate for an optical resonance distance according to a wavelength of light emitted from the emission layer, and thus, efficiency of a formed organic light-emitting device may be improved.

Meanwhile, when the hole transport region includes an electron blocking layer, a material for the electron blocking layer may be a material for the hole transport region described above, a material for a host to be explained later, or any combination thereof.

For example, when the hole transport region includes an electron blocking layer, a material for the electron blocking layer may be mCP, which will be explained later, Compound H21, or any combination thereof.

Then, an emission layer (EML) may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the hole transport layer.

The emission layer may include a host and a dopant, and the dopant may include an organometallic compound represented by Formula 1 described herein.

The host may include TPBi, TBADN, ADN (also referred to as "DNA"), CBP, CDBP, TCP, mCP, Compound H50, Compound H51, Compound 52, or any combination thereof -continued
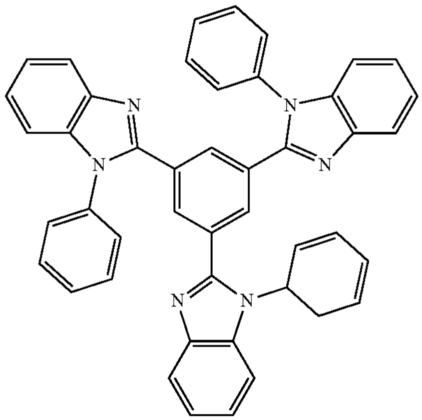
TPBi
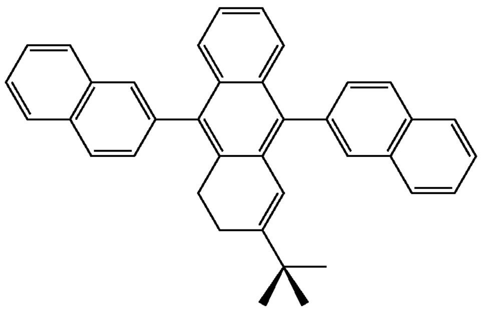
TBADN
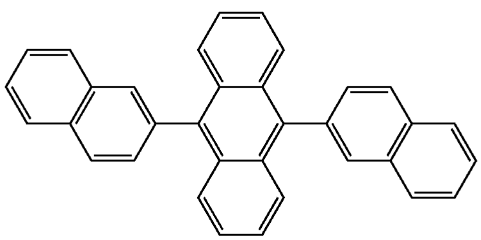
ADN
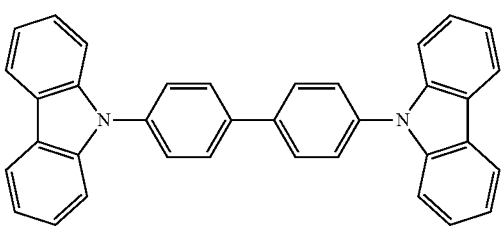
CBP
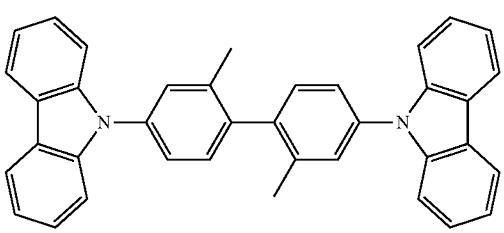
CDBP
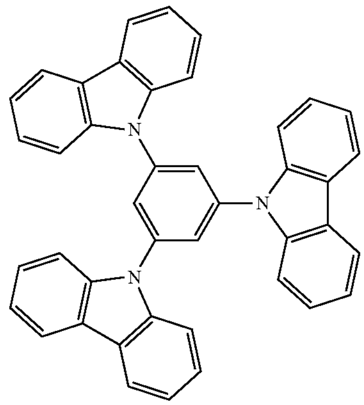
TCP
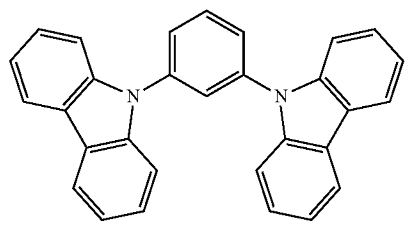
mCP
H50
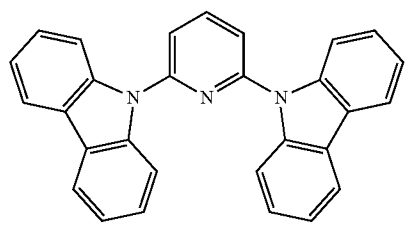
H51
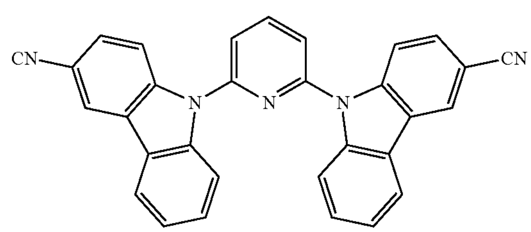

-continued

H52

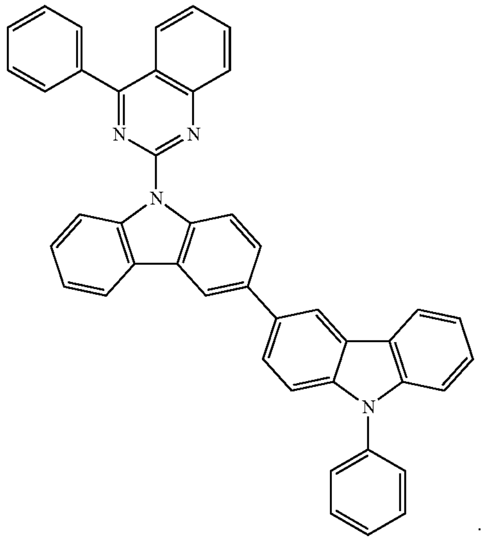

When the organic light-emitting device is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be located on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq.

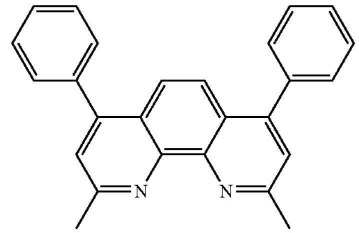

BCP

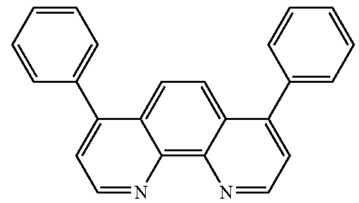

Bphen

In one or more embodiments, the hole blocking layer may include the host, a material for forming an electron transport layer to be described later, a material for forming an electron injection layer to be described later, or any combination thereof.

The thickness of the hole blocking layer may be in a range of about 20 Å to about 1,000 Å, for example, about 30 Å to about 600 Å. When the thickness of the hole blocking layer is within these ranges, the hole blocking layer may have excellent hole blocking characteristics without a substantial increase in driving voltage.

The electron transport layer may include BCP, Bphen, TPBi, $Alq_3$, Balq, TAZ, NTAZ, or any combination thereof:

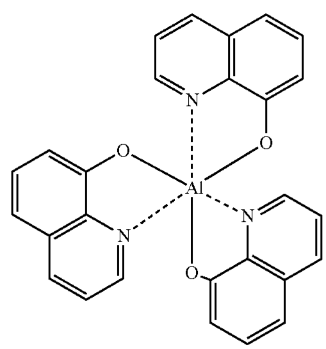

$Alq_3$

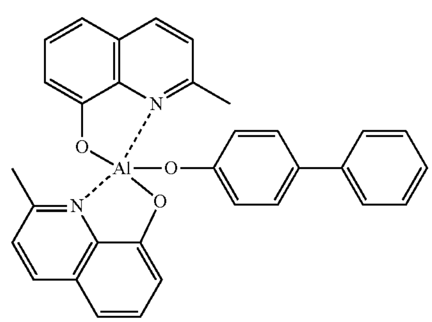

BAlq

-continued
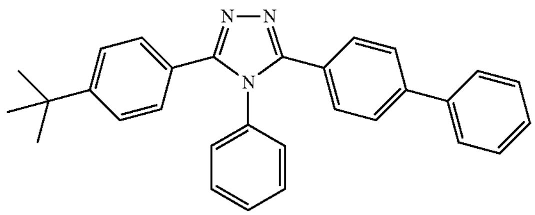
TAZ
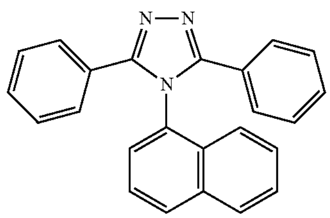
NTAZ
In one or more embodiments, the electron transport layer may include one of Compounds ET1 to ET25 or any combination thereof:
ET1
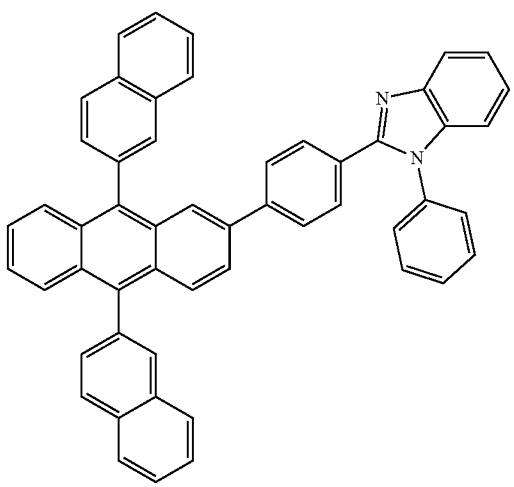
ET2
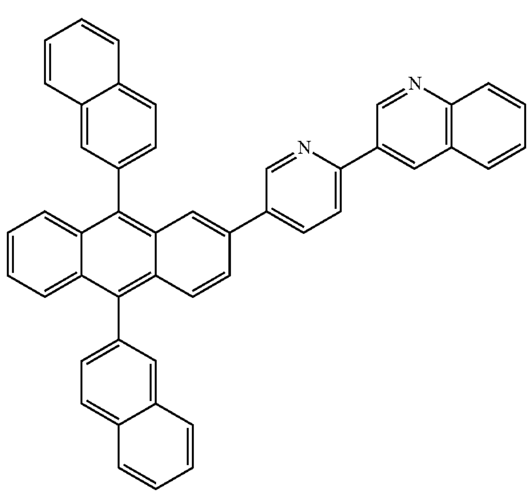
-continued
ET3
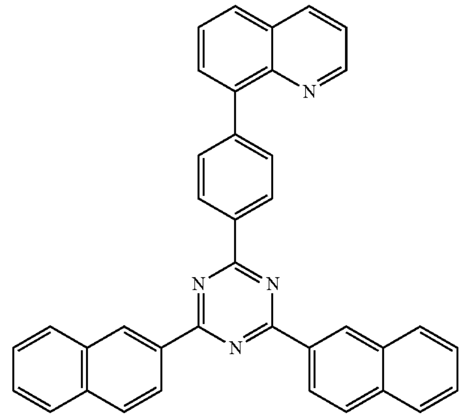
ET4
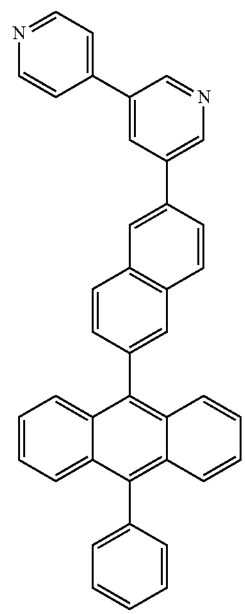
ET5
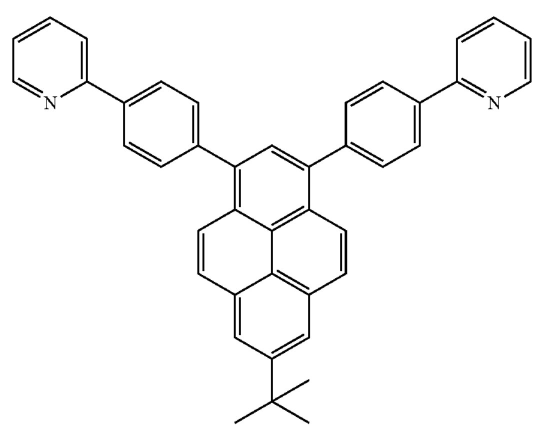

-continued
ET6
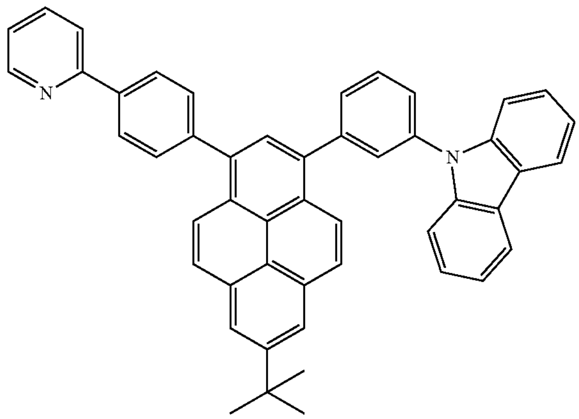
ET7
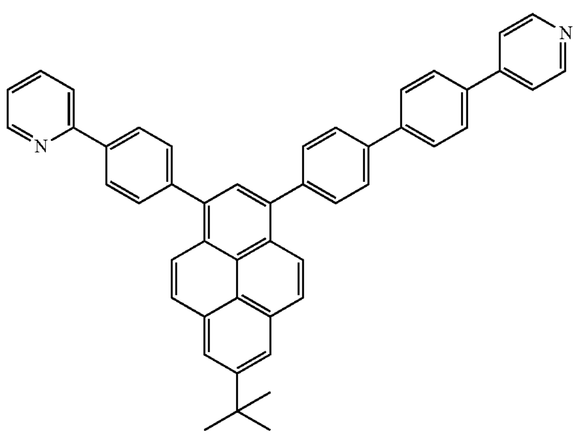
ET8
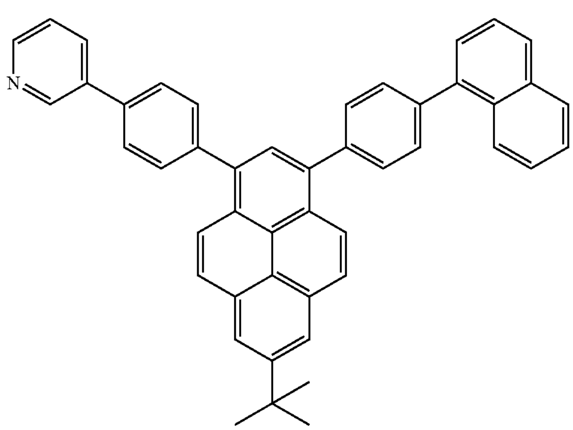
-continued
ET9
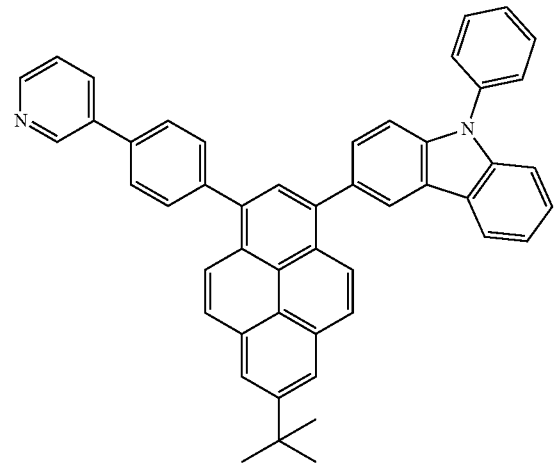
ET10
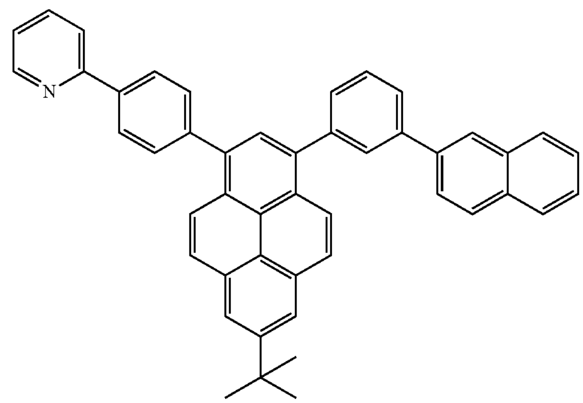
ET11
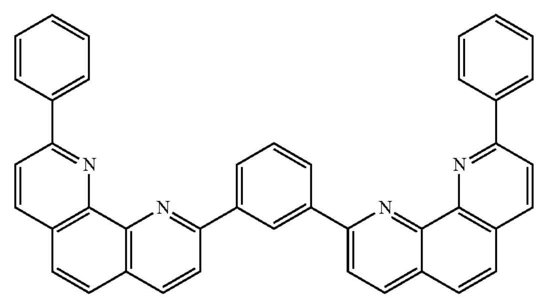
ET12
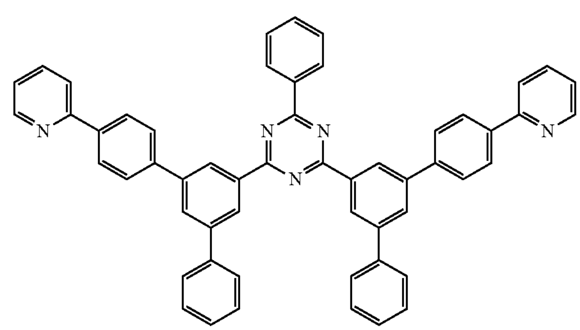

ET13
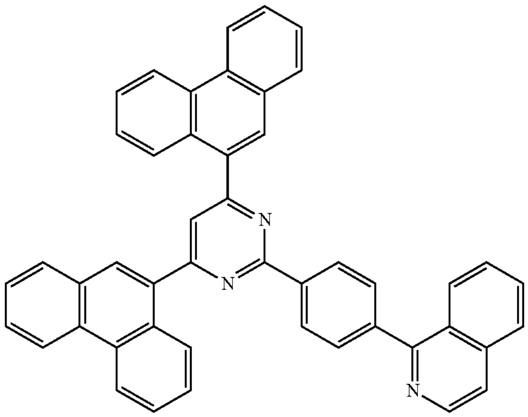
ET14
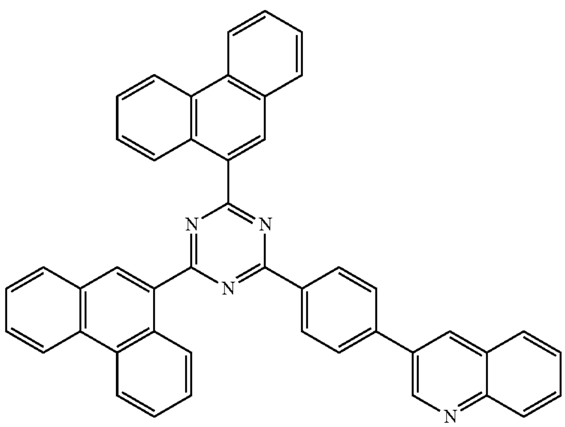
ET15
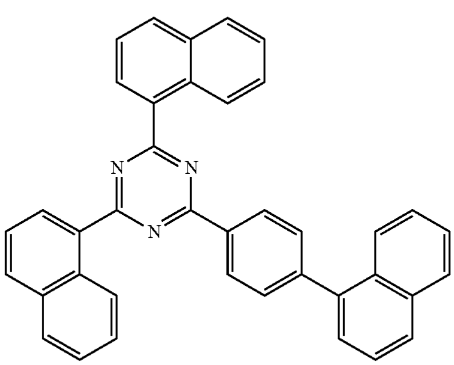
ET16
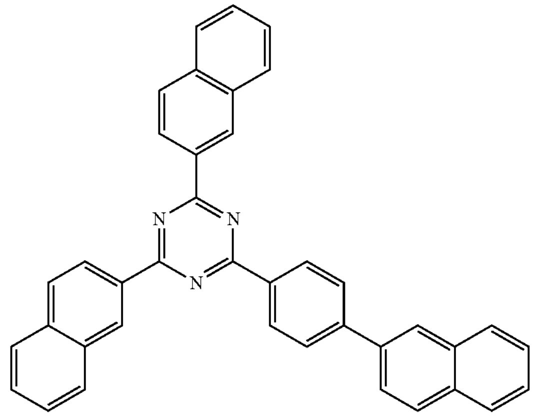
ET17
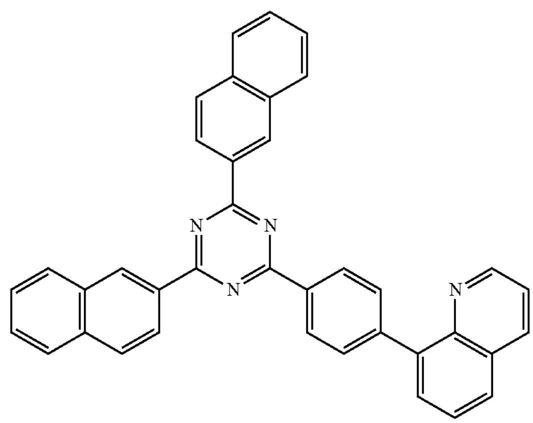
ET18
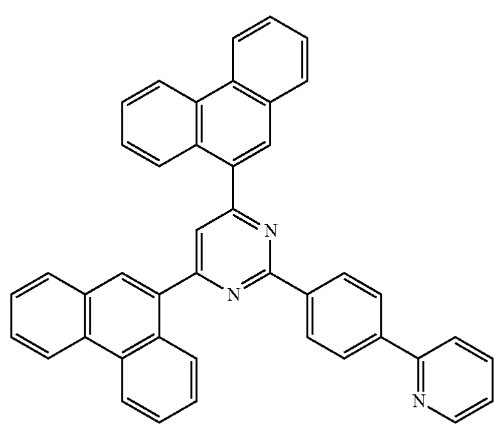

-continued
ET19
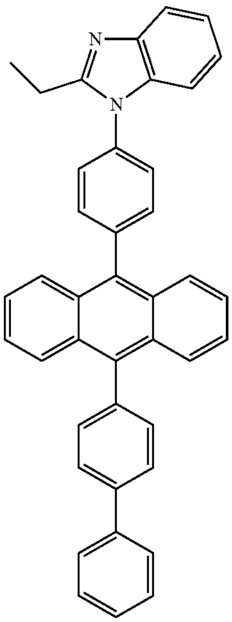
ET20
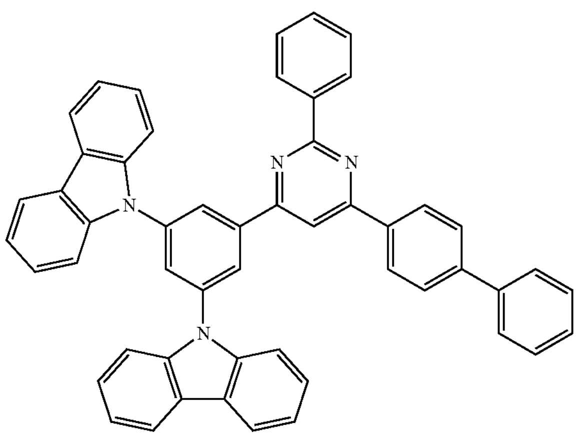
ET21
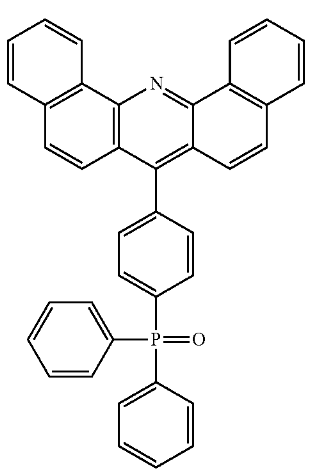
-continued
ET22
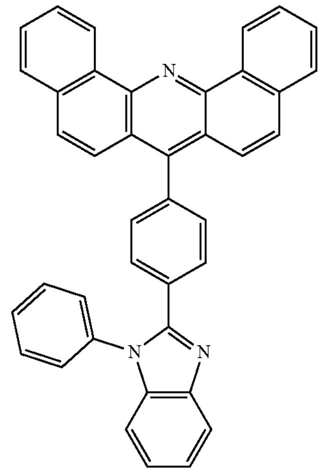
ET23
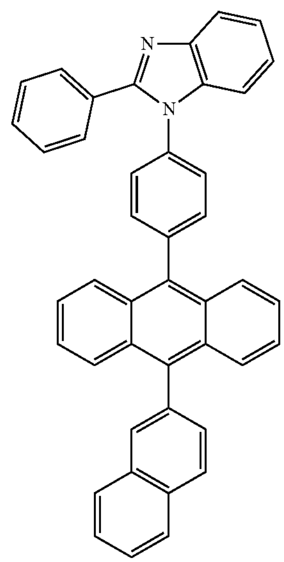
ET24
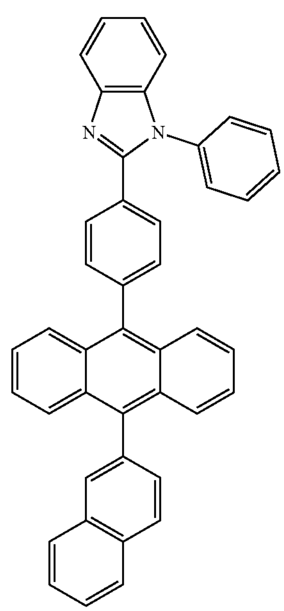

-continued

ET25

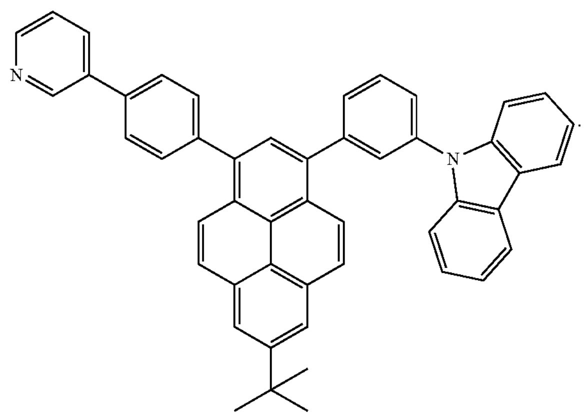

The thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1, ET-D2, or a combination thereof.

ET-D1

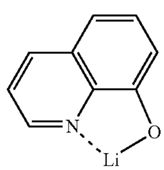

-continued

ET-D2

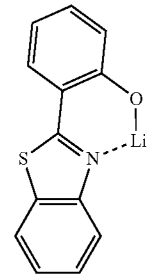

The electron transport region may include an electron injection layer (EIL) that promotes flow of electrons from the second electrode 19 thereinto.

The electron injection layer may include LiF, NaCl, CsF, $Li_2O$, BaO, or any combination thereof.

The thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

The second electrode 19 may be located on the organic layer 15. The second electrode 19 may be a cathode. A material for forming the second electrode 19 may be metal, an alloy, an electrically conductive compound, or any combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be formed as the material for forming the second electrode 19. To manufacture a top-emission type light-emitting device, a transmissive electrode formed using ITO or IZO may be used as the second electrode 19.

Hereinbefore, the organic light-emitting device has been described with reference to FIGURE, but embodiments of the present disclosure are not limited thereto.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1 (Compound 1)

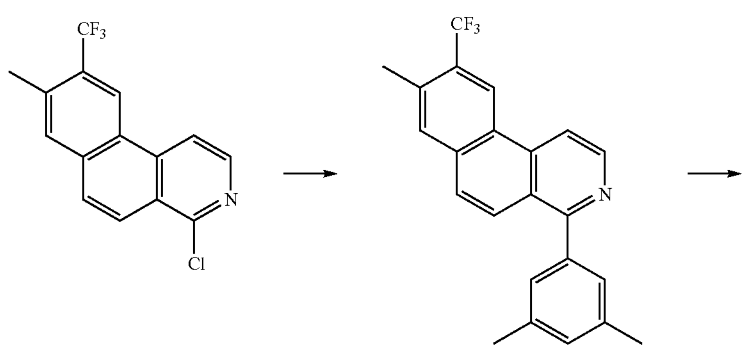

L1(1)

-continued

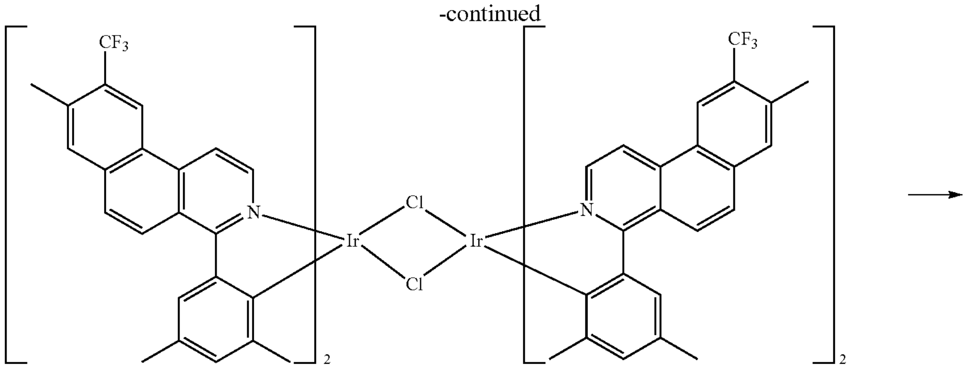

L1(2)

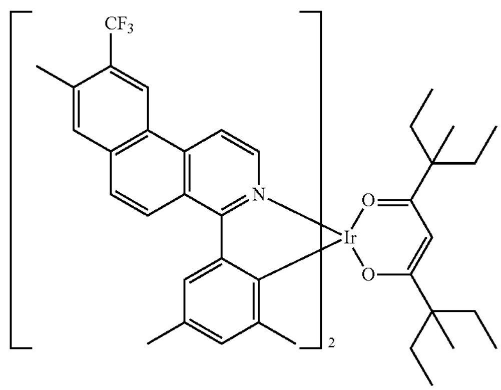

1

Synthesis of Compound L1(1)

4-chloro-8-methyl-9-(trifluoromethyl)benzo[f]isoquinoline (24.53 g, 82.95 mmol), (3,5-dimethylphenyl)boronic acid (14.93 g, 99.54 mmol), $Pd(PPh_3)_4$ (4.80 g, 4.15 mmol), and $K_2CO_3$ (34.38 g, 248.85 mmol), tetrahydrofuran (THF) (200 mL), and distilled water (50 mL) were mixed together, and the mixed solution was stirred under reflux for 18 hours. Then, the reaction temperature was lowered to room temperature, and an extraction process was performed thereon by using methylene chloride (MC). An organic layer extracted therefrom was dried by adding anhydrous magnesium sulfate ($MgSO_4$) thereto to remove moisture, and then, filtered. A solvent was removed from a filtrate under reduced pressure, and a residue was purified by using column chromatography under conditions of ethyl acetate (EA): hexane=1:5, thereby obtaining 24.37 g (80%) of Compound L1(1).

MALDI-TOFMS (m/z): $C_{23}H_{18}F_3N$ (M+) 365.37

Synthesis of Compound L1(2)

Compound L1(1) (24.37 g, 66.70 mmol), iridium chloride (11.75 g, 33.32 mmol), ethoxyethanol (300 mL), and distilled water (100 mL) were mixed together, and the mixed solution was stirred under reflux for 24 hours. The reaction temperature was lowered to room temperature, and a solid produced therefrom was separated by filtration. A filtrate was sufficiently washed by using water, methanol, and hexane in the stated order, and a solid obtained therefrom was dried in a vacuum oven, thereby obtaining Compound L1(2) (19.00 g, 69%).

Synthesis of Compound 1

Compound L1(2) (19.00 g, 11.48 mmol), 3,7-diethyl-3,7-dimethylnonane-4,6-dione) (13.80 g, 57.40 mmol), $Na_2CO_3$ (12.17 g, 114.80 mmol), and ethoxyethanol (300 mL) were mixed together, and the mixed solution was stirred for 24 hours. A mixture obtained therefrom was filtered, and a filtered solid was sufficiently washed by using methanol and hexane, and purified by using column chromatography under conditions of dichloromethane:n-hexane=1:1 (v/v), thereby obtaining Compound 1 (13.00 g, 55%). Compound 1 was identified by mass spectrometry and high performance liquid chromatography (HPLC).

HRMS(MALDI) calcd for $C_{61}H_{60}F_6IrN_2O_2$: m/Z 1159.42, Found: 1159.37

Synthesis Example 2 (Compound 2)
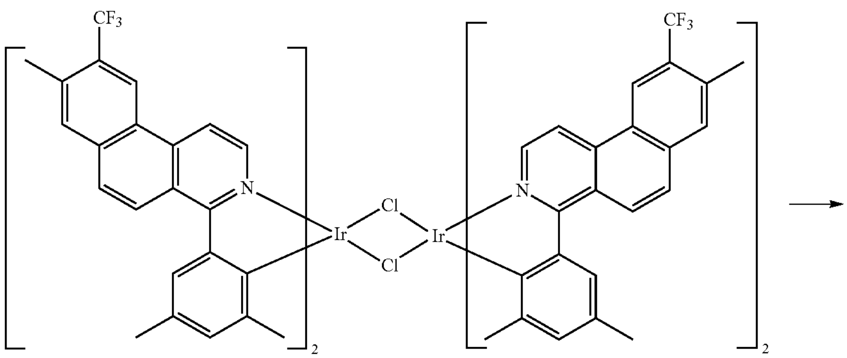
L1(2)
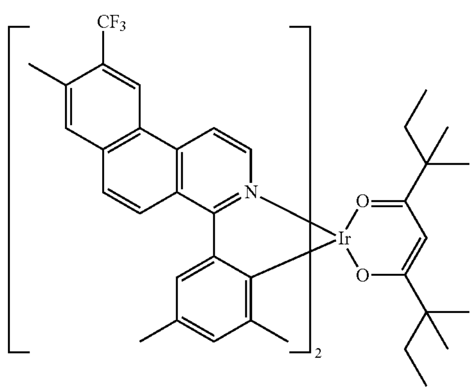
2
Compound 2 (11 g, 60%) was obtained in the same manner as in the synthesis of Compound 1 of Synthesis Example 1, except that 3,3,7,7-tetramethylnonane-4,6-dione was used instead of 3,7-diethyl-3,7-dimethylnonane-4,6-dione. Compound 2 was identified by mass spectrometry and HPLC.
HRMS(MALDI) calcd for $C_{59}H_{56}F_6IrN_2O_2$: m/Z 1131.39, Found: 1131.32
Synthesis Example 3 (Compound 3)
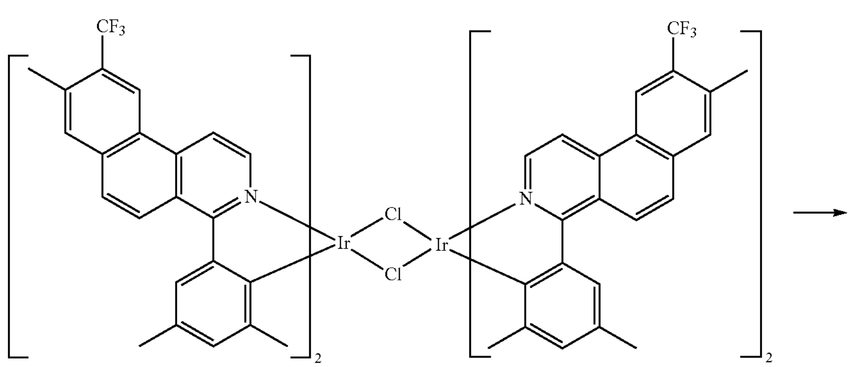
L1(2)

-continued
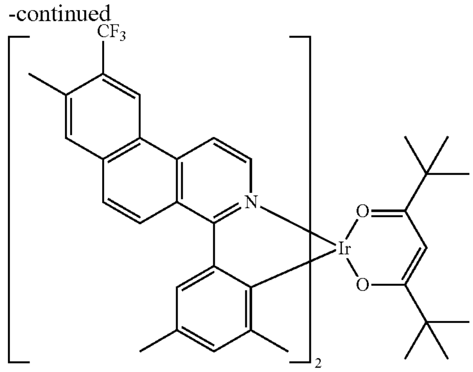
3
Compound 3 (5 g, 50%) was obtained in the same manner as in the synthesis of Compound 1 of Synthesis Example 1, except that 2,2,6,6-tetramethylheptane-3,5-dione was used instead of 3,7-diethyl-3,7-dimethylnonane-4,6-dione. Compound 3 was identified by mass spectrometry and HPLC. (HRMS(MALDI) calcd for $C_{57}H_{52}F_6IrN_2O_2$: m/Z 1160.35, Found: 1160.37
Synthesis Example 4 (Compound 4)
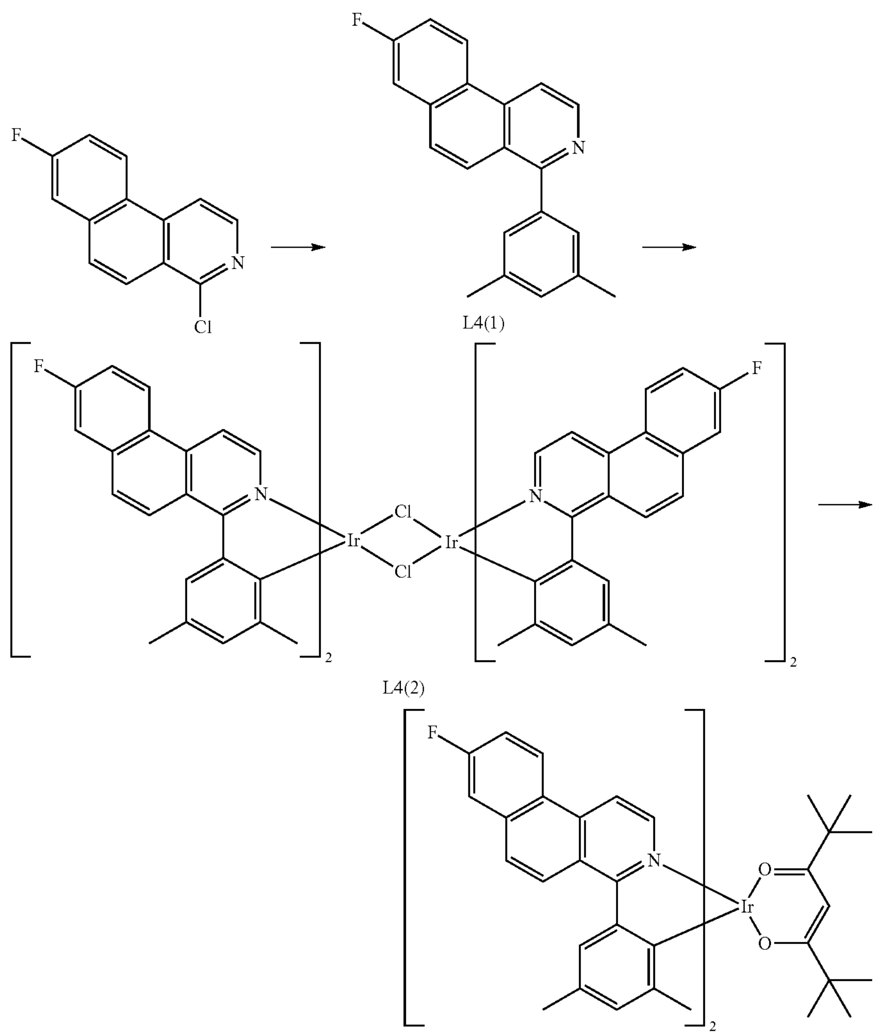
4

Synthesis of Compound L4(1)

4-chloro-8-fluorobenzo[f]isoquinoline (19.22 g, 82.95 mmol), (3,5-dimethylphenyl)boronic acid (14.93 g, 99.54 mmol), $Pd(PPh_3)_4$ (4.80 g, 4.15 mmol), $K_2CO_3$ (34.38 g, 248.85 mmol), THF (200 mL), and distilled water (50 mL) were mixed together, and the mixed solution was stirred under reflux for 18 hours. Then, the reaction temperature was lowered to room temperature, and an extraction process was performed thereon by using MC. An organic layer extracted therefrom was dried by adding $MgSO_4$ thereto to remove moisture, and then, filtered. A solvent was removed from a filtrate under reduced pressure, and a residue was purified by using column chromatography under conditions of EA:hexane=1:5, thereby obtaining 20.1 g (80%) of Compound L4(1).

MALDI-TOFMS (m/z): $C_{21}H_{16}FN$ (M+) 301.36

Synthesis of Compound L4(2)

Compound L4(1) (20.10 g, 66.70 mmol), iridium chloride (11.75 g, 33.32 mmol), ethoxyethanol (300 mL), and distilled water (100 mL) were mixed together, and the mixed solution was stirred under reflux for 24 hours. The reaction temperature was lowered to room temperature, and a solid produced therefrom was separated by filtration. A filtrate was sufficiently washed by using water, methanol, hexane in the stated order, and a solid obtained therefrom was dried in a vacuum oven, thereby obtaining Compound L4(2) (19.00 g, 69%).

Synthesis of Compound 4

Compound L4(2) (19.00 g, 11.48 mmol), 2,2,6,6-tetramethylheptane-3,5-dione (10.56 g, 57.40 mmol), $Na_2CO_3$ (12.17 g, 114.80 mmol), and ethoxyethanol (300 mL) were mixed together, and the mixed solution was stirred for 24 hours to proceed a reaction. A mixture obtained therefrom was filtered, and a filtered solid was sufficiently washed by using methanol and hexane, and purified by using column chromatography under conditions of dichloromethane:n-hexane=1:1 (v/v), thereby obtaining Compound 4 (13.00 g, 55%). Compound 4 was identified by mass spectrometry and HPLC.

HRMS(MALDI) calcd for $C_{53}H_{48}F_2IrN_2O_2$: m/Z 975.19, Found: 975.20

Synthesis Example 5 (Compound 5)

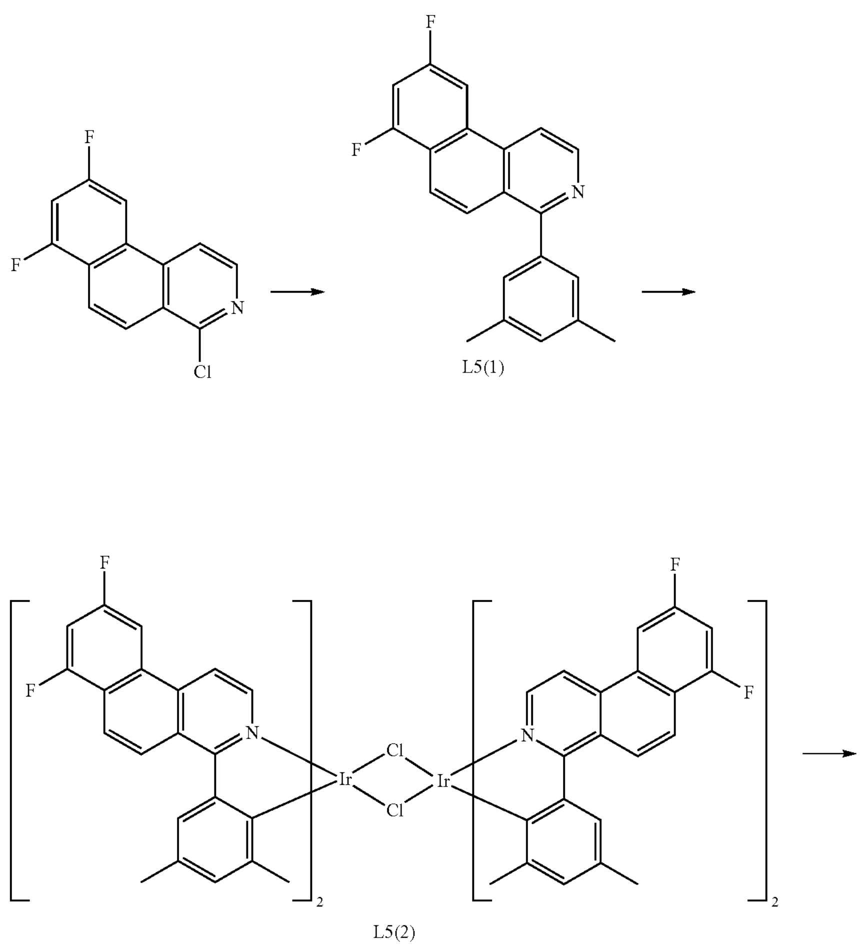

-continued

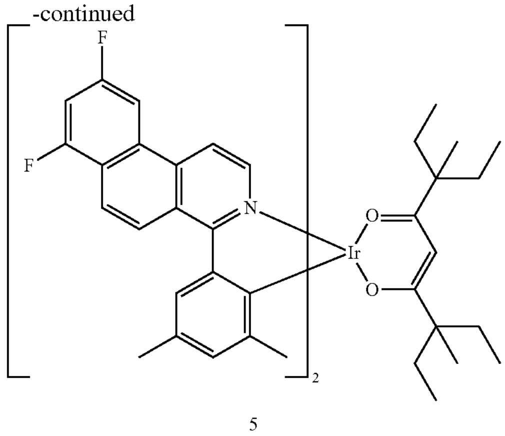

Synthesis of Compound L5(1)

4-chloro-7,9-difluorobenzo[f]isoquinoline (20.71 g, 82.95 mmol), (3,5-dimethylphenyl)boronic acid (14.93 g, 99.54 mmol), $Pd(PPh_3)_4$ (4.80 g, 4.15 mmol), $K_2CO_3$ (34.38 g, 248.85 mmol), THF (200 mL), and distilled water (50 mL) were mixed together, and the mixed solution was stirred under reflux for 18 hours. Then, the reaction temperature was lowered to room temperature, and an extraction process was performed thereon by using MC. An organic layer extracted therefrom was dried by adding $MgSO_4$ thereto to remove moisture, and then, filtered. A solvent was removed from a filtrate under reduced pressure, and a residue was purified by using column chromatography under conditions of EA:hexane=1:5, thereby obtaining 21.30 g (80%) of Compound L5(1).

MALDI-TOFMS (m/z): $C_{21}H_{15}F_2N$ (M+) 319.35

Synthesis of Compound L5(2)

Compound L5(1) (21.30 g, 66.70 mmol), iridium chloride (11.75 g, 33.32 mmol), ethoxyethanol (300 mL), and distilled water (100 mL) were mixed together, and the mixed solution was stirred under reflux for 24 hours. The reaction temperature was lowered to room temperature, and a solid produced therefrom was separated by filtration. A filtrate was sufficiently washed by using water, methanol, hexane in the stated order, and a solid obtained therefrom was dried in a vacuum oven, thereby obtaining Compound L5(2) (19.00 g, 69%).

Synthesis of Compound 5

Compound L5(2) (19.00 g, 11.48 mmol), 3,7-diethyl-3,7-dimethylnonane-4,6-dione (13.80 g, 57.40 mmol), $Na_2CO_3$ (12.17 g, 114.80 mmol), and ethoxyethanol (300 mL) were mixed together, and the mixed solution was stirred for 24 hours. A mixture obtained therefrom was filtered, and a filtered solid was sufficiently washed by using methanol and hexane, and purified by using column chromatography under conditions of dichloromethane:n-hexane=1:1 (v/v), thereby obtaining Compound 5 (13.00 g, 55%). Compound 5 was identified by mass spectrometry and HPLC.

HRMS(MALDI) calcd for $C_{57}H_{54}F_4IrN_2O_2$: m/Z 1067.38, Found: 1067.28

Synthesis Example 6 (Compound 6)

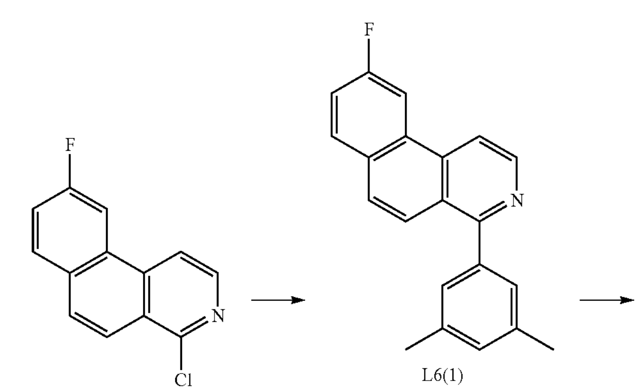

-continued

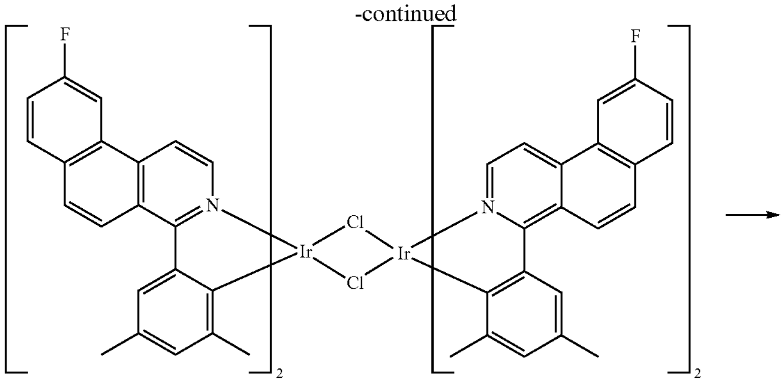

L6(2)

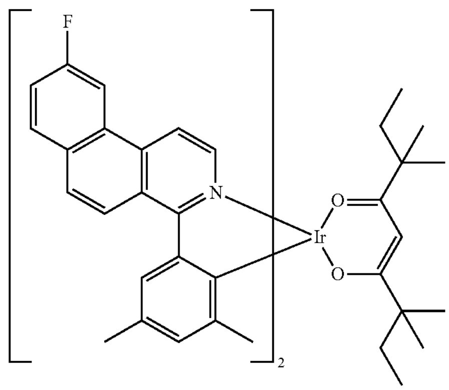

6

Synthesis of Compound L6(1)

4-chloro-9-fluorobenzo[f]isoquinoline (19.21 g, 82.95 mmol), (3,5-dimethylphenyl)boronic acid (14.93 g, 99.54 mmol), $Pd(PPh_3)_4$ (4.80 g, 4.15 mmol), $K_2CO_3$ (34.38 g, 248.85 mmol), THF (200 mL), and distilled water (50 mL) were mixed together, and the mixed solution was stirred under reflux for 18 hours. Then, the reaction temperature was lowered to room temperature, and an extraction process was performed thereon by using MC. An organic layer extracted therefrom was dried by adding $MgSO_4$ thereto to remove moisture, and then, filtered. A solvent was removed from a filtrate under reduced pressure, and a residue was purified by using column chromatography under conditions of EA:hexane=1:5, thereby obtaining 20.10 g (80%) of Compound L6(1).

MALDI-TOFMS (m/z): $C_{21}H_{16}FN$ (M+) 301.36

Synthesis of Compound L6(2)

Compound L6(1) (20.10 g, 66.70 mmol), iridium chloride (11.75 g, 33.32 mmol), ethoxyethanol (300 mL), and distilled water (100 mL) were mixed together, and the mixed solution was stirred under reflux for 24 hours. The reaction temperature was lowered to room temperature, and a solid produced therefrom was separated by filtration. A filtrate was sufficiently washed by using water, methanol, hexane in the stated order, and a solid obtained therefrom was dried in a vacuum oven, thereby obtaining Compound L6(2) (19.00 g, 69%).

Synthesis of Compound 6

Compound L6(2) (19.00 g, 11.48 mmol), 3,3,7,7-tetramethylnonane-4,6-dione (13.80 g, 57.40 mmol), $Na_2CO_3$ (12.17 g, 114.80 mmol), and ethoxyethanol (300 mL) were mixed together, and the mixed solution was stirred for 24 hours. A mixture obtained therefrom was filtered, and a filtered solid was sufficiently washed by using methanol and hexane, and purified by using column chromatography under conditions of dichloromethane:n-hexane=1:1 (v/v), thereby obtaining Compound 6 (13.00 g, 55%). Compound 6 was identified by mass spectrometry and HPLC.

HRMS(MALDI) calcd for $C_{55}H_{52}F_2IrN_2O_2$: m/Z 1003.36, Found: 1003.25

Synthesis Example 7 (Compound 10)

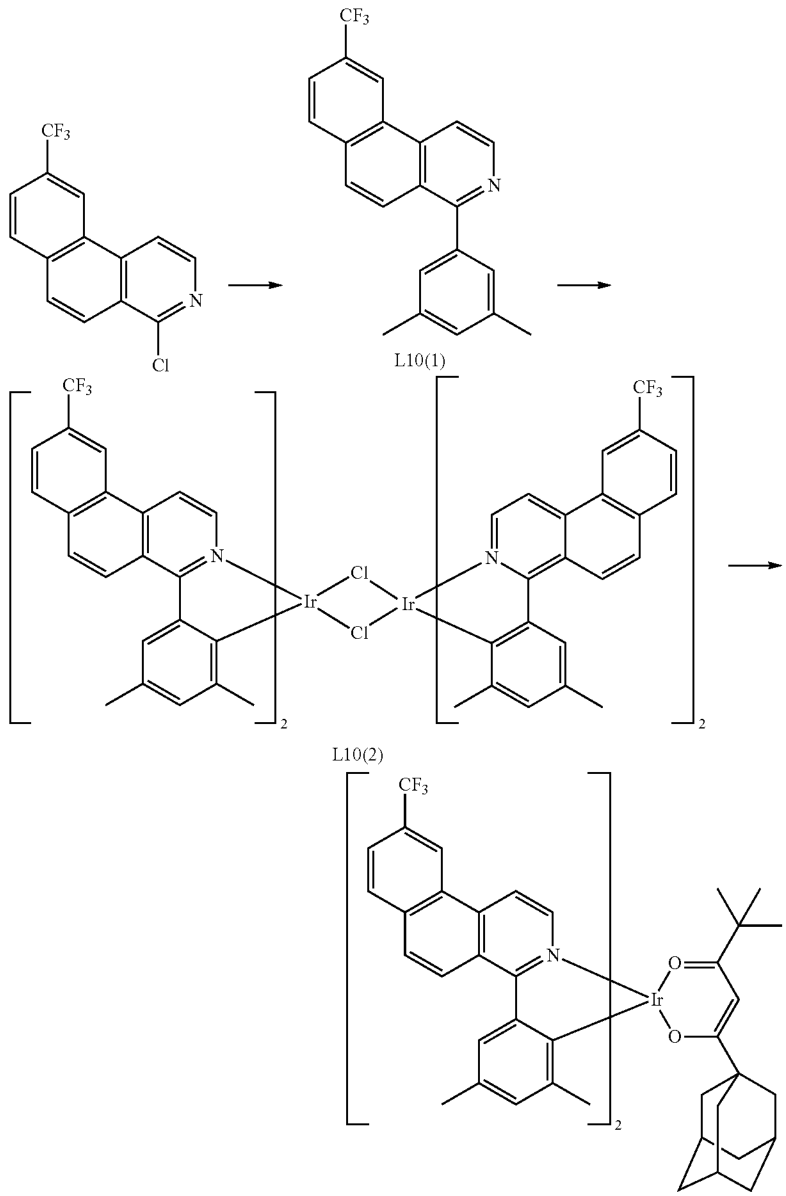

L10(1)

L10(2)

10

Synthesis of Compound L10(1)

4-chloro-9-(trifluoromethyl)benzo[f]isoquinoline (23.36 g, 82.95 mmol), (3,5-dimethylphenyl)boronic acid (14.93 g, 99.54 mmol), $Pd(PPh_3)_4$ (4.80 g, 4.15 mmol), $K_2CO_3$ (34.38 g, 248.85 mmol), THF (200 mL), and distilled water (50 mL) were mixed together, and the mixed solution was stirred under reflux for 18 hours. Then, the reaction temperature was lowered to room temperature, and an extraction process was performed thereon by using MC. An organic layer extracted therefrom was dried by adding $MgSO_4$ thereto to remove moisture, and then, filtered. A solvent was removed from a filtrate under reduced pressure, and a residue was purified by using column chromatography under conditions of EA:hexane=1:5, thereby obtaining 23.43 g (80%) of Compound L10(1).

MALDI-TOFMS (m/z): $C_{22}$H16FN (M+) 351.36

Synthesis of Compound L10(2)

Compound L10(1) (23.43 g, 66.70 mmol), iridium chloride (11.75 g, 33.32 mmol), ethoxyethanol (300 mL), and distilled water (100 mL) were mixed together, and the mixed solution was stirred under reflux for 24 hours. The reaction temperature was lowered to room temperature, and a solid produced therefrom was separated by filtration. A filtrate was sufficiently washed by using water, methanol, hexane in the stated order, and a solid obtained therefrom was dried in a vacuum oven, thereby obtaining Compound L10(2) (19.00 g, 69%).

Synthesis of Compound 10

Compound L10(2) (19.00 g, 11.48 mmol), 1-((3R,5R,7R)-adamantan-1-yl)-4,4-dimethylpentane-1,3-dione (15.06 g, 57.40 mmol), $Na_2CO_3$ (12.17 g, 114.80 mmol), and ethoxyethanol (300 mL) were mixed together, and the mixed solution was stirred for 24 hours. A mixture obtained therefrom was filtered, and a filtered solid was sufficiently washed by using methanol and hexane, and purified by using column chromatography under conditions of dichloromethane:n-hexane=1:1 (v/v), thereby obtaining Compound 10 (13.00 g, 55%). Compound 10 was identified by mass spectrometry and HPLC.

HRMS(MALDI) calcd for $C_{61}H_{54}F_6IrN_2O_2$: m/Z 1153.37, Found: 1153.32

Synthesis Example 8 (Compound 13)

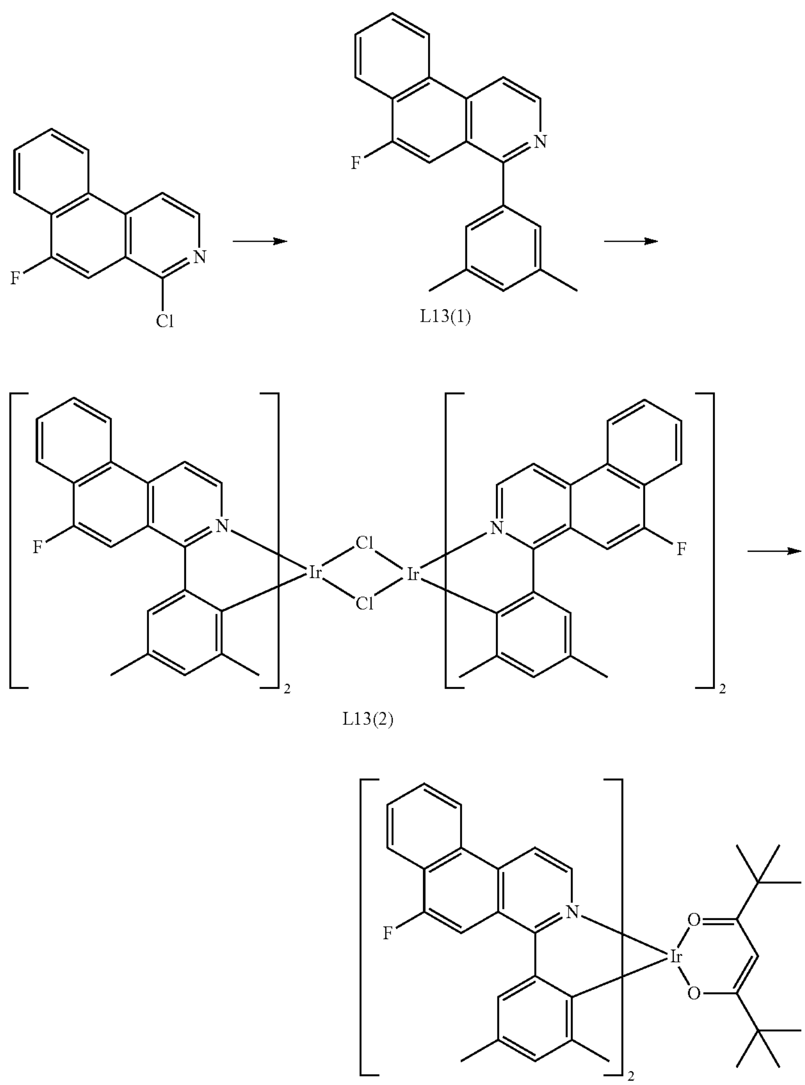

Synthesis of Compound L13(1)

4-chloro-6-fluorobenzo[f]isoquinoline (19.21 g, 82.95 mmol), (3,5-dimethylphenyl)boronic acid (14.93 g, 99.54 mmol), $Pd(PPh_3)_4$ (4.80 g, 4.15 mmol), $K_2CO_3$ (34.38 g, 248.85 mmol), THF (200 mL), and distilled water (50 mL) were mixed together, and the mixed solution was stirred under reflux for 18 hours. Then, the reaction temperature was lowered to room temperature, and an extraction process was performed thereon by using MC. An organic layer extracted therefrom was dried by adding $MgSO_4$ thereto to remove moisture, and then, filtered. A solvent was removed from a filtrate under reduced pressure, and a residue was purified by using column chromatography under conditions of EA:hexane=1:5, thereby obtaining 20.10 g (80%) of Compound L13(1).

MALDI-TOFMS (m/z): $C_{21}H_{16}FN$ (M+) 301.36

Synthesis of Compound L13(2)

Compound L13(1) (20.10 g, 66.70 mmol), iridium chloride (11.75 g, 33.32 mmol), ethoxyethanol (300 mL), and distilled water (100 mL) were mixed together, and the mixed solution was stirred under reflux for 24 hours. The reaction temperature was lowered to room temperature, and a solid produced therefrom was separated by filtration. A filtrate was sufficiently washed by using water, methanol, and hexane in the stated order, and a solid obtained therefrom was dried in a vacuum oven, thereby obtaining Compound L13(2) (19.00 g, 69%).

Synthesis of Compound 13

Compound L13(2) (19.00 g, 11.48 mmol), 2,2,6,6-tetramethylheptane-3,5-dione (10.56 g, 57.40 mmol), $Na_2CO_3$ (12.17 g, 114.80 mmol), and ethoxyethanol (300 mL) were mixed together, and the mixed solution was stirred for 24 hours. A mixture obtained therefrom was filtered, and a filtered solid was sufficiently washed by using methanol and hexane, and purified by using column chromatography under conditions of dichloromethane:n-hexane=1:1 (v/v), thereby obtaining Compound 13 (13.00 g, 55%). Compound 13 was identified by mass spectrometry and HPLC.

HRMS(MALDI) calcd for $C_{53}H_{48}F_2IrN_2O_2$: m/Z 975.19, Found: 975.20 Synthesis of Example 9 (Compound 16)

Synthesis of Compound L16(1)

4-chloro-7-fluorobenzo[f]isoquinoline (19.21 g, 82.95 mmol), (3,5-dimethylphenyl)boronic acid (14.93 g, 99.54 mmol), $Pd(PPh_3)_4$ (4.80 g, 4.15 mmol), $K_2CO_3$ (34.38 g, 248.85 mmol), THF (200 mL), and distilled water (50 mL) were mixed together, and the mixed solution was stirred under reflux for 18 hours. Then, the reaction temperature was lowered to room temperature, and an extraction process was performed thereon by using MC. An organic layer extracted therefrom was dried by adding $MgSO_4$ thereto to remove moisture, and then, filtered. A solvent was reduced from a filtrate under reduced pressure, and a residue was purified by using column chromatography under conditions of EA:hexane=1:5, thereby obtaining 20.10 g (80%) of Compound L16(1).

MALDI-TOFMS (m/z): $C_{21}H_{16}FN$ (M+) 301.36

Synthesis of Compound L16(2)

Compound L16(1) (20.10 g, 66.70 mmol), iridium chloride (11.75 g, 33.32 mmol), ethoxyethanol (300 mL), and distilled water (100 mL) were mixed together, and the mixed

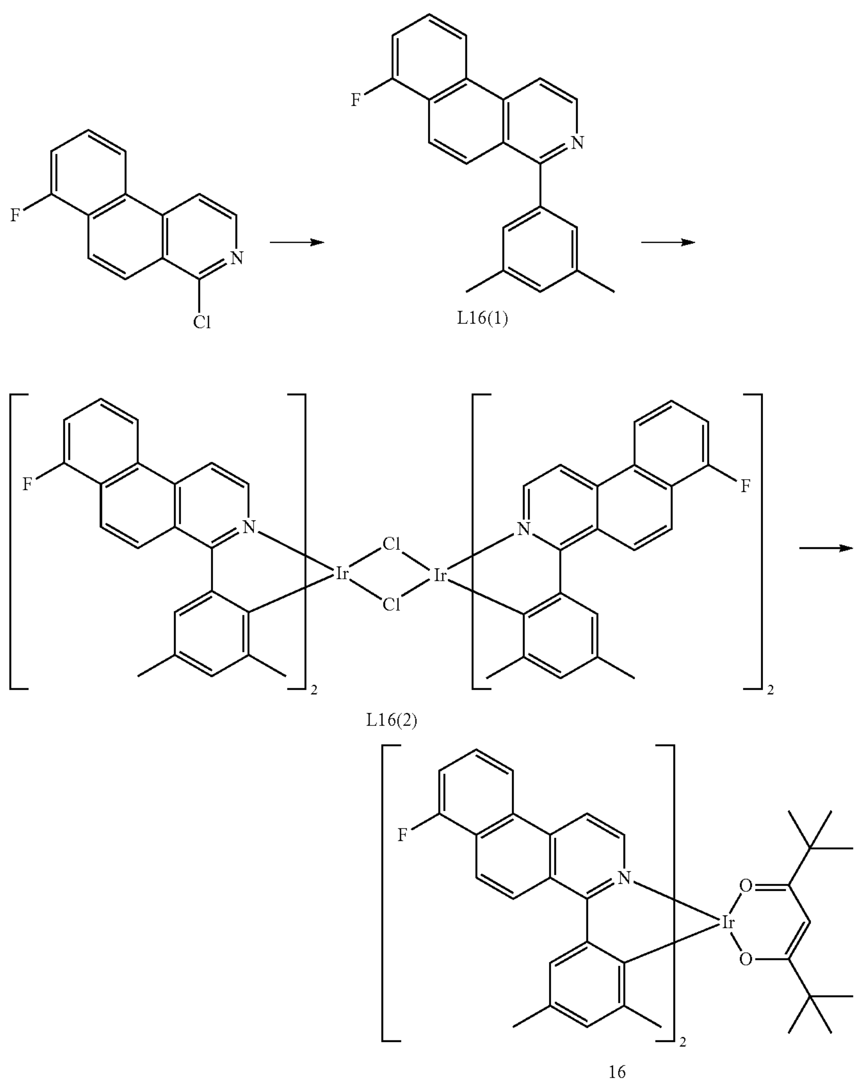

solution was stirred under reflux for 24 hours. The reaction temperature was lowered to room temperature, and a solid produced therefrom was separated by filtration. A filtrate was sufficiently washed by using water, methanol, and hexane in the stated order, and a solid obtained therefrom was dried in a vacuum oven, thereby obtaining Compound L16(2) (19.00 g, 69%).

Synthesis of Compound 16

Compound L16(2) (19.00 g, 11.48 mmol), 2,2,6,6-tetramethylheptane-3,5-dione (10.56 g, 57.40 mmol), $Na_2CO_3$ (12.17 g, 114.80 mmol), and ethoxyethanol (300 mL) were mixed together, and the mixed solution was stirred for 24 hours. A mixture obtained therefrom was filtered, and a filtered solid was sufficiently washed by using methanol and hexane, and purified by using column chromatography under conditions of dichloromethane:n-hexane=1:1 (v/v), thereby obtaining 16 (13.00 g, 55%). Compound 16 was identified by mass spectrometry and HPLC.

HRMS(MALDI) calcd for $C_{53}H_{48}F_2IrN_2O_2$: m/Z 975.19, Found: 975.20

Evaluation Example 1: Evaluation on HOMO and LUMO Energy Levels

HOMO and LUMO energy levels of Compounds 1 to 6, 10, 13, 16, A to D and E1 to E3 were evaluated according to the method in Table 2. Results thereof are shown in Table 3.

TABLE 2

| | |
|---|---|
| HOMO energy level evaluation method | A potential (Volts, V) - current (Amperes, A) graph of each compound was obtained by using cyclic voltammetry (CV) (electrolyte: 0.1M $Bu_4NClO_4$/solvent: $CH_2Cl_2$/electrode: 3 electrode system (working electrode: GC, reference electrode: Ag/AgCl, auxiliary electrode: Pt)). Then, from reduction onset of the graph, a HOMO energy level of a compound was calculated. |
| LUMO energy level evaluation method | Each compound was diluted at a concentration of $1 \times 10^{-5}$M in $CHCl_3$, and a UV absorption spectrum thereof was measured at room temperature by using a Shimadzu UV-350 spectrometer. Then a LUMO energy level thereof was calculated by using an optical band gap (Eg) from an edge of the absorption spectrum. |

TABLE 3

| Compound No. | HOMO (eV) | LUMO (eV) |
|---|---|---|
| 1 | −5.140 | −2.572 |
| 2 | −5.150 | −2.571 |
| 3 | −5.130 | −2.571 |
| 4 | −5.110 | −2.460 |
| 5 | −5.160 | −2.600 |
| 6 | −5.120 | −2.500 |
| 10 | −5.150 | −2.571 |
| 13 | −5.110 | −2.521 |
| 16 | −5.119 | −2.530 |
| A | −5.010 | −2.351 |
| B | −5.000 | −2.328 |
| C | −5.373 | −2.487 |
| D | −5.908 | −3.014 |
| E1 | −5.216 | −2.722 |
| E2 | −5.237 | −2.673 |
| E3 | −5.166 | −2.571 |

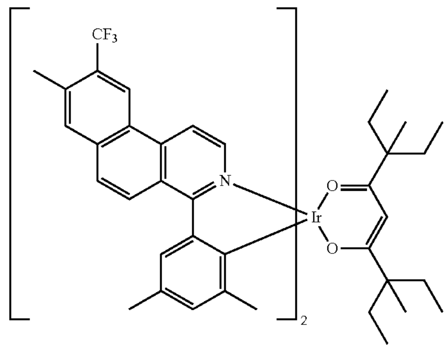

1

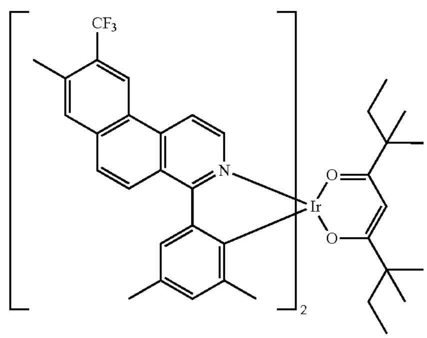

2

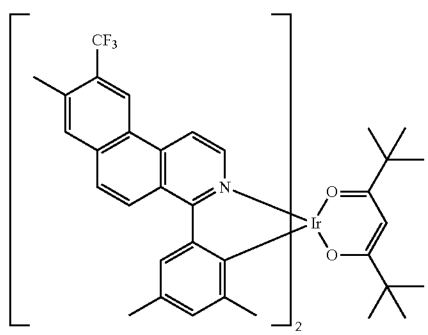

3

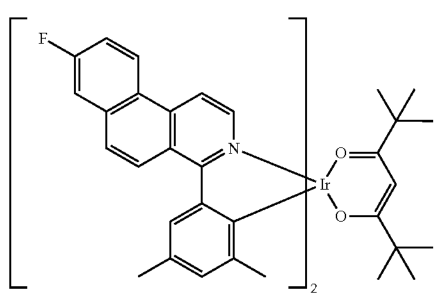

4

TABLE 3-continued
| Compound No. | HOMO (eV) | LUMO (eV) |
| --- | --- | --- |
| 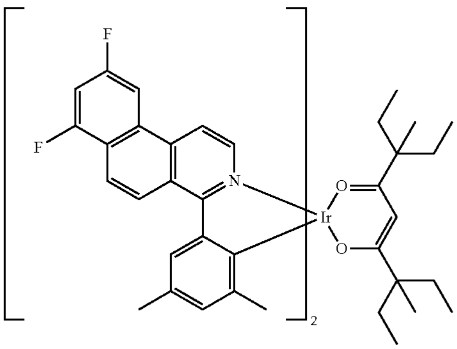 5 | | |
| 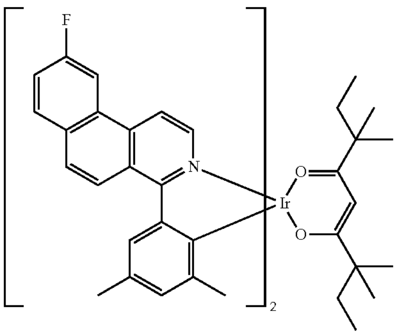 6 | | |
| 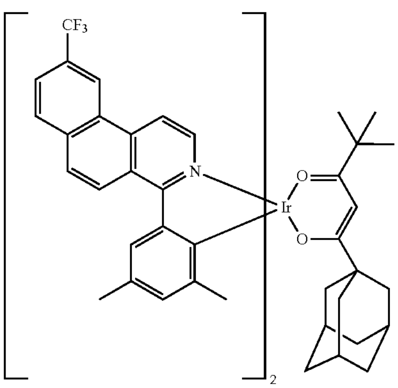 10 | | |
| 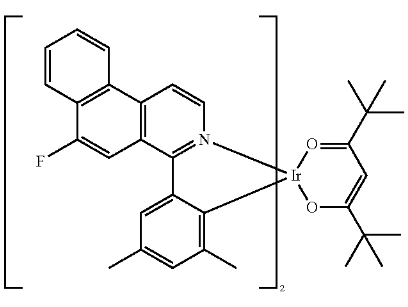 13 | | |
TABLE 3-continued
| Compound No. | HOMO (eV) | LUMO (eV) |
| --- | --- | --- |
| 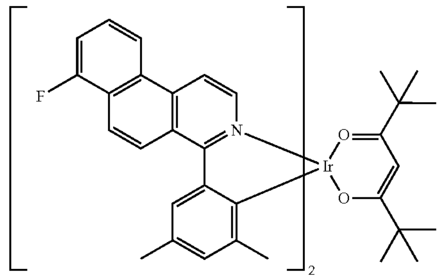 16 | | |
| 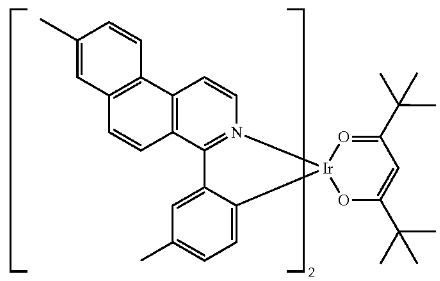 A | | |
| 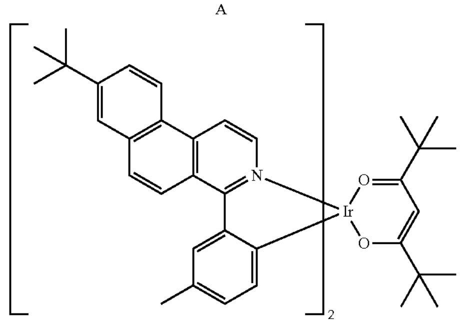 B | | |
| 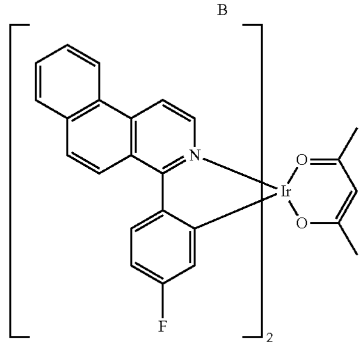 C | | |
| 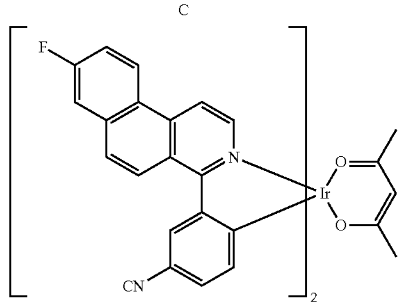 D | | |

TABLE 3-continued

| Compound No. | HOMO (eV) | LUMO (eV) |
|---|---|---|

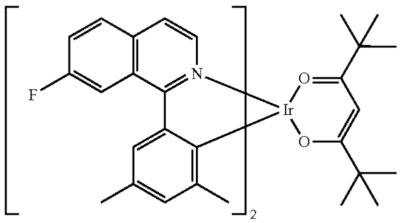

E1

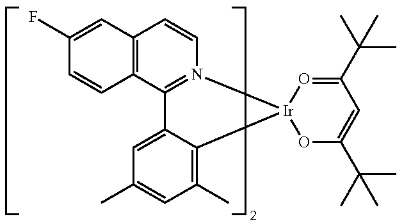

E2

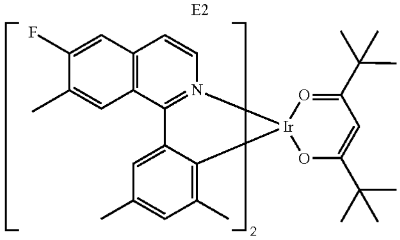

E3

Evaluation Example 2: Evaluation of Photoluminescence Quantum Yields (PLQY)

Compound H52 and Compound 1 were co-deposited at a vacuum pressure of $10^{-7}$ torr and at a weight ratio of 98:2 to produce a 40 nm-thick film.

The PLQY of Compound 1 in film was evaluated by using a Hamamatsu Photonics absolute PL quantum yield measurement system equipped with a xenon light source, a monochromator, a photonic multichannel analyzer, and an integrating sphere, and using PLQY measurement software (Hamamatsu Photonics, Ltd., Shizuoka, Japan). The results thereof are shown in Table 4.

The PLQY of each of Compounds 2 to 6, 10, 13, 16, A to D and E1 to E3 were performed, and the results thereof are shown in Table 4.

TABLE 4

| Compound No. | PLQY in film (%) |
|---|---|
| 1 | 95.0 |
| 2 | 99.9 |
| 3 | 92.0 |
| 4 | 92.7 |
| 5 | 99.4 |
| 6 | 95.8 |
| 10 | 94.4 |
| 13 | 93.7 |
| 16 | 96.7 |
| A | 90.5 |
| B | 90.2 |
| C | 87.5 |
| D | 88.0 |
| E1 | 73.7 |
| E2 | 74.2 |
| E3 | 74.8 |

As shown in Table 4, Compounds 1 to 6, 10, 13 and 16 were found to have excellent PLQY (in film) compared with Compounds A to D and E1 to E3.

H52

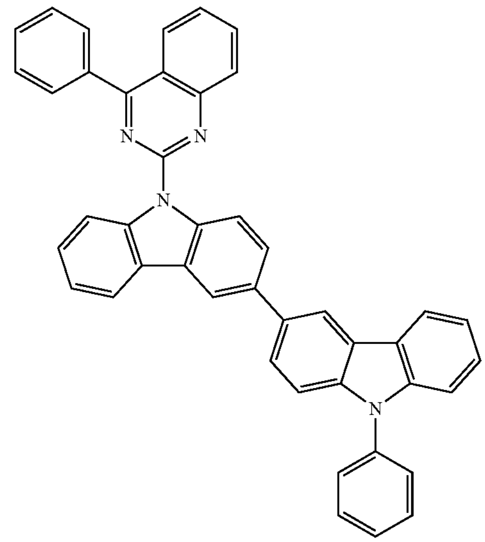

Evaluation Example 3: Measurement of Decay Time

A quartz substrate washed with chloroform and pure water was prepared, and then, the materials that are shown in Table 5 were vacuum (co)-deposited under a vacuum pressure of $10^{-7}$ torr to prepare Films 1 to 6, 10, 13, 16, A to D and E1 to E3 each having a thickness of 50 nanometers (nm).

Each of PL spectra of the prepared Films 1 to 6, 10, 13, 16, A to D and E1 to E3 was evaluated at room temperature by using a time-resolved photoluminescence (TRPL) measurement system, FluoTime 300 (available from PicoQuant), and a pumping source, PLS340 (available from PicoQuant, excitation wavelength=340 nm, spectral width=20 nm). Then, a wavelength of the main peak in each PL spectrum was determined, and upon photon pulses (pulse width=500 picoseconds, ps) applied to the film by PLS340, the number of photons emitted at the wavelength of the main peak for each film was repeatedly measured over time by time-correlated single photon counting (TCSPC), thereby obtaining TRPL curves available for the sufficient fitting. Based on the results obtained therefrom, two or more exponential decay functions were set forth for the fitting, thereby obtaining $T_{decay}$(Ex), i.e., a decay time, for Films 1 to 6, 10, 13, 16, A to D and E1 to E3. The results thereof are shown in Table 5. The functions used for the fitting are as described in Equation 1, and a decay time $T_{decay}$ having the largest value among values for each of the exponential decay functions used for the fitting was taken as $T_{decay}$(Ex), i.e., a decay time. Here, during the same measurement time as the measurement time for obtaining TRPL curves, the same measurement was repeated once more in a dark state (i.e., a state where a pumping signal incident on each of the films was blocked), thereby obtaining a baseline or a background signal curve available as a baseline for the fitting:

Equation 1

$$f(t) = \sum_{i=1}^{n} A_i \exp(-t / T_{decay,i})$$

TABLE 5

| 필름 No. | Compounds used in the preparation of the film (each ratio described herein indicates the weight ratio) | Decay time microseconds (μs) |
|---|---|---|
| 1 | Compound H52:Compound 1 (98:2) | 0.718 |
| 2 | Compound H52:Compound 2 (98:2) | 0.700 |
| 3 | Compound H52:Compound 3 (98:2) | 0.730 |
| 4 | Compound H52:Compound 4 (98:2) | 0.773 |
| 5 | Compound H52:Compound 5 (98:2) | 0.704 |
| 6 | Compound H52:Compound 6 (98:2) | 0.794 |
| 10 | Compound H52:Compound 10 (98:2) | 0.700 |
| 13 | Compound H52:Compound 13 (98:2) | 0.722 |
| 16 | Compound H52:Compound 16 (98:2) | 0.682 |
| A | Compound H52:Compound A (98:2) | 0.907 |
| B | Compound H52:Compound B (98:2) | 0.911 |
| C | Compound H52:Compound C (98:2) | 0.961 |
| D | Compound H52:Compound D (98:2) | 0.952 |
| E1 | Compound H52:Compound E1 (98:2) | 1.018 |
| E2 | Compound H52:Compound E2 (98:2) | 1.005 |
| E3 | Compound H52:Compound E3 (98:2) | 1.091 |

As shown in Table 5, Compounds 1 to 6, 10, 13 and 16 were found to have excellent decay time compared with Compounds A to D and E1 to E3.

Example 1

The ITO-patterned glass substrate as an anode was cut into a size of 50 mm×50 mm×0.5 mm, ultrasonically cleaned with isopropyl alcohol and pure water, each for 5 minutes, and then irradiated with ultraviolet light for 30 minutes and cleaned by exposure to ozone. Then, the resultant substrate was mounted on a vacuum deposition apparatus.

HT3 and $F_6$TCNNQ were vacuum co-deposited on the ITO anode at the weight ratio of 98:2 to form a hole injection layer having a thickness of 100 Å, HT3 was vacuum-deposited on the hole injection layer to form a hole transport layer having a thickness of 1350 Å, and then, HT21 was vacuum-deposited on the hole transport layer to form an electron blocking layer having a thickness of 300 Å.

Then, H52 (host) and Compound 1 (dopant) were co-deposited at a weight ratio of 98:2 on the electron blocking layer to form an emission layer having a thickness of 400 Å.

Then, ET3 and ET-D1 were co-deposited at a volume ratio of 50:50 on the emission layer to form an electron transport layer having a thickness of 350 Å, and ET-D1 was vacuum-deposited on the electron transport layer to form an electron injection layer having a thickness of 10 Å, and Al was vacuum-deposited on the electron injection layer to form a cathode having a thickness of 1000 Å, thereby completing the manufacture of an organic light-emitting device having the structure of ITO (1500 Å) /HT3+$F_6$TCNNQ (2 wt %) (100 Å)/HT3 (1350 Å)/HT21 (300 Å)/H52+Compound 1 (2 wt %) (400 Å)/ET3+ET-D1 (50%) (350 Å)/ET-D1 (10 Å)/Al(1000 Å).

HT3

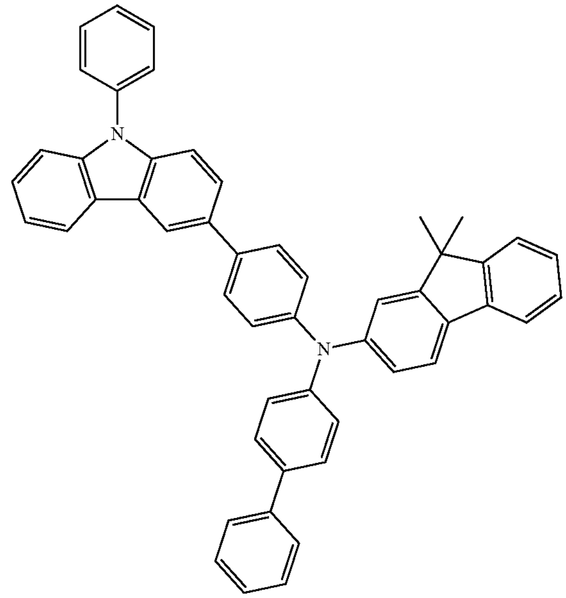

F6-TCNNQ

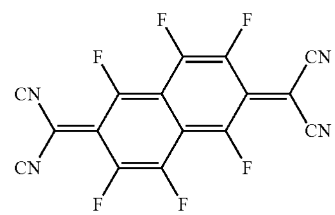

HT21

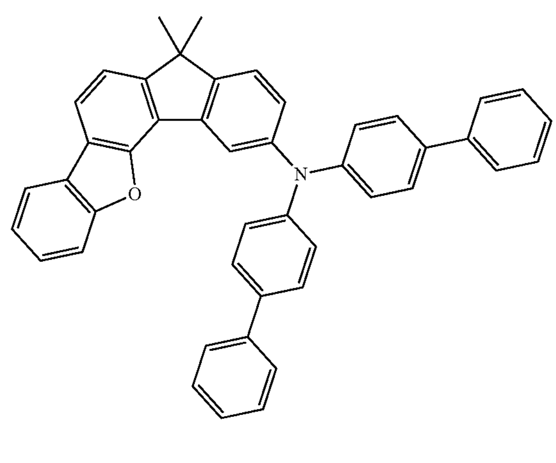

-continued

H52

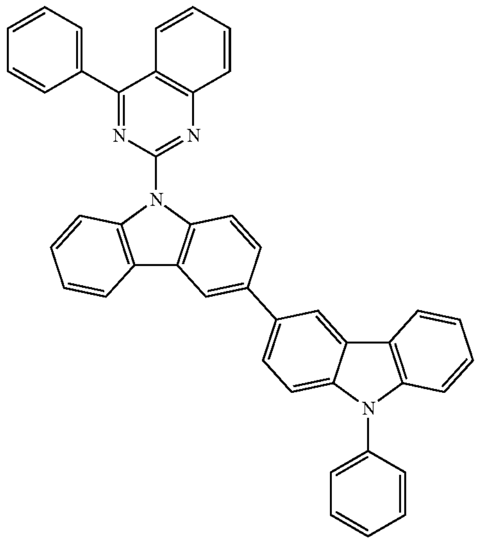

ET3

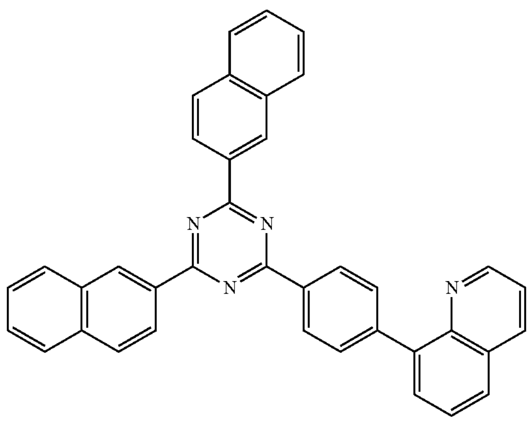

ET-D1

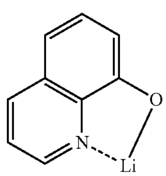

Examples 2 to 9 and Comparative Examples A to D and E1 to E3

Organic light-emitting devices were manufactured in substantially the same manner as in Example 1, except that the compounds shown in Table 6 were used instead of Compound 1 as a dopant in the formation of an emission layer.

Evaluation Example 4: Evaluation of Characteristics of Organic Light-Emitting Device The driving voltage, current density, maximum of external quantum efficiency (Max EQE), roll-off ratio, FWHM of the emission peak in the EL spectrum, color-coordinate, and/or lifespan ($LT_{97}$) of the organic light-emitting devices manufactured in Examples 1 to 9 and Comparative Examples A to D and E1 to E3 were evaluated. The results thereof are shown in Tables 6 and 7. A Keithley 2400 current voltmeter and a luminance meter (Minolta Cs-1000A) were used in the evaluation. The lifespan ($LT_{97}$) refers to time required for the initial luminance of 3,500 nit of the organic light-emitting device to reduce by 97% and expressed as a relative value (%). The roll-off ratio was calculated by Equation 20:

$$\text{Roll-off ratio}=\{1-(\text{efficiency (at 3,500 nit)}/\text{maximum luminescence efficiency})\}\times 100\% \quad \text{Equation 20}$$

TABLE 6

| | Dopant Compound No. | Driving voltage (V) | Current density (mA/cm$^2$) | Max EQE (%) | Roll-off ratio (%) |
|---|---|---|---|---|---|
| Example 1 | 1 | 4.66 | 10 | 30 | 7 |
| Example 2 | 2 | 4.69 | 10 | 30.8 | 8 |
| Example 3 | 3 | 4.70 | 10 | 30.1 | 8 |
| Example 4 | 4 | 4.61 | 10 | 30.8 | 7 |
| Example 5 | 5 | 4.88 | 10 | 30.7 | 8 |
| Example 6 | 6 | 4.45 | 10 | 35.7 | 9 |
| Example 7 | 10 | 4.81 | 10 | 30.0 | 10 |
| Example 8 | 13 | 4.79 | 10 | 30.8 | 8 |
| Example 9 | 16 | 4.82 | 10 | 30.1 | 8 |
| Comparative Example A | A | 4.91 | 10 | 27.6 | 11 |
| Comparative Example B | B | 4.95 | 10 | 28.0 | 11 |
| Comparative Example C | C | 5.02 | 10 | 26.7 | 13 |
| Comparative Example D | D | 4.70 | 10 | 22.0 | 15 |
| Comparative Example E1 | E1 | 5.42 | 10 | 23.4 | 24 |
| Comparative Example E2 | E2 | 5.50 | 10 | 24.1 | 19 |
| Comparative Example E3 | E3 | 5.40 | 10 | 24.0 | 18 |

TABLE 7

| | Dopant Compound No. | FWHM (nm) | Emission color | Color coordinate (CIE) | $LT_{97}$ (at 3500 nit) (a relative value, %) |
|---|---|---|---|---|---|
| Example 1 | 1 | 51 | Red | 0.68, 0.30 | 150 |
| Example 2 | 2 | 50 | Red | 0.68, 0.30 | 155 |
| Example 3 | 3 | 52 | Red | 0.68, 0.30 | 148 |
| Example 4 | 4 | 50 | Red | 0.65, 0.32 | 145 |
| Example 5 | 5 | 52 | Red | 0.685, 0.295 | 255 |
| Example 6 | 6 | 49 | Red | 0.67, 0.31 | 160 |
| Example 7 | 10 | 53 | Red | 0.68, 0.30 | 160 |
| Example 8 | 13 | 50 | Red | 0.68, 0.30 | 158 |
| Example 9 | 16 | 52 | Red | 0.68, 0.30 | 143 |
| Comparative Example A | A | 73 | Red | 0.62, 0.37 | 100 |
| Comparative Example B | B | 72 | Red | 0.61, 0.375 | 103 |
| Comparative Example C | C | 69 | Yellow | 0.44, 0.52 | 115 |
| Comparative Example D | D | 65 | Yellow | 0.42, 0.55 | 125 |
| Comparative Example E1 | E1 | 60 | Red | 0.69, 0.29 | 100 |
| Comparative Example E2 | E2 | 60 | Red | 0.69, 0.29 | 100 |
| Comparative Example E3 | E3 | 58 | Red | 0.688, 0.295 | 105 |

TABLE 7-continued
| Dopant Compound No. | FWHM (nm) | Emission color | Color coordinate (CIE) | $LT_{97}$ (at 3500 nit) (a relative value, %) |
|---|---|---|---|---|
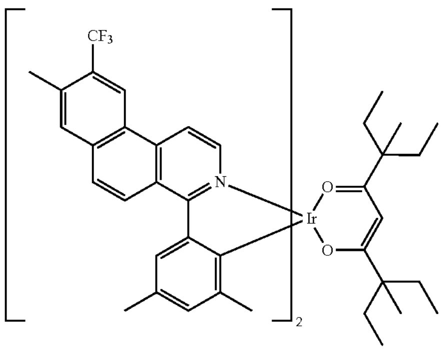
1
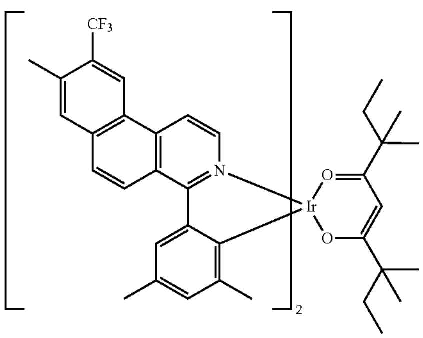
2
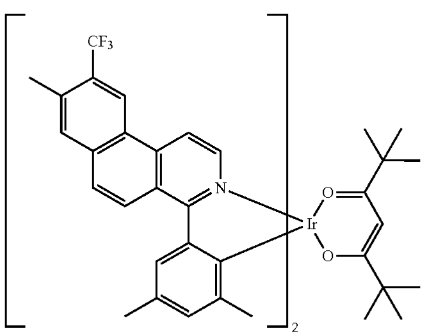
3
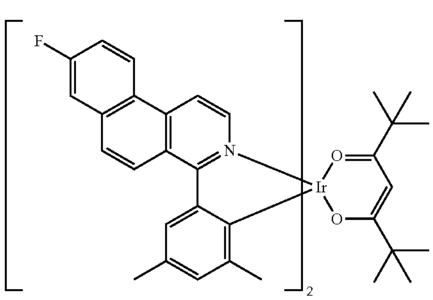
4
TABLE 7-continued
| Dopant Compound No. | FWHM (nm) | Emission color | Color coordinate (CIE) | $LT_{97}$ (at 3500 nit) (a relative value, %) |
|---|---|---|---|---|
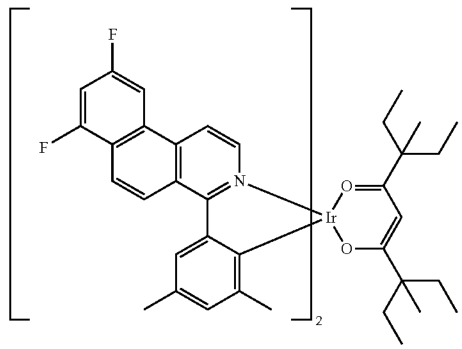
5
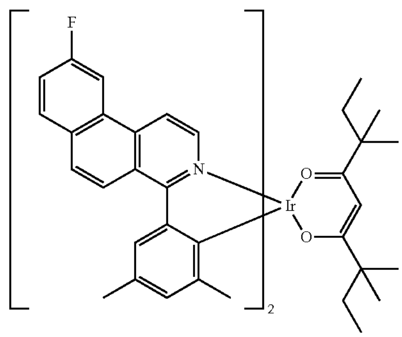
6
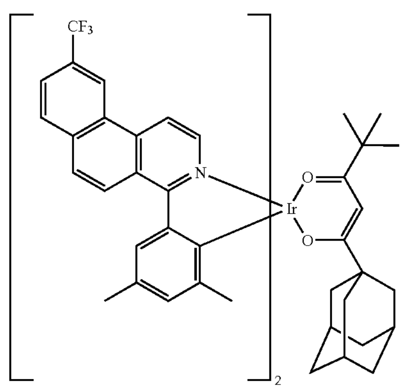
10
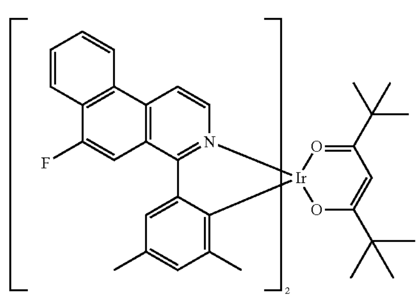
13

TABLE 7-continued

| Dopant Compound No. | FWHM (nm) | Emission color | Color coordinate (CIE) | $LT_{97}$ (at 3500 nit) (a relative value, %) |
|---|---|---|---|---|

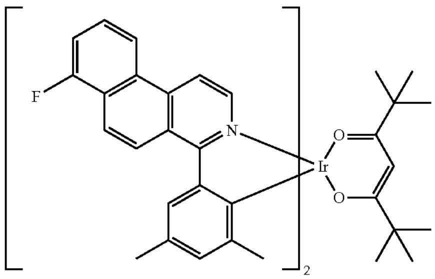

16

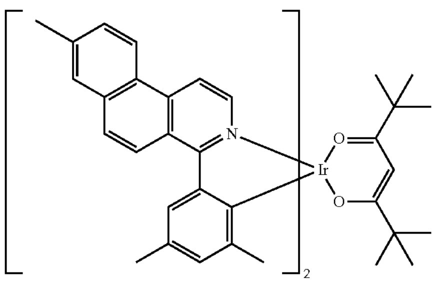

A

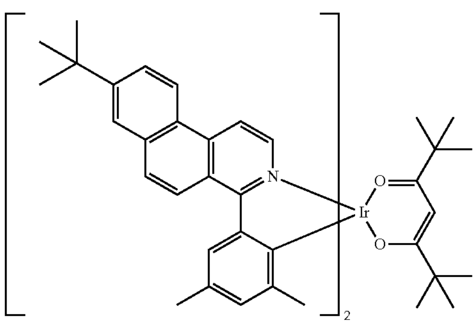

B

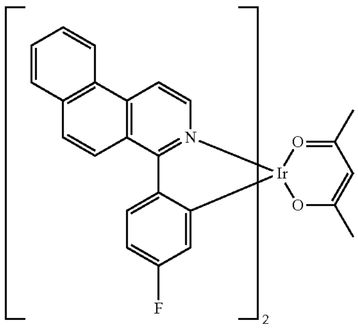

C

TABLE 7-continued

| Dopant Compound No. | FWHM (nm) | Emission color | Color coordinate (CIE) | $LT_{97}$ (at 3500 nit) (a relative value, %) |
|---|---|---|---|---|

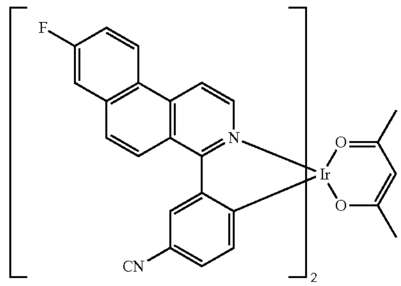

D

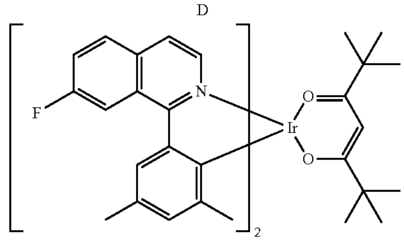

E1

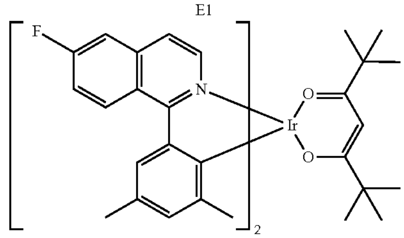

E2

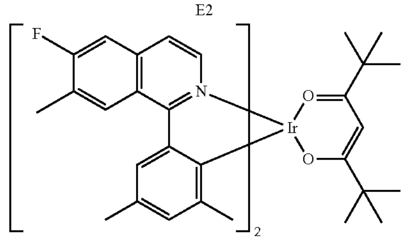

E3

Referring to Tables 6 and 7, the organic light-emitting device of Examples 1 to 9 were found to have excellent driving voltage, excellent external quantum efficiency, excellent roll-off ratio, and excellent lifespan characteristics compared with Comparative Examples A to D and E1 to E3, with emitting a red light having a relatively narrow FWHM.

As apparent from the foregoing description, the organometallic compound may have excellent electrical characteristics and stability. Thus, an electronic device, e.g., an organic light-emitting device, including the organometallic compound may have improved driving voltage, improved external quantum emission efficiency, improved roll-off ratio, improved lifespan and relatively narrow FWHM of an emission peak of an EL spectrum. Further, a diagnostic composition that includes the organometallic compound may have a high diagnostic efficiency, because the organometallic compound is excellent in phosphorescent emission characteristics.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the FIGURES, it will be understood by those of ordinary skill in the art that various changes in form and details may be made therein without departing from the spirit and scope as defined by the following claims.

What is claimed is:

1. An organometallic compound represented by Formula 1:

Formula 1

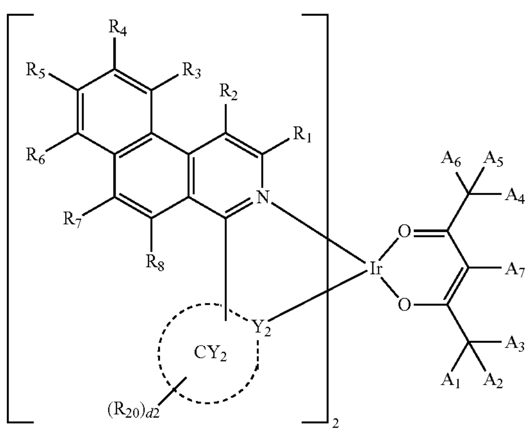

wherein, in Formula 1, $Y_2$ is C, a group represented by

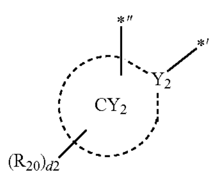

in Formula 1 is a group represented by Formula A(1):

A(1)

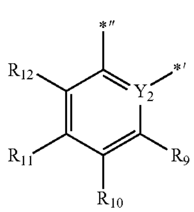

wherein, in Formula A(1), $R_9$ and $R_{11}$ are each independently a $C_1$-$C_{20}$ alkyl group, a $C_3$-$C_{10}$ cycloalkyl group, or a $C_2$-$C_{10}$ heterocycloalkyl group, each unsubstituted or substituted with deuterium, a $C_1$-$C_{20}$ alkyl group, a $C_3$-$C_{10}$ cycloalkyl group, a $C_2$-$C_{10}$ heterocycloalkyl group, or any combination thereof and $R_{10}$ and $R_{12}$ are each independently hydrogen,

*' indicates a binding site to Ir in Formula 1, and

*" indicates a binding site to a neighboring atom in Formula 1, wherein, in Formula 1 and A(1), $R_1$ to $R_8$, and $A_7$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, provided that at least one of $R_1$ to $R_8$ is —F, $A_1$ to $A_6$ are each independently a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, two or more of $R_1$ to $R_8$ are optionally linked to form a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$, two or more of $A_1$ to $A_7$ are optionally linked to form a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$, $R_{1a}$ is the same as explained in connection with $A_7$, and a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or any combination thereof;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or any combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or any combination thereof, wherein $Q_1$ to $Q_9$, $Q_{11}$ to $Q_{19}$, $Q_{21}$ to $Q_{29}$, and $Q_{31}$ to $Q_{39}$ are each independently hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group, unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_2$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group, unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

2. The organometallic compound of claim 1, wherein $R_1$ to $R_8$, and $A_7$ are each independently hydrogen, deuterium, —F, a substituted or unsubstituted $C_1$-$C_{20}$ alkyl group, a substituted or unsubstituted $C_3$-$C_{10}$ cycloalkyl group, a substituted or unsubstituted $C_2$-$C_{10}$ heterocycloalkyl group, —$Si(Q_3)(Q_4)(Q_5)$, or —$Ge(Q_3)(Q_4)(Q_5)$.

3. The organometallic compound of claim 1, wherein $R_1$ to $R_8$ and $A_7$ are each independently:

hydrogen, deuterium, or —F;

a $C_1$-$C_{20}$ alkyl group, a $C_3$-$C_{10}$ cycloalkyl group, or a $C_2$-$C_{10}$ heterocycloalkyl group, each unsubstituted or substituted with deuterium, —F, a $C_1$-$C_{20}$ alkyl group, a $C_3$-$C_{10}$ cycloalkyl group, a $C_2$-$C_{10}$ heterocycloalkyl group, or any combination thereof; or —$Si(Q_3)(Q_4)(Q_5)$ or —$Ge(Q_3)(Q_4)(Q_5)$.

4. The organometallic compound of claim 1, wherein $A_1$ to $A_6$ are each independently an unsubstituted or substituted $C_1$-$C_{60}$ alkyl group, an unsubstituted or substituted $C_3$-$C_{10}$ cycloalkyl group, or an unsubstituted or substituted $C_2$-$C_{10}$ heterocycloalkyl group.

5. The organometallic compound of claim 1, wherein $A_1$ to $A_6$ are each independently a $C_1$-$C_{20}$ alkyl group, a $C_3$-$C_{10}$ cycloalkyl group, or a $C_2$-$C_{10}$ heterocycloalkyl group, each unsubstituted or substituted with deuterium, —F, a $C_1$-$C_{20}$ alkyl group, a $C_3$-$C_{10}$ cycloalkyl group, a $C_2$-$C_{10}$ heterocycloalkyl group, or any combination thereof.

6. The organometallic compound of claim 1, wherein at least one of $R_2$ to $R_8$ is a fluoro group.

7. The organometallic compound of claim 1, wherein a group represented by

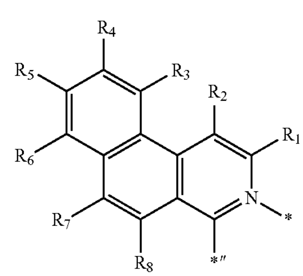

in Formula 1 is a group represented by one of Formulae CY1 to CY108:

-continued
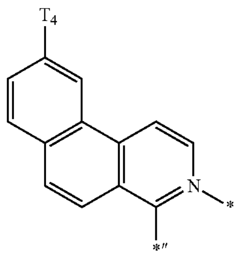
CY1
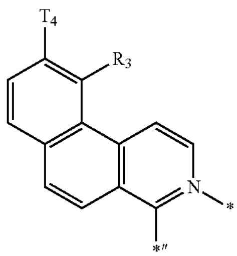
CY2
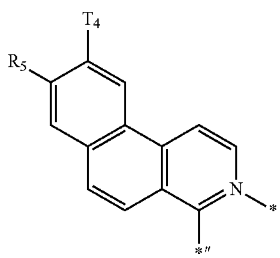
CY3
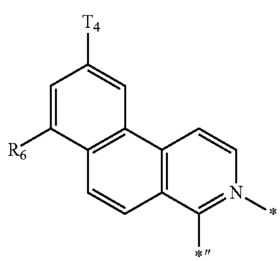
CY4
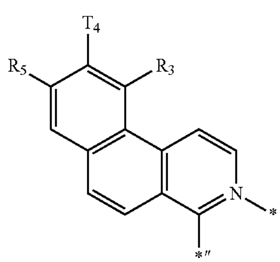
CY5
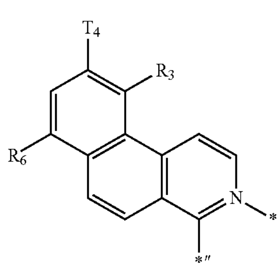
CY6
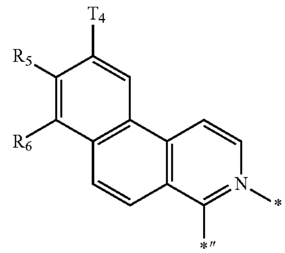
CY7
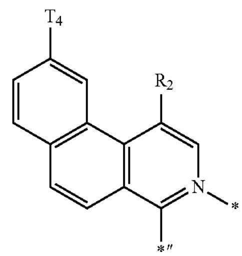
CY8
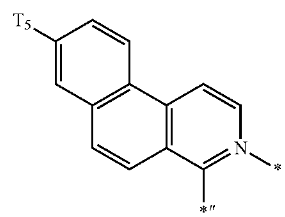
CY9
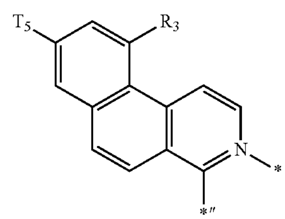
CY10
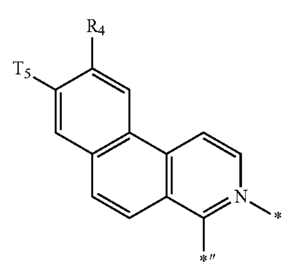
CY11
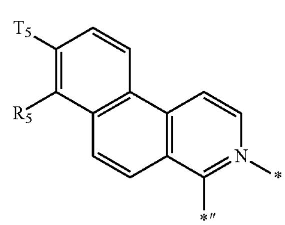
CY12

CY13
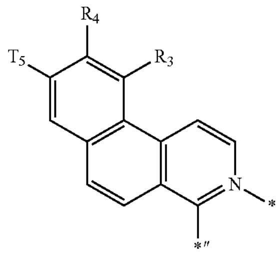
CY14
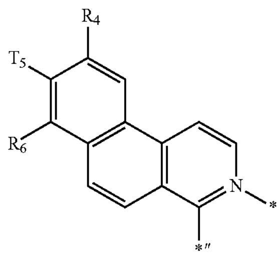
CY15
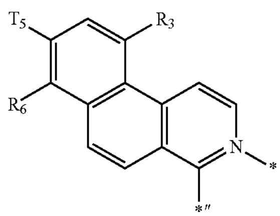
CY16
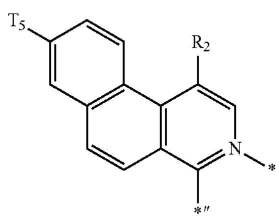
CY17
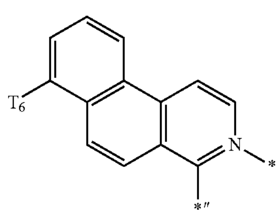
CY18
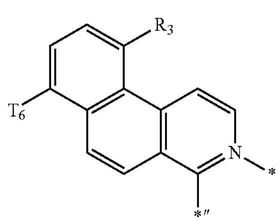
CY19
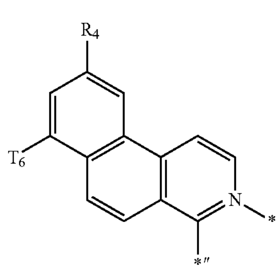
CY20
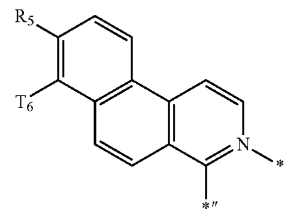
CY21
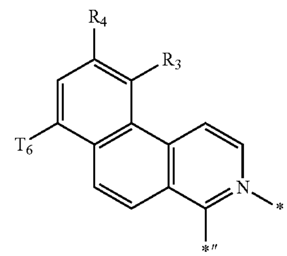
CY22
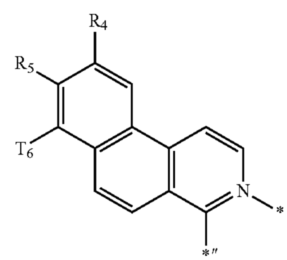
CY23
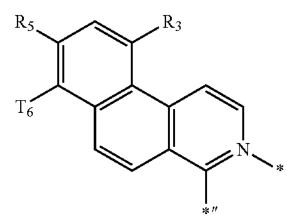
CY24
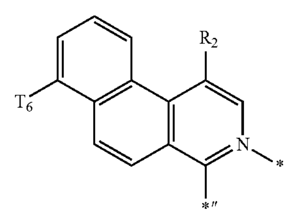
CY25
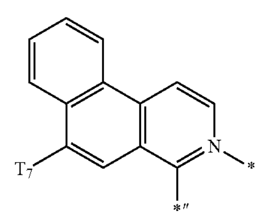
CY26
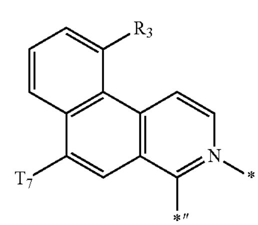

-continued
CY27
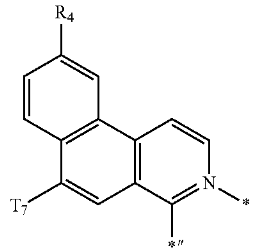
CY28
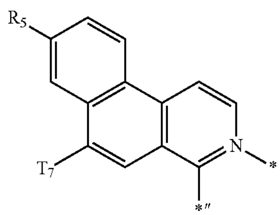
CY29
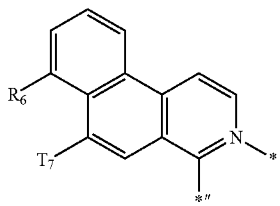
CY30
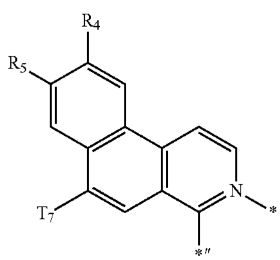
CY31
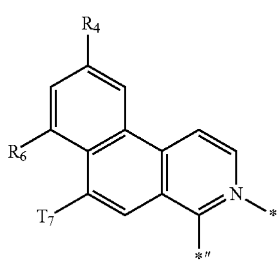
CY32
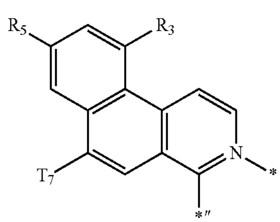
CY33
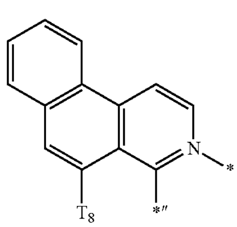
-continued
CY34
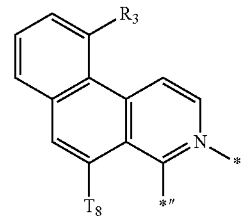
CY35
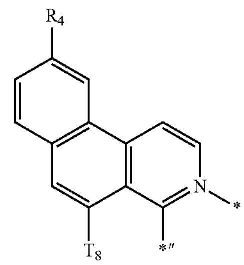
CY36
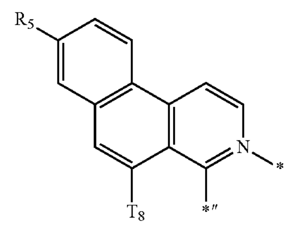
CY37
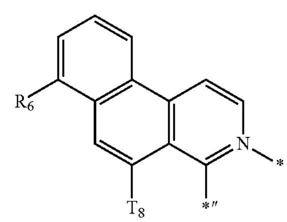
CY38
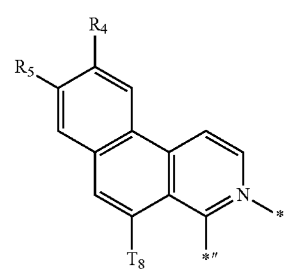
CY39
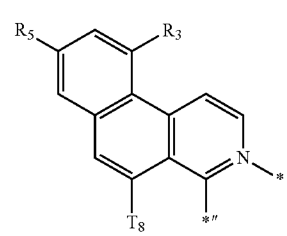

-continued
CY40
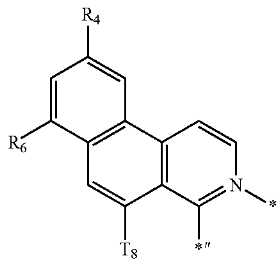
CY41
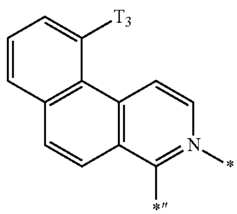
CY42
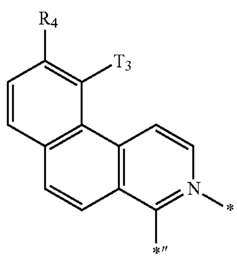
CY43
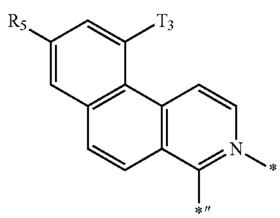
CY44
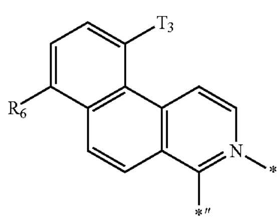
CY45
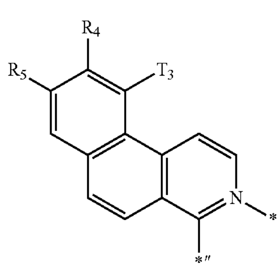
-continued
CY46
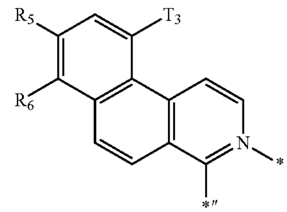
CY47
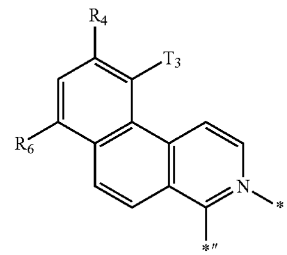
CY48
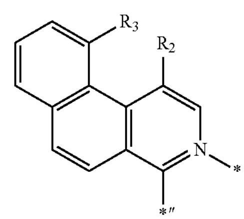
CY49
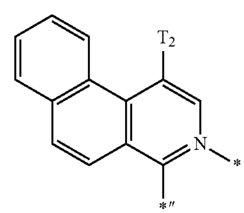
CY50
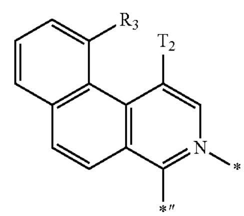
CY51
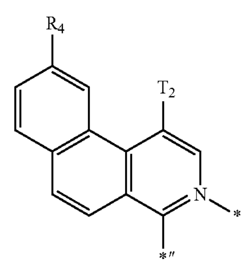
CY52
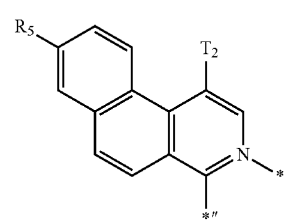

-continued
CY53
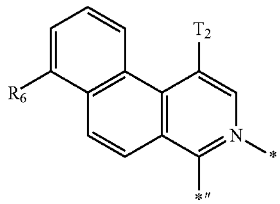
CY54
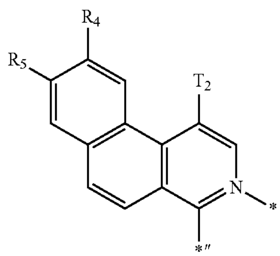
CY55
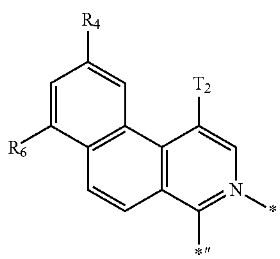
CY56
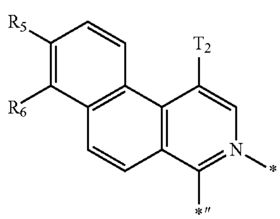
CY57
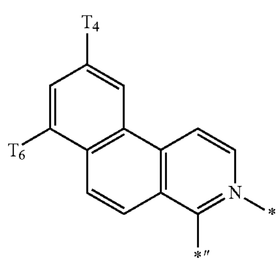
CY58
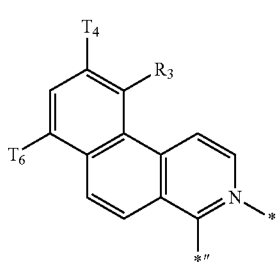
-continued
CY59
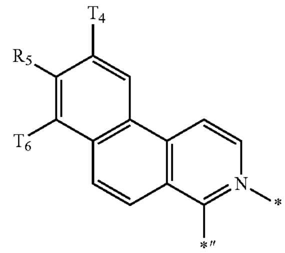
CY60
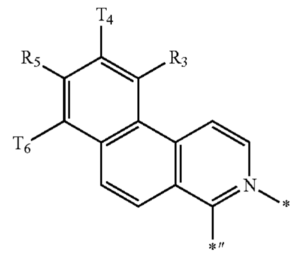
CY61
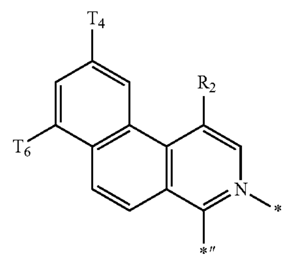
CY62
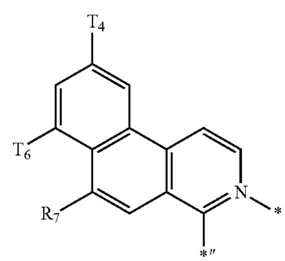
CY63
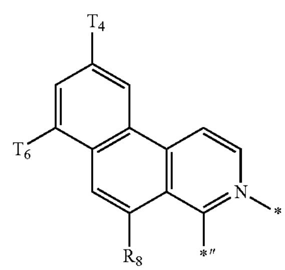
CY64
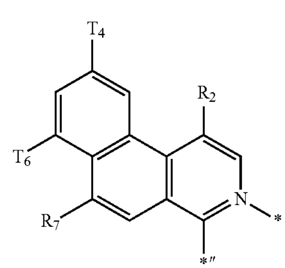

-continued
CY65
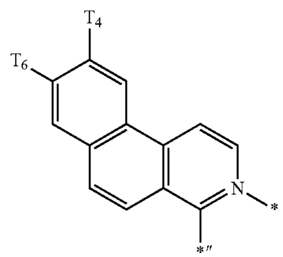
CY66
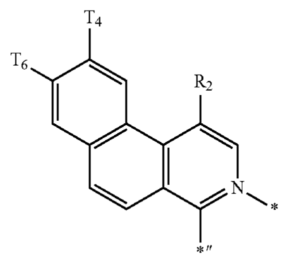
CY67
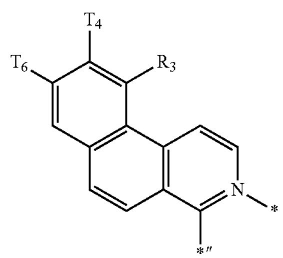
CY68
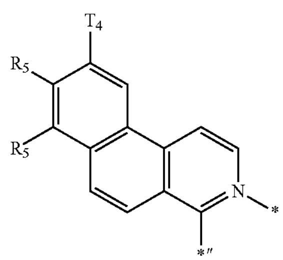
CY69
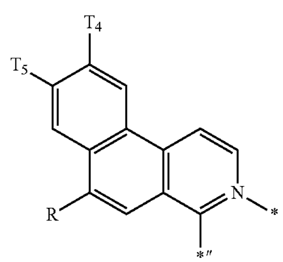
CY70
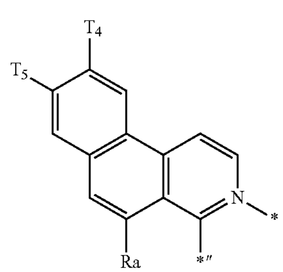
-continued
CY71
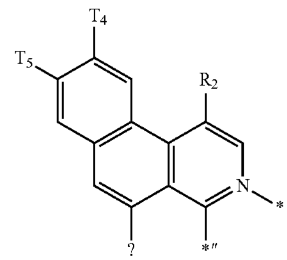
CY72
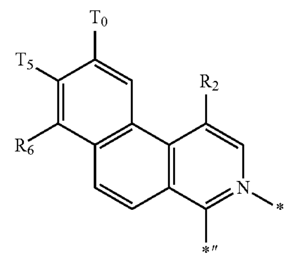
CY73
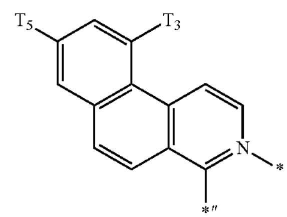
CY74
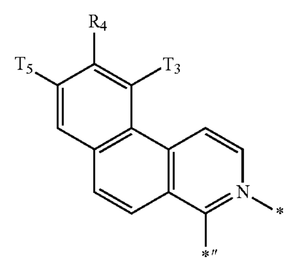
CY75
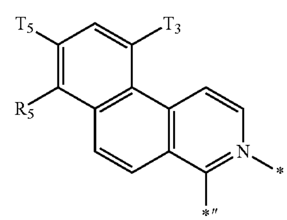
CY76
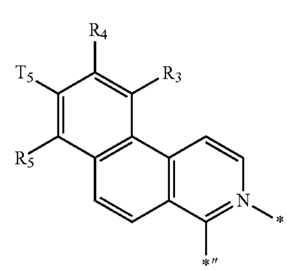

-continued
CY77
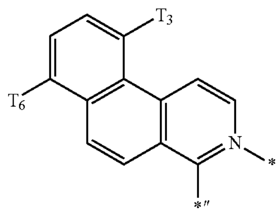
CY78
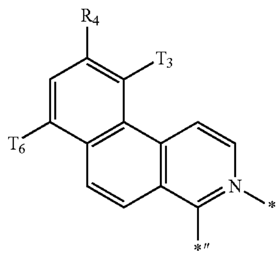
CY79
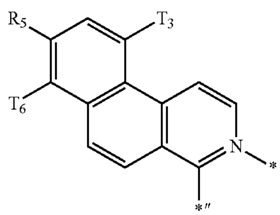
CY80
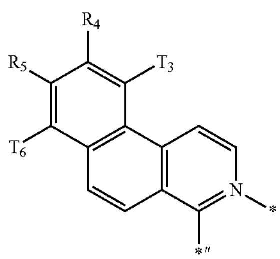
CY81
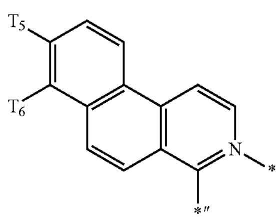
CY82
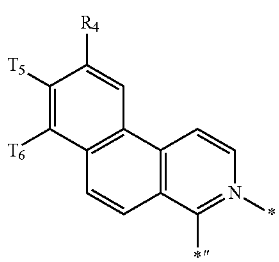
CY83
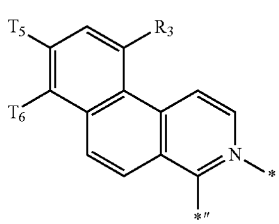
-continued
CY84
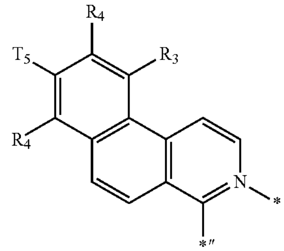
CY85
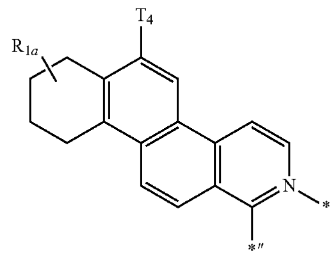
CY86
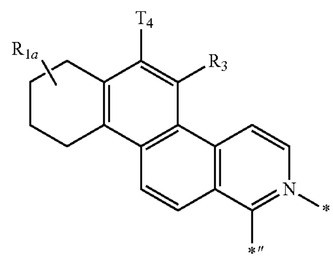
CY87
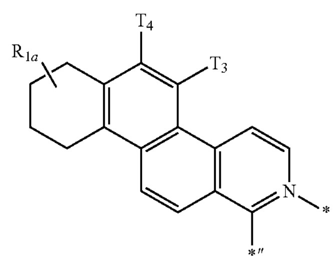
CY88
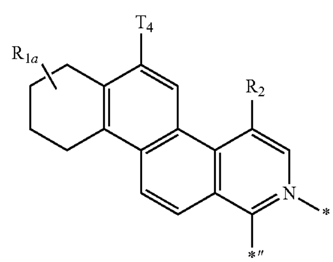
CY89
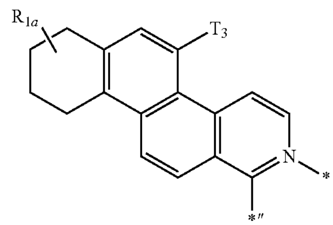

-continued
CY90
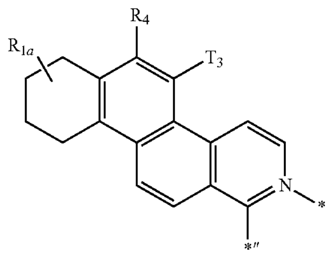
CY91
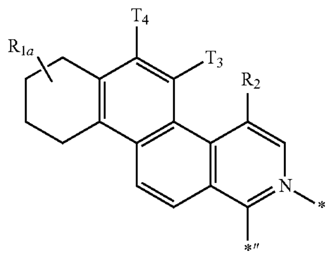
CY92
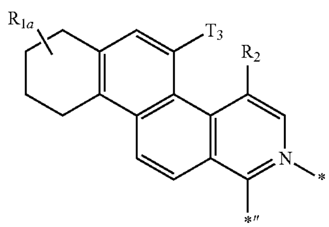
CY93
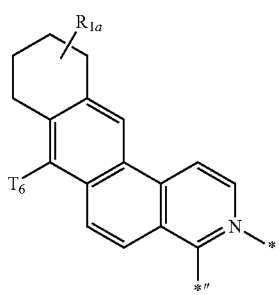
CY94
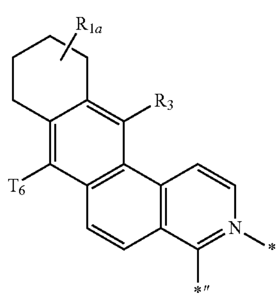
CY95
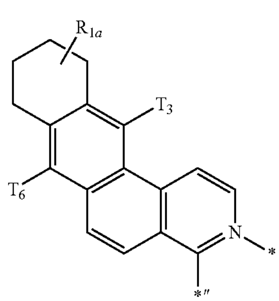
-continued
CY96
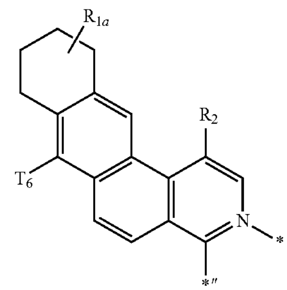
CY97
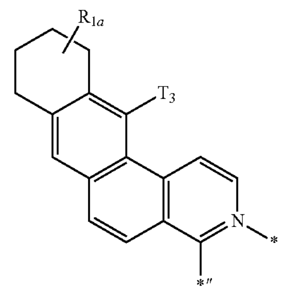
CY98
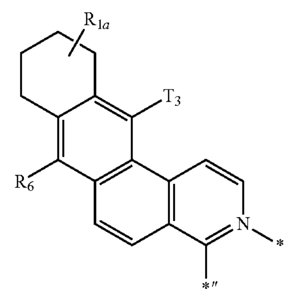
CY99
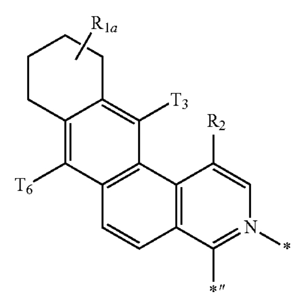
CY100
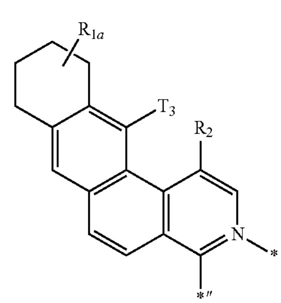

-continued

CY101

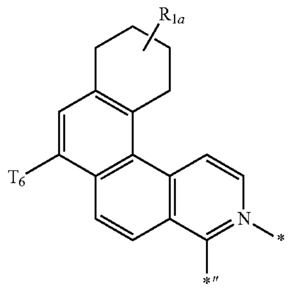

CY102

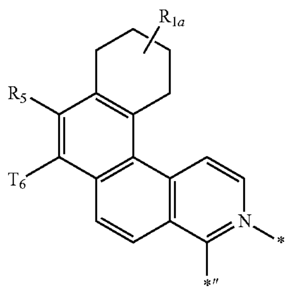

CY103

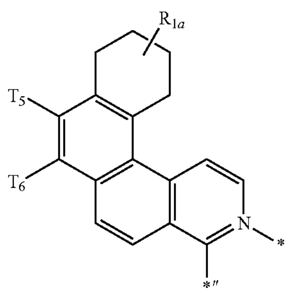

CY104

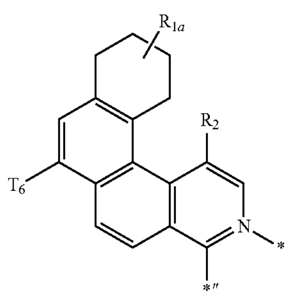

CY105

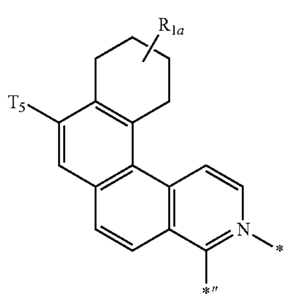

-continued

CY106

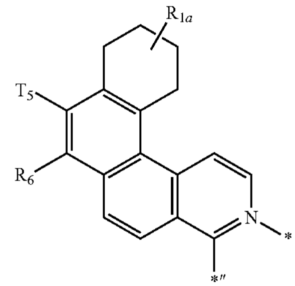

CY107

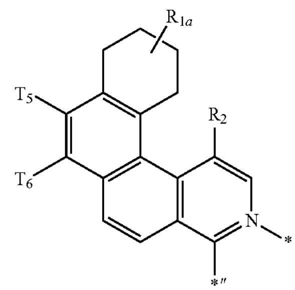

CY108

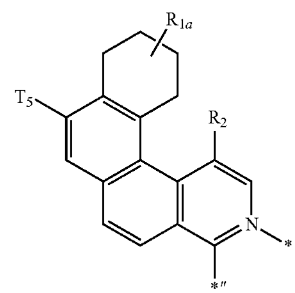

wherein, in Formulae CY1 to CY108, $T_2$ to $T_8$ are each independently a fluoro group (—F);

each of $R_2$ to $R_8$ and $R_{1a}$ are the same as described in claim 1, and $R_2$ to $R_8$ are not hydrogen,

* indicates a binding site to Ir in Formula 1, and

*" indicates a binding site to a neighboring atom in Formula 1.

8. The organometallic compound of claim 7, wherein $R_2$ to $R_8$ in Formulae CY1 to CY108 are each independently:

deuterium; or a $C_1$-$C_{20}$ alkyl group, a $C_3$-$C_{10}$ cycloalkyl group, or a $C_2$-$C_{10}$ heterocycloalkyl group, each unsubstituted or substituted with deuterium, a $C_1$-$C_{20}$ alkyl group, a $C_3$-$C_{10}$ cycloalkyl group, a $C_2$-$C_{10}$ heterocycloalkyl group, or any combination thereof.

9. The organometallic compound of claim 1, wherein at least one of $A_1$ to $A_6$ are each independently a substituted or unsubstituted $C_2$-$C_{60}$ alkyl group, a substituted or unsubstituted $C_3$-$C_{10}$ cycloalkyl group, or a substituted or unsubstituted $C_2$-$C_{10}$ heterocycloalkyl group.

10. The organometallic compound of claim 1, wherein a number of carbons included in a group represented by *—$C(A_1)(A_2)(A_3)$ in Formula 1 is 5 or more, and a number of carbons included in a group represented by*—$C(A_4)(A_5)(A_6)$ in Formula 1 is 5 or more.

11. The organometallic compound of claim 1, wherein $A_1$ to $A_3$ of the group represented by *—$C(A_1)(A_2)(A_3)$ in Formula 1 are linked to each other to form a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$.

12. An organic light-emitting device comprising:

a first electrode;

a second electrode; and an organic layer disposed between the first electrode and the second electrode and comprising an emission layer, wherein the organic layer comprises at least one organometallic compound of claim 1.

13. The organic light-emitting device of claim 12, wherein the first electrode is an anode, the second electrode is a cathode, the organic layer further comprises a hole transport region between the first electrode and the emission layer and an electron transport region between the emission layer and the second electrode, the hole transport region comprises a hole injection layer, a hole transport layer, an electron blocking layer, a buffer layer, or any combination thereof, and the electron transport region comprises a hole blocking layer, an electron transport layer, an electron injection layer, or any combination thereof.

14. The organic light-emitting device of claim 12, wherein the organometallic compound is included in the emission layer.

15. A diagnostic composition comprising at least one of the organometallic compound of claim 1.

16. An organometallic compound selected from Compounds 4 to 8 and 13 to 16 below:

4

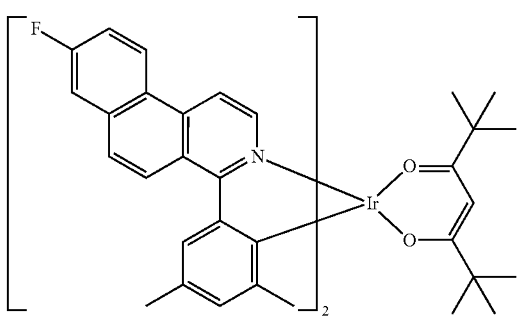

5

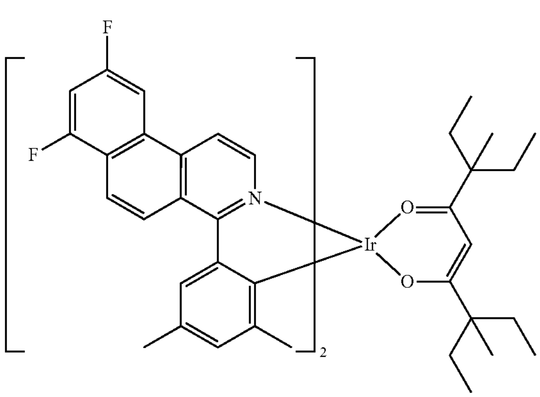

-continued

6

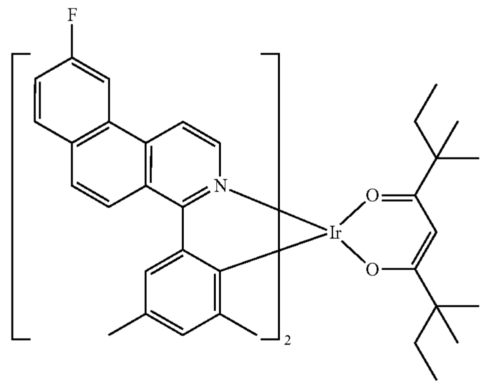

7

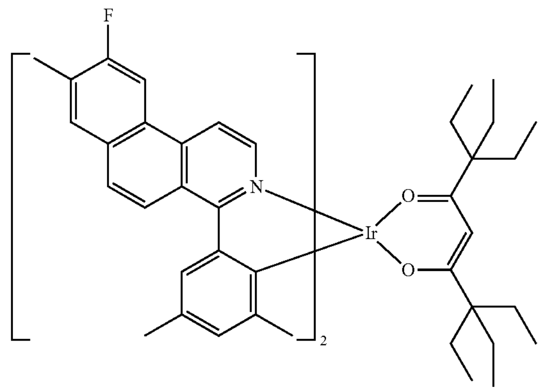

8

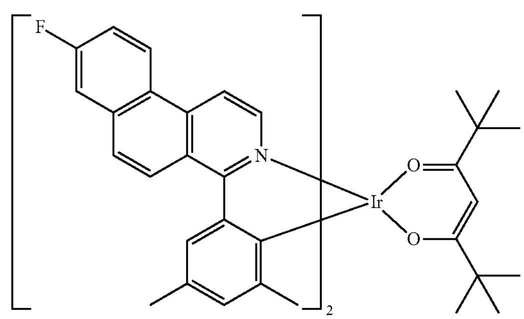

13

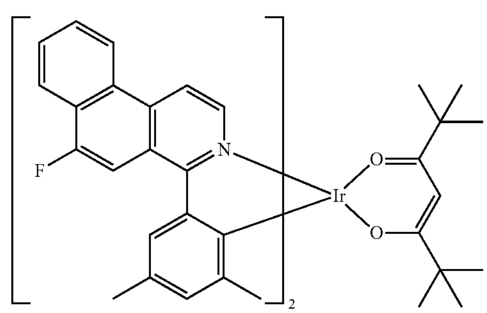

-continued
14
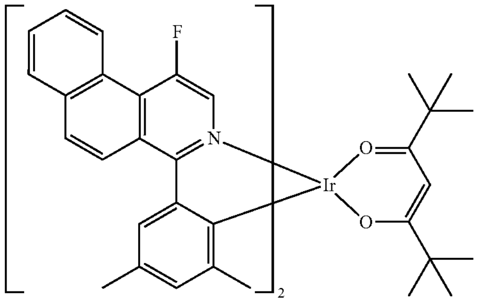
15
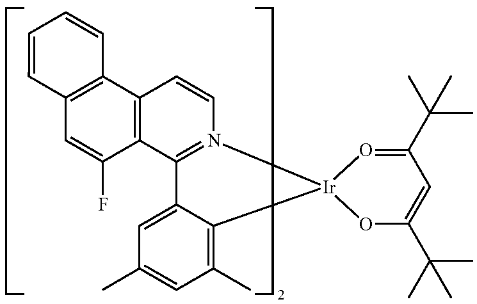
-continued
16
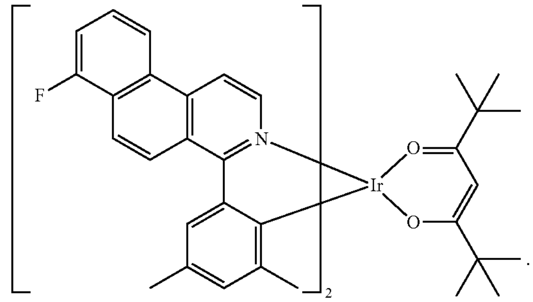
* * * * *